United States Patent
Mizutani et al.

(10) Patent No.: US 7,195,856 B2
(45) Date of Patent: Mar. 27, 2007

(54) POSITIVE RESIST COMPOSITION AND PATTERN FORMATION METHOD USING THE SAME

(75) Inventors: Kazuyoshi Mizutani, Shizuoka (JP); Tomoya Sasaki, Shizuoka (JP); Shinichi Kanna, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 71 days.

(21) Appl. No.: 10/929,443

(22) Filed: Aug. 31, 2004

(65) Prior Publication Data

US 2005/0048402 A1 Mar. 3, 2005

(30) Foreign Application Priority Data

| Sep. 1, 2003 | (JP) | ............ P.2003-308699 |
| Sep. 10, 2003 | (JP) | ............ P.2003-318310 |
| Feb. 24, 2004 | (JP) | ............ P.2004-047404 |

(51) Int. Cl.
*G03F 7/00* (2006.01)
*G03F 7/004* (2006.01)

(52) U.S. Cl. .............. 430/270.1; 430/281.1; 430/286.1; 430/913; 430/311

(58) Field of Classification Search ............ 430/270.1, 430/281.1, 286.1, 913, 311
See application file for complete search history.

(56) References Cited

U.S. PATENT DOCUMENTS 6,939,662 B2 * 9/2005 Mizutani et al. ......... 430/270.1

FOREIGN PATENT DOCUMENTS

| EP | 1 103 856 A1 | 5/2001 |
| EP | 1273969 A2 * | 1/2003 |
| EP | 1341038 A2 * | 9/2003 |
| JP | 2002220420 * | 8/2002 |
| WO | WO 01/37037 A1 | 5/2001 |

OTHER PUBLICATIONS

CA DN 137:161387 for JP2002220420,Aug. 2002.*

* cited by examiner

*Primary Examiner*—Amanda Walke
(74) *Attorney, Agent, or Firm*—Sughrue Mion, PLLC

(57) ABSTRACT

A positive resist composition comprising (A) a resin that is decomposed by the action of an acid to increase solubility in an alkali developing solution and includes a specific repeating unit and (B) a compound that generates an acid upon irradiation of an actinic ray or radiation, and a pattern formation method using the positive resist composition.

19 Claims, No Drawings

POSITIVE RESIST COMPOSITION AND PATTERN FORMATION METHOD USING THE SAME

FIELD OF THE INVENTION

The present invention relates to a positive resist composition suitably used in microlithography processes, for example, in the production of VLSI or high capacity microchips, or in other photofabrication processes and a pattern formation method using the positive resist composition. More specifically, the invention relates to a positive resist composition capable of forming a highly precise pattern using an excimer laser beam of not longer than 200 nm as a light source for exposure and a pattern formation method using the positive resist composition.

BACKGROUND OF THE INVENTION

The degree of integration of integrated circuits has recently become much higher, and the processing of ultra-fine patterns having a line width of a quarter micron or below is required in the production of semiconductor substrate, for example, VSLI. In order to form fine patterns, means of reducing a wavelength of exposure light source for use in the production of resist patterns is known.

For instance, in the production of semiconductor device having the degree of integration up to 64 Mbits, an i-line (365 nm) of high pressure mercury lamp has been employed as the light source. As a positive resist corresponding to the light source, a large number of compositions containing a novolak resin and a naphthoquinone diazide compound as a photosensitive substance have been developed. These compositions have achieved full success in the processing of linewidth up to about 0.3 μm. Also, in the production of semiconductor device having the degree of integration of 256 Mbits or more, a KrF excimer laser beam (248 nm) is employed as the light source in place of the i-line.

In recent years, for the purpose of the production of semiconductor device having the degree of integration of 1 Gbit or more, as a light source having shorter wavelength, the use of an ArF excimer laser beam (193 nm) and further, the use of an $F_2$ excimer laser beam (157 nm) in order to form a pattern of not more than 0.1 μm have been investigated.

In response to such a trend of using light source having a shorter wavelength, constituent components of the resist materials and structure of compounds used for the constituent components have been greatly changed.

As the resist composition for exposure using a KrF excimer laser beam, a composition in which a resin including a basic skeleton of poly (hydroxystyrene) that has a small absorption in the region of around 248 nm and being protected by an acid-decomposable group is used as the main component and a compound that generates an acid upon irradiation of a far ultraviolet ray (a photo-acid generator) is used in combination, that is, a so-called chemical amplification resist has been developed.

As the resist composition for exposure using a ArF excimer laser beam (193 nm), a chemical amplification resist using an acid-decomposable resin having an alicyclic structure, which do not have an absorption at 193 nm, introduced into the main chain or side chain has been developed.

For instance, alicyclic resins for use in the above-described resist composition are described in Patent Document 1 (JP-A-2003-43690 (the term "JP-A" as used herein means an "unexamined published Japanese patent application")).

However, it has been required for resist compositions containing a conventional alicyclic resin for an ArF excimer laser beam to improve roundness of contact hole pattern, profile and the like.

It has been found in case of using an $F_2$ excimer laser beam (157 nm), however, that since the above-described alicyclic group-containing resin still has a large absorption in the region of around 157 nm, it is insufficient for obtaining the desired pattern of not more than 0.1 μm. In the circumstances, it has been reported that a resin having a fluorine atom introduced therein has sufficient transparency at 157 nm in Non-Patent Document 1 (*Proc. SPIE*. Vol. 3678, page 13 (1999). Useful structures of the fluorine resin are proposed, for example, in Non-Patent Document 2 (*Proc. SPIE*. Vol. 3999, page 330 (2000), Non-Patent Document 3 (*Proc. SPIE*. Vol. 3999, page 357 (2000), Non-Patent Document 4 (*Proc. SPIE. Vol.* 3999, page 365 (2000), Patent Document 1 (WO 02/33489) and Patent Document 2 (WO 00/17712), Patent Document 3 (JP-A-2002-155112), Patent Document 4 (U.S. Patent 2002/102490A1), Patent Document 5 (U.S. Pat. No. 2002/146638A2), Patent Document 6 (JP-A-2002-234916), Patent Document 7 (JP-A-2002-6501) and Patent Document 8 (JP-A-2002-15298), and resist compositions including the fluorine resin are investigated. However, resist compositions including conventional fluorine resin for an $F_2$ excimer laser beam are desired to improve resolution, sensitivity, development residue (scum), dissolution contrast, surface roughness, development defect, profile and the like.

Patent Document 1: JP-A-2003-43690

Non-Patent Document 1: *Proc. SPIE*. Vol. 3678, page 13 (1999)

Non-Patent Document 2: *Proc. SPIE*. Vol. 3999, page 330 (2000)

Non-Patent Document 3: *Proc. SPIE*. Vol. 3999, page 357 (2000)

Non-Patent Document 4: *Proc. SPIE*. Vol. 3999, page 365 (2000)

Patent Document 2: WO 00/17712

Patent Document 3: JP-A-2002-155112

Patent Document 4: U.S. Patent 2002/102490A1

Patent Document 5: U.S. Patent 2002/146638A2

Patent Document 6: JP-A-2002-234916

Patent Document 7: JP-A-2002-6501

Patent Document 8: JP-A-2002-15298

SUMMARY OF THE INVENTION

Therefore, an object of the present invention is to provide a positive resist composition suitable for using an exposure light source of an ArF excimer laser beam or an $F_2$ excimer laser beam and a pattern formation method using the positive resist composition.

Another object of the invention is to provide a positive resist composition, which has sufficient transmission at the time using a light source of an ArF excimer laser beam or an $F_2$ excimer laser beam and is improved in resolution, sensitivity, development residue (scum), dissolution contrast, surface roughness, development defect, profile and roundness of contact hole pattern and a pattern formation method using the positive resist composition.

Other objects of the invention will become apparent from the following description.

As a result of the intensive investigations on the above-described performances of positive resist composition, it has been found that the objects of the invention are accomplished by the positive resist composition described below to complete the invention.

Specifically, the present invention has the following constitution.

(1) A positive resist composition comprising (A1) a resin that is decomposed by the action of an acid to increase solubility in an alkali developing solution and includes at least one repeating unit represented by formula (I) shown below and (B) a compound that generates an acid upon irradiation of an actinic ray or radiation:

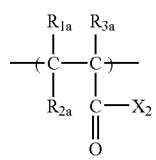
(I)

In formula (I), $R_{1a}$ to $R_{3a}$ each independently represents a hydrogen atom, a halogen atom, a cyano group or an alkyl group, provided that at least one of $R_{1a}$ to $R_{3a}$ represents an alkyl group having at least one group represented by formula (A) shown below, $X_2$ represents —ORa, —SRa or —N(Rb)(Ra), Ra represents a hydrogen atom or a monovalent organic group, Rb represents a hydrogen atom or an alkyl group,

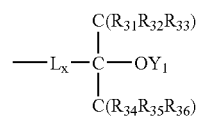
(A)

In formula (A), $R_{31}$ to $R_{36}$ each independently represents a hydrogen atom, a fluorine atom or an alkyl group, provided that at least one of $R_{31}$ to $R_{36}$ represents a fluorine atom or an alkyl group in which at least one of the hydrogen atoms is substituted with a fluorine atom, $Y_1$ represents a hydrogen atom or a monovalent organic group, and $L_x$ represents a single bond or a divalent connecting group.

(2) The positive resist composition as described in (1), wherein the monovalent organic group represented by Ra in formula (I) is a group selected from —C($R_{11a}$)($R_{12a}$)($R_{13a}$) and —C($R_{14a}$)($R_{15a}$)(O$R_{16a}$), wherein $R_{11a}$ to $R_{13a}$ each individually represents an alkyl group, a cycloalkyl group, an alkenyl group, an aralkyl group or an aryl group, $R_{14a}$ and $R_{15a}$ each individually represents a hydrogen atom or an alkyl group, $R_{16a}$ represents an alkyl group, a cycloalkyl group, an alkenyl group, an aralkyl group or an aryl group, or two of $R_{11a}$, $R_{12a}$ and $R_{13a}$ or two of $R_{14a}$, $R_{15a}$ and $R_{16a}$ may be connected with each other to form a ring.

(3) A positive resist composition comprising (A2) a resin that is decomposed by the action of an acid to increase solubility in an alkali developing solution and includes at least one repeating unit represented by formula (X) shown below and (B) a compound that generates an acid upon irradiation of an actinic ray or radiation:

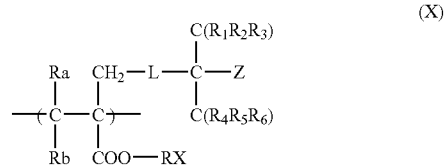
(X)

In formula (X), $R_a$ to $R_b$ each independently represents a hydrogen atom, a fluorine atom, a methyl group or a trifluoromethyl group, L represents a single bond or a divalent connecting group, $R_1$ to $R_6$ each independently represents a fluorine atom or a hydrogen atom, provided that at least one of $R_1$ to $R_6$ represents a fluorine atom, RX represents a hydrogen atom or a monovalent organic group, and Z represents a hydrogen atom, an alkyl group, a cycloalkyl group, a hydroxy group or a hydroxy group protected with a protective group capable of being decomposed by the action of an acid.

(4) The positive resist composition as described in (3), wherein the resin of component (A2) further includes a repeating unit containing a cyclic hydrocarbon structure having a group selected from a hydroxy group, a hydroxyalkyl group and a group represented by the following formula (Y):

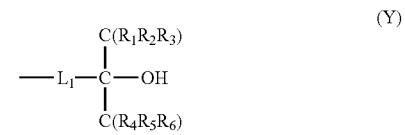
(Y)

In formula (Y), $L_1$ represents a single bond or a methylene group, $R_1$ to $R_6$ each independently represents a fluorine atom or a hydrogen atom, provided that at least one of $R_1$ to $R_6$ represents a fluorine atom, or at least one of $R_1$ to $R_6$ may form a carbon chain connected to a main chain of polymer to from a ring, or $R_4$ may be connected to the carbon atom substituted with the hydroxy group to from a ring.

(5) The positive resist composition as described in (3), wherein the resin of component (A2) further includes at least one repeating unit selected from repeating units represented by the following formulae (AI) to (AVIII):

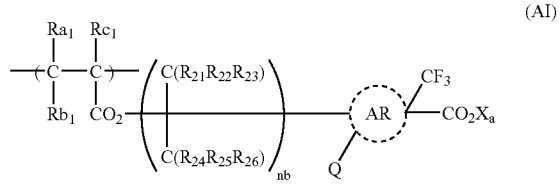
(AI)

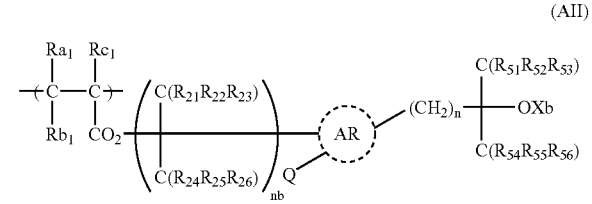
(AII)

-continued

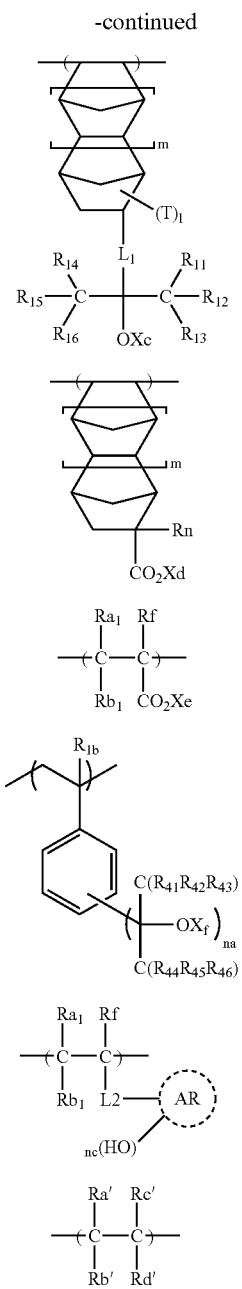

(AIII)

(AIV)

(AV)

(AVI)

(AVII)

(AVIII)

In formulae (AI) to (AIII), $R_{a1}$, $R_{b1}$, and $R_{c1}$ each independently represents a hydrogen atom, a fluorine atom, a methyl group or a fluoroalkyl group, $R_{21}$ to $R_{26}$ each independently represents a hydrogen atom, a fluorine atom or a fluoroalkyl group, provided that at least one of $R_{21}$ to $R_{26}$ is not a hydrogen atom, AR represents an alicyclic hydrocarbon structure, Q represents a hydrogen atom or a hydroxy group, Xa represents a hydrogen atom or a group capable of being decomposed by the action of an acid, $R_{51}$ to $R_{56}$ each independently represents a hydrogen atom, a fluorine atom or a fluoroalkyl group, provided that at least one of $R_{51}$ to $R_{56}$ is not a hydrogen atom, Xb represents a hydrogen atom or a group capable of being decomposed by the action of an acid, T represents a hydrogen atom, a fluorine atom or a trifluoromethyl group, which may be the same of different, when two or more T's are present, $L_1$ represents a single bond or a divalent connecting group, $R_{11}$ to $R_{16}$ each independently represents a hydrogen atom, a fluorine atom or a fluoroalkyl group, provided that at least one of $R_{11}$ to $R_{16}$ is not a hydrogen atom, Xc represents a hydrogen atom or a group capable of being decomposed by the action of an acid, Rn represents a fluorine atom or a trifluoromethyl group, Xd represents a hydrogen atom or a group capable of being decomposed by the action of an acid, Rf represents a hydrogen atom, a fluorine atom, a methyl group or a trifluoromethyl group, Xe represents a hydrogen atom or a group capable of being decomposed by the action of an acid, $R_{1b}$ represents a hydrogen atom, a fluorine atom, a chlorine atom, a bromine atom, a cyano group or a trifluoromethyl group, $R_{41}$ to $R_{46}$ each independently represents a hydrogen atom, a fluorine atom or a fluoroalkyl group, provided that at least one of $R_{41}$ to $R_{46}$ is not a hydrogen atom, Xf represents a hydrogen atom or a group capable of being decomposed by the action of an acid, L2 represents —C(=O)—O— or —O—, $R_a'$, $R_b'$, $R_c'$ and $R_d'$ each independently represents a hydrogen atom, a fluorine atom, a fluoroalkyl group or a group represented by formula (Y), provided that at least one of $R_a'$ to $R_d'$ is not a hydrogen atom, nb represents 0 or 1, n represents 0 or 1, m represents 0 or 1, 1 represents in integer of from 0 or 5, na represents in integer of from 1 or 5, and nc represents an integer of from 1 or 5.

(6) A pattern formation method comprising forming a resist film using the positive resist composition as described in any one of (1) to (5), exposing the resist film, and developing the exposed resist film.

The present invention also includes the following preferred embodiments.

(7) The positive resist composition as described in (1) or (2), wherein the monovalent organic group represented by Ra in formula (I) contains the group represented by formula (A).

(8) The positive resist composition as described in any one of (1), (2) and (7), wherein the monovalent organic group represented by Ra in formula (I) contains an alicyclic structure.

(9) The positive resist composition as described in any one of (1), (2), (7) and (8), wherein the —$R_{3a}$ in formula (I) is a group represented by the following formula (R3a):

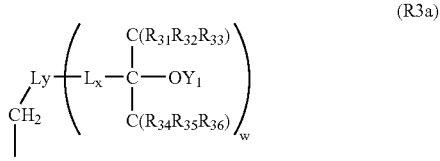

(R3a)

In formula (R3a), $R_{31}$ to $R_{36}$, $Y_1$ and $L_x$ have the same meanings as those defined for $R_{31}$ to $R_{36}$, $Y_1$ and $L_x$ in formula (A), respectively, $L_y$ represents a single bond or a connecting group having a valence of (w+1), and w represents an integer of from 1 to 4.

(10) The positive resist composition as described in (1), wherein the repeating unit represented by formula (I) is a repeating unit represented by the following formula (Ia) or (Ib):

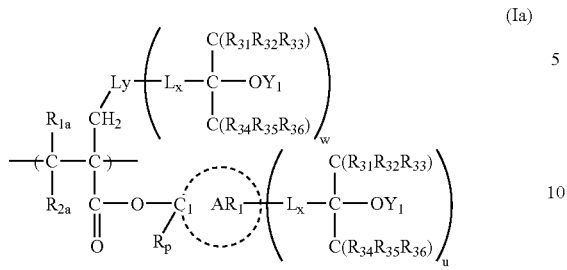
(Ia)

In formula (Ia), $R_{1a}$ and $R_{2a}$ have the same meanings as those defined for $R_{1a}$ and $R_{2a}$ in formula (I), respectively, $R_{31}$ to $R_{36}$, $Y_1$, $L_x$, $L_y$ and w have the same meanings as defined for $R_{31}$ to $R_{36}$, $Y_1$, $L_x$, $L_y$ and w in formula (R3a), respectively, $R_p$ represents a hydrogen atom or an alkyl group, $AR_1$ represents an atomic group for forming an alicyclic structure together with $C_1$, and u represents an integer of from 0 to 4.

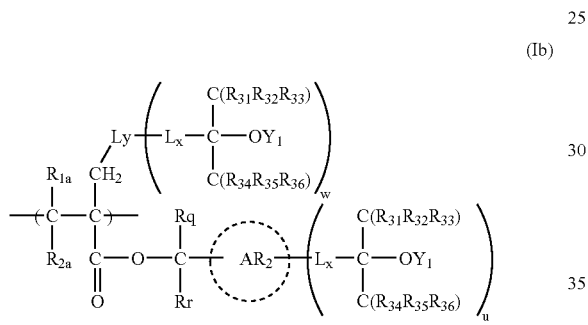
(Ib)

In formula (Ib), $R_{1a}$, $R_{2a}$, $R_{31}$ to $R_{36}$, $Y_1$, $L_x$, $L_y$, w and u have the same meanings as defined for $R_{1a}$, $R_{2a}$, $R_{31}$ to $R_{36}$, $Y_1$, $L_x$, $L_y$, w and u in formula (Ia), Rq and Rr each independently represents an alkyl group, and $AR_2$ represents an atomic group for forming an alicyclic structure.

(11) The positive resist composition as described in any one of (1), (2), (7) to (10), wherein the resin of component (A1) further includes at least one repeating unit selected from repeating units represented by the following formulae (II) to (XII):

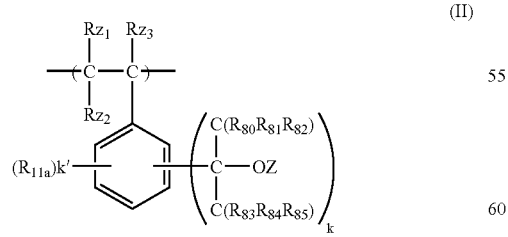
(II)

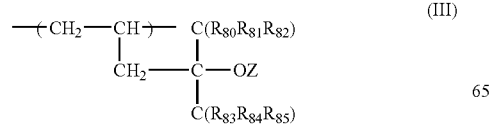
(III)

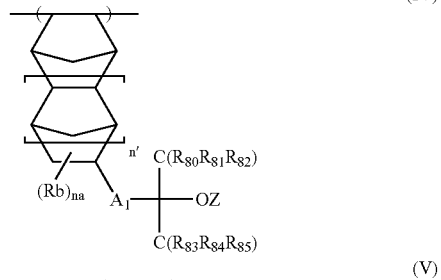
(IV)

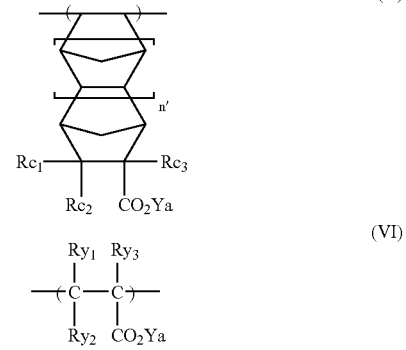
(V)

(VI)

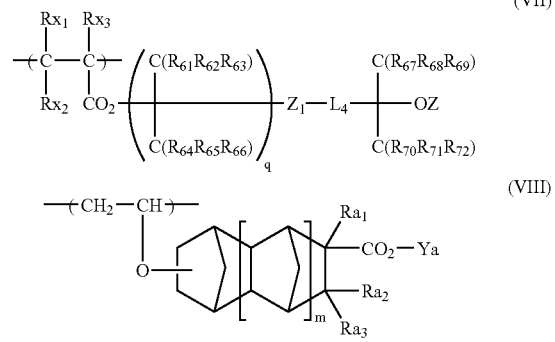
(VII)

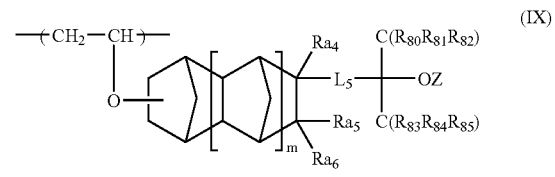
(VIII)

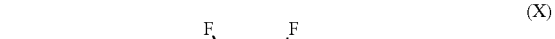
(IX)

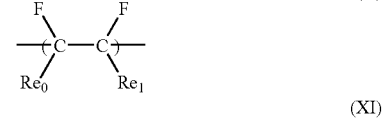
(X)

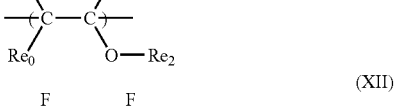
(XI)

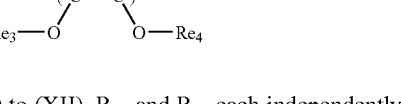
(XII)

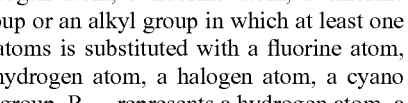

In formulae (II) to (XII), $R_{z1}$ and $R_{z2}$ each independently represents a hydrogen atom, a fluorine atom, a chlorine atom, a cyano group or an alkyl group in which at least one of the hydrogen atoms is substituted with a fluorine atom, $R_{z3}$ represents a hydrogen atom, a halogen atom, a cyano group or an alkyl group, $R_{11a}$ represents a hydrogen atom, a hydroxy group, a halogen atom, a cyano group, an alkoxy group, an acyl group, an alkyl group, a cycloalkyl group, an alkenyl group, an aralkyl group or an aryl group, $R_{80}$ and $R_{85}$ each independently represents a hydrogen atom, a fluorine atom or an alkyl group, provided that at least one of $R_{80}$ and $R_{85}$ represents a fluorine atom or an alkyl group in which at least one of the hydrogen atoms is substituted with a fluorine atom, Z represents a hydrogen atom or a monovalent organic group, k represents an integer of from 1 to 5, k' represents an integer of from 0 to 4, Rb represents a hydrogen atom, a halogen atom, a cyano group or an alkyl group, which may be the same or different, when two or more Rb's are present, $A_1$ represents a single bond or a divalent connecting group, n' represents 0 or 1, na represents an integer of from 0 to 7, $R_{c1}$ and $R_{c3}$ each independently represents a hydrogen atom, a halogen atom, a cyano group or an alkyl group, Ya represents a hydrogen atom or a monovalent organic group, $R_{y1}$ and $R_{y3}$ each independently represents a hydrogen atom, a fluorine atom, a chlorine atom, a cyano group or an alkyl group in which at least one of the hydrogen atoms is substituted with a fluorine atom, $R_{x1}$ and $R_{x3}$ each independently represents a hydrogen atom, a fluorine atom, a chlorine atom, a cyano group or an alkyl group in which at least one of the hydrogen atoms is substituted with a fluorine atom, $R_{61}$ to $R_{72}$ each independently represents a hydrogen atom, a fluorine atom or an alkyl group, provided that at least one of $R_{61}$ to $R_{66}$ represents a fluorine atom and at least one of $R_{67}$ to $R_{72}$ represents a fluorine atom, $Z_1$ represents a phenylene group, a cyclohexylene group, an adamantane residue or a norbornane residue, $L_4$ represents a single bond or a divalent connecting group, q represents 0 or 1, $R_{a1}$ and $R_{a3}$ each independently represents a hydrogen atom, a halogen atom, a hydroxy group, a cyano group, an alkyl group, an aryl group, an alkoxy group or an aralkyl group, m represents 0 or 1, $R_{a4}$ and $R_{a6}$ each independently represents a hydrogen atom, a halogen atom, a hydroxy group, a cyano group, an alkyl group, an aryl group, an alkoxy group or an aralkyl group, $L_5$ represents a single bond or a divalent connecting group, $Re_0$ and $Re_1$, which may be the same or different, each represents a hydrogen atom, a fluorine atom, an alkyl group, a cycloalkyl group or an aryl group, $Re_2$ to $Re_4$, which may be the same or different, each represents an alkyl group, a cycloalkyl group or an aryl group, or $Re_0$ and $Re_1$, $Re_0$ and $Re_2$ or $Re_3$ and $Re_4$ may be combined with each other to form a ring.

(12) The positive resist composition as described in (3), wherein the resin of component (A2) further includes a repeating unit represented by the following formula (A1):

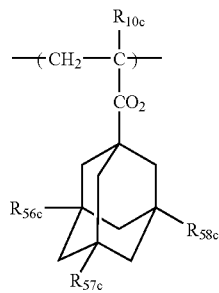

In formula (A1), $R_{56c}$, $R_{57c}$ and $R_{58c}$ each independently represents a hydrogen atom, a hydroxy group or an alkyl group, provided that at least one of $R_{56c}$, $R_{57c}$ and $R_{58c}$ represents a hydroxy group, and $R_{10c}$ represents a hydrogen atom, a methyl group or a trifluoromethyl group.

(13) The positive resist composition as described in (3) or (12), wherein the resin of component (A2) further includes a repeating unit containing a norbornane lactone structure represented by any one of the following formulae (a-1) to (a-3):

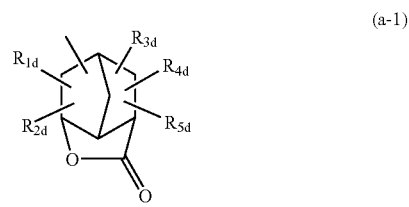

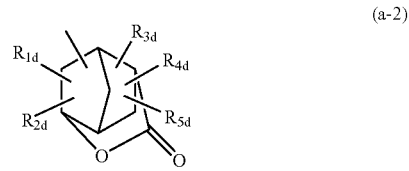

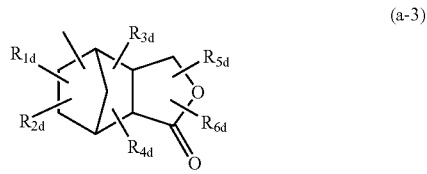

In formulae (a-1) to (a-3), $R_{1d}$ to $R_{6d}$ each independently represents a hydrogen atom, an alkyl group, a cycloalkyl group or an alkenyl group, or two of $R_{1d}$ to $R_{6d}$ may be combined with each other to form a ring.

(14) The positive resist composition as described in any one of (3), (12) and (13), wherein the resin of component (A2) further includes a repeating unit represented by the following formula (A3):

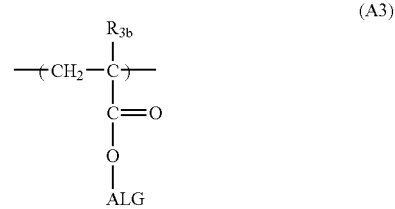

In formula (A3), $R_{3b}$ represents a hydrogen atom, a methyl group or a trifluoromethyl group, and ALG represents a group represented by the following formula (pI) or (pII):

-continued

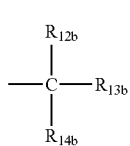
(pII)

In formulae (pI) and (pII), $R_{11b}$ represents a methyl group, an ethyl group, a n-propyl group, an isopropyl group, a n-butyl group, an isobutyl group or a sec-butyl group, Z represents an atomic group necessary for forming an alicyclic hydrocarbon group together with the carbon atom, $R_{12b}$ to $R_{14b}$ each independently represents an alkyl group having from 1 to 4 carbon atoms or an alicyclic hydrocarbon group, provided that at least one of $R_{12b}$ to $R_{14b}$ represents an alicyclic hydrocarbon group.

(15) The positive resist composition as described in any one of (3) to (5) and (12) to (14), wherein the resin of component (A2) is a resin in which all repeating units comprises an acrylic acid repeating unit, an acrylate repeating unit, an α-position substituted acrylic acid repeating unit or an α-position substituted acrylate repeating unit.

(16) The positive resist composition as described in any one of (3) to (5) and (12) to (15), wherein the resin of component (A2) has a glass transition temperature of from 90 to 170° C.

(17) The positive resist composition as described in any one of (1) to (16), wherein the compound (B) that generates an acid upon irradiation of an actinic ray or radiation is a compound (B1) that generates an organic sulfonic acid upon irradiation of an actinic ray or radiation.

(18) The positive resist composition as described in (17), which further comprises as the compound (B) that generates an acid upon irradiation of an actinic ray or radiation, a compound (B2) that generates a carboxylic acid upon irradiation of an actinic ray or radiation.

DETAILED DESCRIPTION OF THE INVENTION

According to the present invention, a positive resist composition, which is improved in resolution, sensitivity, development residue (scum), dissolution contrast, surface roughness, development defect, profile and roundness of contact hole pattern, and a pattern formation method using the positive resist composition can be provided.

The present invention will be described in detail below.

With respect to the description of a group (atomic group) in the specification, the term "group", which is not particularly referred to whether it is substituted or not, means and includes both unsubstituted and substituted groups. For instance, the description of an "alkyl group" includes not only an alkyl group having no substituent (unsubstituted alkyl group) but also an alkyl group having a substituent (substituted alkyl group).

[1] Resin (A1) that is decomposed by the action of an acid to increase solubility in an alkali developing solution and includes at least one repeating unit represented by formula (I) and Resin (A2) that is decomposed by the action of an acid to increase solubility in an alkali developing solution and includes at least one repeating unit represented by formula (X):

The positive resist composition of the invention include a resin (A1) that is decomposed by the action of an acid to increase solubility in an alkali developing solution and includes at least one repeating unit represented by formula (I) shown below (hereinafter also referred to as "resin of component (A1)") or a resin (A2) that is decomposed by the action of an acid to increase solubility in an alkali developing solution and includes at least one repeating unit represented by formula (X) shown below (hereinafter also referred to as "resin of component (A2)"). The resin of component (A1) and the resin of component (A2) are also collectively referred to as "acid-decomposable resin (A)".

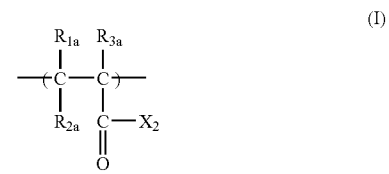
(I)

In formula (I), $R_{1a}$ to $R_{3a}$ each independently represents a hydrogen atom, a halogen atom, a cyano group or an alkyl group, provided that at least one of $R_{1a}$ to $R_{3a}$ represents an alkyl group having at least one group represented by formula (A) shown below, $X_2$ represents —ORa, —SRa or —N(Rb)(Ra), Ra represents a hydrogen atom or a monovalent organic group, Rb represents a hydrogen atom or an alkyl group,

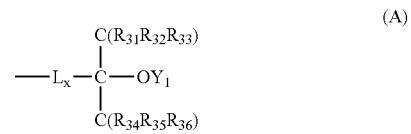
(A)

In formula (A), $R_{31}$ to $R_{36}$ each independently represents a hydrogen atom, a fluorine atom or an alkyl group, provided that at least one of $R_{31}$ to $R_{36}$ represents a fluorine atom or an alkyl group in which at least one of the hydrogen atoms is substituted with a fluorine atom, $Y_1$ represents a hydrogen atom or a monovalent organic group, and $L_x$ represents a single bond or a divalent connecting group.

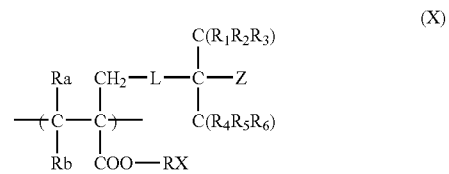
(X)

In formula (X), $R_a$ to $R_b$ each independently represents a hydrogen atom, a fluorine atom, a methyl group or a trifluoromethyl group, L represents a single bond or a divalent connecting group, $R_1$ to $R_6$ each independently represents a fluorine atom or a hydrogen atom, provided that at least one of $R_1$ to $R_6$ represents a fluorine atom, RX represents a hydrogen atom or a monovalent organic group, and Z represents a hydrogen atom, an alkyl group, a cycloalkyl group, a hydroxy group or a hydroxy group protected with a protective group capable of being decomposed by the action of an acid.

The group represented by —$C(R_{31}R_{32}R_{33})$ means a group wherein each of groups represented by $R_{31}$ to $R_{33}$ is connected with a single bond to the carbon atom (hereinafter the same shall apply).

Now, the resin of component (A1) will be described below.

The halogen atom represented by any one of $R_{1a}$ to $R_{3a}$ in formula (I) includes a fluorine atom, a chlorine atom, a bromine atom and an iodine atom.

The alkyl group represented by any one of $R_{1a}$ to $R_{3a}$ and Rb is preferably an alkyl group having from 1 to 5 carbon atoms and specifically includes, for example, methyl, ethyl, propyl, n-butyl, sec-butyl and tert-butyl groups. The alkyl group represented by any one of $R_{1a}$ to $R_{3a}$ and Rb may have a substituent. Examples of the substituent for the alkyl group represented by any one of $R_{1a}$ to $R_{3a}$ include a halogen atom (e.g., fluorine, chlorine, bromine or iodine atom), a hydroxy group, a cyano group, the group represented by formula (A) or a group formed by connecting the group represented by formula (A) to an alicyclic hydrocarbon residue (a residue formed by eliminating at least two hydrogen atoms from an alicyclic hydrocarbon, e.g., norbornane, adamantane or cyclohexane) or an oxy group, etc. Examples of the substituent for the alkyl group represented by Rb include a halogen atom (e.g., fluorine, chlorine, bromine or iodine atom), a hydroxy group or a cyano group.

The alkyl group having at least one group represented by formula (A) is preferably an alkyl group having from one to four groups represented by formula (A), and more preferably a methyl group having at least one group represented by formula (A). The alkyl group having at least one group represented by formula (A) may be an alkyl group in which at least one hydrogen atom is substituted with the group represented by formula (A) or an alkyl group which connects to the group represented by formula (A) through a connecting group having a valence of (w+1) represented by $L_y$ described hereinafter.

The monovalent organic group represented by Ra includes an acid-decomposable group capable of being released from an oxygen atom, a sulfur atom or a nitrogen atom by the action of an acid and an acid-undecomposable group that is not released from an oxygen atom, a sulfur atom or a nitrogen atom by the action of an acid.

The acid-decomposable group for Ra is not restricted as long as it is a group capable of being released from an oxygen atom, a sulfur atom or a nitrogen atom by the action of an acid to form a hydrophilic group, for example, a carboxy group, thereby increasing solubility in an alkali developing solution, and preferably includes groups represented by —$C(R_{11a})(R_{12a})(R_{13a})$ and —$C(R_{14a})(R_{15a})(OR_{16a})$. The group represented by —$C(R_{11a})(R_{12a})(R_{13a})$ means a group wherein each of groups represented by $R_{11a}$ to $R_{13a}$ is connected with a single bond to the carbon atom (hereinafter the same shall apply).

$R_{11a}$ to $R_{13a}$ each individually represents an alkyl group, a cycloalkyl group, an alkenyl group, an aralkyl group or an aryl group. $R_{14a}$ and $R_{15a}$ each individually represents a hydrogen atom or an alkyl group. $R_{16a}$ represents an alkyl group, a cycloalkyl group, an alkenyl group, an aralkyl group or an aryl group. Two of $R_{11a}$, $R_{12a}$ and $R_{13a}$ or two of $R_{14a}$, $R_{15a}$ and $R_{16a}$ may be connected with each other to form a ring.

The alkyl group represented by any one of $R_{11a}$, $R_{12a}$, $R_{13a}$, $R_{14a}$, $R_{15a}$ and $R_{16a}$ is preferably an alkyl group having from 1 to 8 carbon atoms, for example, methyl, ethyl, propyl, n-butyl, sec-butyl, hexyl, 2-ethylhexyl and octyl groups.

The cycloalkyl group represented by any one of $R_{11a}$ to $R_{13a}$ and $R_{16a}$ may be monocyclic or polycyclic. The monocyclic cycloalkyl group is preferably a cycloalkyl group having from 3 to 8 carbon atoms, for example, cyclopropyl, cyclopentyl, cyclohexyl, cycloheptyl and cyclooctyl groups. The polycyclic cycloalkyl group is preferably a cycloalkyl group having from 6 to 20 carbon atoms, for example, adamantyl, norbornyl, isobornyl, camphanyl, dicyclopentyl, α-pinenyl, tricyclodecanyl, tetracyclododecyl and androstanyl groups. The carbon atoms in the cycloalkyl group may be partially replaced with a hetero atom, for example, an oxygen atom.

The aryl group represented by any one of $R_{11a}$ to $R_{13a}$ and $R_{16a}$ is preferably an aryl group having from 6 to 10 carbon atoms, for example, phenyl, tolyl, dimethylphenyl, 2,4,6-trimethylphenyl, naphthyl, anthryl and 9,10-dimethoxyanthryl groups.

The aralkyl group represented by any one of $R_{11a}$ to $R_{13a}$ and $R_{16a}$ is preferably an aralkyl group having from 7 to 12 carbon atoms and includes, for example, benzyl, phenethyl and naphthylmethyl groups.

The alkenyl group represented by any one of $R_{11a}$ to $R_{13a}$ and $R_{16a}$ is preferably an alkenyl group having from 2 to 8 carbon atoms and includes, for example, vinyl, allyl, butenyl and cyclohexenyl groups.

The groups represented by any one of $R_{11a}$, $R_{12a}$, $R_{13a}$, $R_{14a}$, $R_{15a}$ and $R_{16a}$ may have a substituent. Examples of the substituent for the groups represented by any one of $R_{11a}$, $R_{12a}$, $R_{13a}$, $R_{14a}$, $R_{15a}$ and $R_{16a}$ includes an alkyl group, a cycloalkyl group, an aryl group, an amino group, an amido group, a ureido group, a urethane group, a hydroxy group, a carboxy group, a halogen atom, an alkoxy group, a thioether group, an acyl group, an acyloxy group, an alkoxycarbonyl group, a cyano group, a nitro group and the group represented by formula (A).

The acid-undecomposable group for Ra is an organic group that is not released from an oxygen atom, a sulfur atom or a nitrogen atom by the action of an acid, and includes, for example, an alkyl group, a cycloalkyl group, an aryl group, an aralkyl group, an alkoxy group, an alkoxycarbonyl group, a lactone residue (a residue formed by eliminating one hydrogen atom from a lactone), an amido group and a cyano group, each of which is not released from an oxygen atom, a sulfur atom or a nitrogen atom by the action of an acid. The alkyl group is preferably a straight chain or branched alkyl group having from 1 to 10 carbon atoms, for example, methyl, ethyl, propyl, n-butyl, sec-butyl, hexyl, 2-ethylhexyl or octyl group. The cycloalkyl group is preferably a cycloalkyl group having from 3 to 10 carbon atoms, for example, cyclopropyl, cyclobutyl, cyclohexyl, adamantyl or norbornyl group. The aryl group is preferably an aryl group having from 6 to 14 carbon atoms, for example, phenyl, naphthyl or anthryl group. The aralkyl group is preferably an aralkyl group having from 7 to 12 carbon atoms and includes, for example, benzyl, phenethyl or cumyl group. The alkoxy group is preferably an alkoxy group having from 1 to 5 carbon atoms, for example, methoxy, ethoxy, propoxy, n-butoxy or isobutoxy group. The lactone residue is preferably a lactone residue having from 6 to 15 carbon atoms.

The acid-undecomposable group for Ra may have a substituent. Examples of the substituent for the acid-undecomposable group represented by Ra includes an alkyl group, a cycloalkyl group, an aryl group, an amino group, an amido group, a ureido group, a urethane group, a hydroxy group, a carboxy group, a halogen atom, an alkoxy group, a thioether group, an acyl group, an acyloxy group, an alkoxycarbonyl group, a cyano group, a nitro group and the group represented by formula (A).

It is preferred that the organic group represented by Ra has the group represented by formula (A).

The alkyl group represented by any one of $R_{31}$ to $R_{36}$ in formula (A) has the same meaning as the alkyl group represented by any one of $R_{1a}$ to $R_{3a}$ in formula (I).

The alkyl group in which at least one of the hydrogen atoms is substituted with a fluorine atom represented by any one of $R_{31}$ to $R_{36}$ is preferably an alkyl group described above in which at least one of the hydrogen atoms is substituted with a fluorine atom, and includes, for example, perfluoromethyl, perfluoroethyl or perfluoropropyl group.

It is preferred that all of $R_{31}$ to $R_{36}$ are fluorine atoms.

The organic group represented by $Y_1$ includes an acid-decomposable group capable of being released from an oxygen atom by the action of an acid and an acid-undecomposable group that is not released from an oxygen atom by the action of an acid.

The acid-decomposable group for $Y_1$ is not restricted as long as it is a group capable of being released from an oxygen atom by the action of an acid to form a hydroxy group, thereby increasing solubility in an alkali developing solution, and preferably includes groups represented by —C($R_{11b}$)($R_{12b}$)($R_{13b}$), —C($R_{14b}$)($R_{15b}$)(O$R_{16b}$) or —CO—O—C($R_{11b}$)($R_{12b}$)($R_{13b}$).

$R_{11b}$ to $R_{13b}$ each individually represents an alkyl group, a cycloalkyl group, an alkenyl group, an aralkyl group or an aryl group. $R_{14b}$ and $R_{15b}$ each individually represents a hydrogen atom or an alkyl group. $R_{16b}$ represents an alkyl group, a cycloalkyl group, an alkenyl group, an aralkyl group or an aryl group. Two of $R_{11b}$, $R_{12b}$ and $R_{13b}$ or two of $R_{14b}$, $R_{15b}$ and $R_{16b}$ may be connected with each other to form a ring.

The alkyl group represented by any one of $R_{11b}$, $R_{12b}$, $R_{13b}$, $R_{14b}$, $R_{15b}$ and $R_{16b}$ is preferably an alkyl group having from 1 to 8 carbon atoms, for example, methyl, ethyl, propyl, n-butyl, sec-butyl, hexyl, 2-ethylhexyl and octyl groups.

The cycloalkyl group represented by any one of $R_{11b}$ to $R_{13b}$ and $R_{16b}$ may be monocyclic or polycyclic. The monocyclic cycloalkyl group is preferably a cycloalkyl group having from 3 to 8 carbon atoms, for example, cyclopropyl, cyclopentyl, cyclohexyl, cycloheptyl and cyclooctyl groups. The polycyclic cycloalkyl group is preferably a cycloalkyl group having from 6 to 20 carbon atoms, for example, adamantyl, norbornyl, isobornyl, camphanyl, dicyclopentyl, α-pinenyl, tricyclodecanyl, tetracyclododecyl and androstanyl groups. The carbon atoms in the cycloalkyl group may be partially replaced with a hetero atom, for example, an oxygen atom.

The aryl group represented by any one of $R_{11b}$ to $R_{13b}$ and $R_{16b}$ is preferably an aryl group having from 6 to 10 carbon atoms, for example, phenyl, tolyl, dimethylphenyl, 2,4,6-trimethylphenyl, naphthyl, anthryl and 9,10-dimethoxyanthryl groups.

The aralkyl group represented by any one of $R_{11b}$ to $R_{13b}$ and $R_{16b}$ is preferably an aralkyl group having from 7 to 12 carbon atoms and includes, for example, benzyl, phenethyl and naphthylmethyl groups.

The alkenyl group represented by any one of $R_{11b}$ to $R_{13b}$ and $R_{16b}$ is preferably an alkenyl group having from 2 to 8 carbon atoms and includes, for example, vinyl, allyl, butenyl and cyclohexenyl groups.

The groups represented by any one of $R_{11b}$, $R_{12b}$, $R_{13b}$, $R_{14b}$, $R_{15b}$ and $R_{16b}$ may have a substituent. Examples of the substituent for the groups represented by any one of $R_{11b}$, $R_{12b}$, $R_{13b}$, $R_{14b}$, $R_{15b}$ and $R_{16b}$ includes an alkyl group, a cycloalkyl group, an aryl group, an amino group, an amido group, a ureido group, a urethane group, a hydroxy group, a carboxy group, a halogen atom, an alkoxy group, a thioether group, an acyl group, an acyloxy group, an alkoxycarbonyl group, a cyano group and a nitro group.

The acid-undecomposable group for $Y_1$ is an organic group that is not released from an oxygen atom by the action of an acid, and includes, for example, an alkyl group, a cycloalkyl group, an aryl group, an aralkyl group, an alkoxy group, an alkoxycarbonyl group, an amido group and a cyano group, each of which is not released from an oxygen atom, a sulfur atom or a nitrogen atom by the action of an acid. The alkyl group is preferably a straight chain or branched alkyl group having from 1 to 10 carbon atoms, for example, methyl, ethyl, propyl, n-butyl, sec-butyl, hexyl, 2-ethylhexyl or octyl group. The cycloalkyl group is preferably a cycloalkyl group having from 3 to 10 carbon atoms, for example, cyclopropyl, cyclobutyl, cyclohexyl, adamantyl or norbornyl group. The aryl group is preferably an aryl group having from 6 to 14 carbon atoms, for example, phenyl, naphthyl or anthryl group. The aralkyl group is preferably an aralkyl group having from 7 to 12 carbon atoms and includes, for example, benzyl, phenethyl or cumyl group. The alkoxy group or the alkoxy group in the alkoxycarbonyl group is preferably an alkoxy group having from 1 to 5 carbon atoms, for example, methoxy, ethoxy, propoxy, n-butoxy or isobutoxy group.

The acid-undecomposable group for $Y_1$ may have a substituent. Examples of the substituent for the acid-undecomposable group represented by $Y_1$ includes an alkyl group, a cycloalkyl group, an aryl group, an amino group, an amido group, a ureido group, a urethane group, a hydroxy group, a carboxy group, a halogen atom, an alkoxy group, a thioether group, an acyl group, an acyloxy group, an alkoxycarbonyl group, a cyano group and a nitro group.

The divalent connecting group represented by $L_x$ includes, for example, a substituted or unsubstituted alkylene group, a substituted or unsubstituted arylene group, an ether group, a thioether group, a carbonyl group, an ester group, an amido group, a sulfonamido group, a urethane group, a urea group and a combination of two or more of these groups. The alkylene group preferably includes an alkylene group having from 1 to 8 carbon atoms, which may have a substituent, for example, methylene, ethylene, propylene, butylene, hexylene or octylene group. The arylene group preferably includes an arylene group having from 6 to 15 carbon atoms, which may have a substituent, for example, phenylene, tolylene or naphthylene group.

It is preferred that the organic group represented by Ra has an alicyclic structure.

The alicyclic structure may be a monocyclo, bicyclo, tricyclo or tetracyclo structure. The number of carbon atoms included in the alicyclic structure is preferably from 6 to 30, and more preferably from 7 to 25. Preferred examples of the alicyclic structure include adamantane, noradamantane, cyclohexane, decalin, tricyclodecane, tetracyclododecane and norbornane structures. Of these structures, adamantane, norbornane and cyclohexane structures are more preferred.

The —$R_{3a}$ in formula (I) is preferably a group represented by the following formula (R3a):

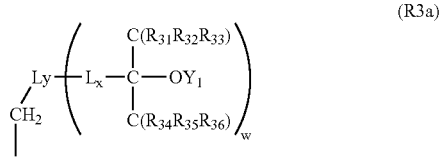

(R3a)

In formula (R3a), $R_{31}$ to $R_{36}$, $Y_1$ and $L_x$ have the same meanings as those defined for $R_{31}$ to $R_{36}$, $Y_1$ and $L_x$ in formula (A), respectively, $L_y$ represents a single bond or a connecting group having a valence of (w+1), and w represents an integer of from 1 to 4.

The connecting group having a valence of (w+1) represented by $L_y$ in formula (R3a) includes, for example, a connecting group having a valence of (w+1) formed by connecting an oxy group and an alicyclic hydrocarbon residue (a residue formed by eliminating at least two hydrogen atoms from an alicyclic hydrocarbon, e.g., norbornane, adamantane or cyclohexane)

The repeating unit represented by formula (I) is preferably a repeating unit represented by the following formula (Ia) or (Ib):

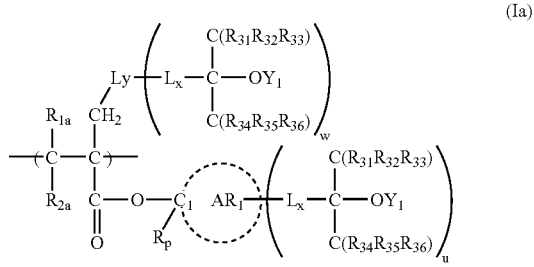

(Ia)

In formula (Ia), $R_{1a}$ and $R_{2a}$ have the same meanings as those defined for $R_{1a}$ and $R_{2a}$ in formula (I), respectively, $R_{31}$ to $R_{36}$, $Y_1$, $L_x$, $L_y$ and w have the same meanings as defined for $R_{31}$ to $R_{36}$, $Y_1$, $L_x$, $L_y$ and w in formula (R3a), respectively, $R_p$ represents a hydrogen atom or an alkyl group, $AR_1$ represents an atomic group for forming an alicyclic structure together with $C_1$, and u represents an integer of from 0 to 4.

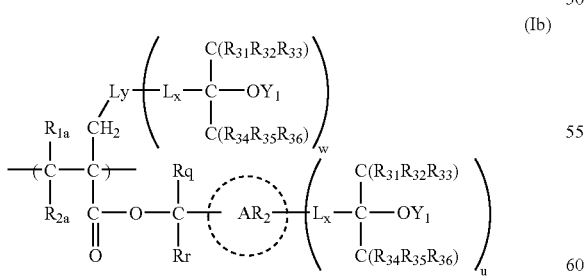

(Ib)

In formula (Ib), $R_{1a}$, $R_{2a}$, $R_{31}$ to $R_{36}$, $Y_1$, $L_x$, $L_y$, w and u have the same meanings as defined for $R_{1a}$, $R_{2a}$, $R_{31}$ to $R_{36}$, $Y_1$, $L_x$, $L_y$, w and u in formula (Ia), Rq and Rr each independently represents an alkyl group, and $AR_2$ represents an atomic group for forming an alicyclic structure.

The alkyl group represented by $R_p$ in formula (Ia) has the same meaning as the alkyl group represented by any one of $R_{1a}$ to $R_{3a}$ in formula (I).

The alicyclic structure formed by $AR_1$ together with $C_1$ may be a monocyclo, bicyclo, tricyclo or tetracyclo structure. The number of carbon atoms included in the alicyclic structure is preferably from 6 to 30, and more preferably from 7 to 25. Preferred examples of the alicyclic structure include an adamantine residue (a residue formed by eliminating (u+1) hydrogen atoms from adamantine, hereinafter the same shall apply), a noradamantane residue, a cyclohexane residue, a decalin residue, a tricyclodecane residue, a tetracyclododecane residue and a norbornane residue. Of the aliphatic structures, an adamantane residue, a norbornane residue and a cyclohexane residue are more preferred.

The alkyl group represented by any one of Rq and Rr in formula (Ib) has the same meaning as the alkyl group represented by any one of $R_{1a}$ to $R_{3a}$ in formula (I).

The alicyclic structure represented by $AR_2$ has same meaning as the alicyclic structure represented by $AR_1$ in formula (Ia).

Specific examples of the repeating unit represented by formula (I), (Ia) or (Ib) are set forth below, but the invention should not be construed as being limited thereto.

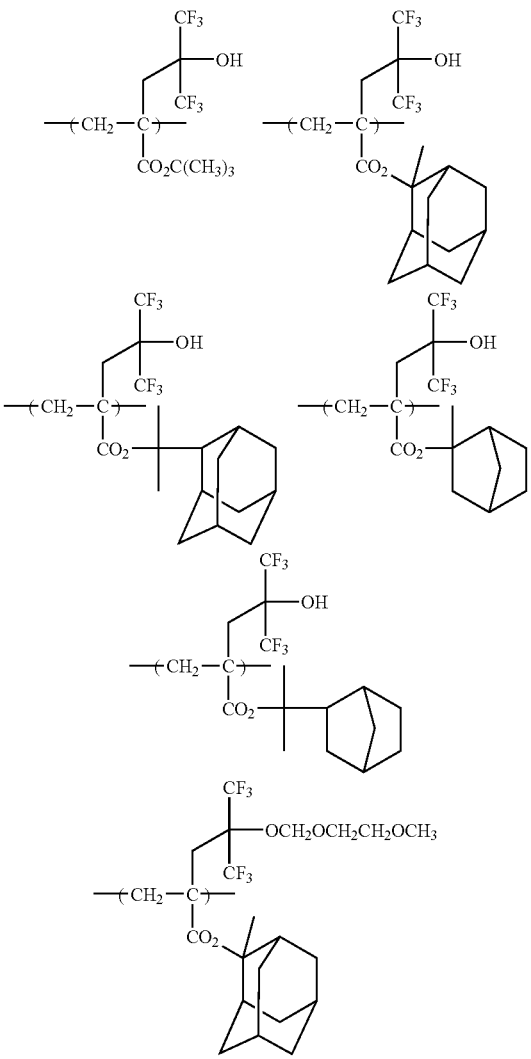

-continued
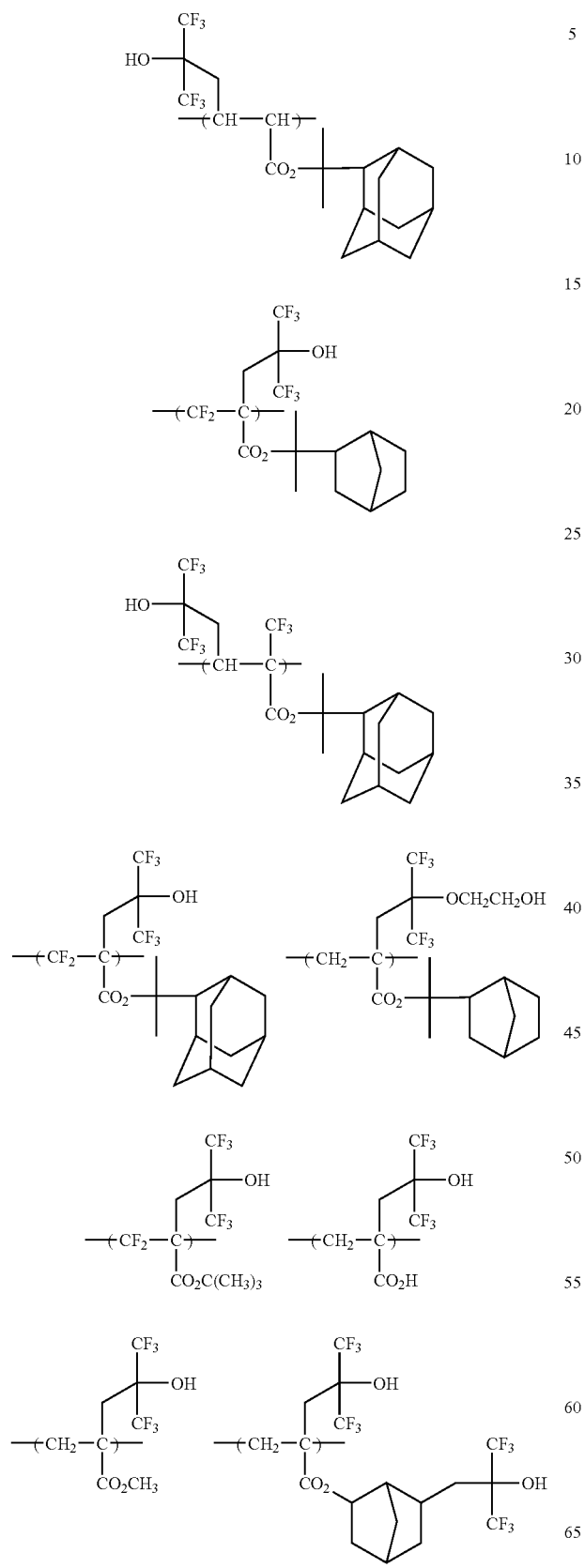
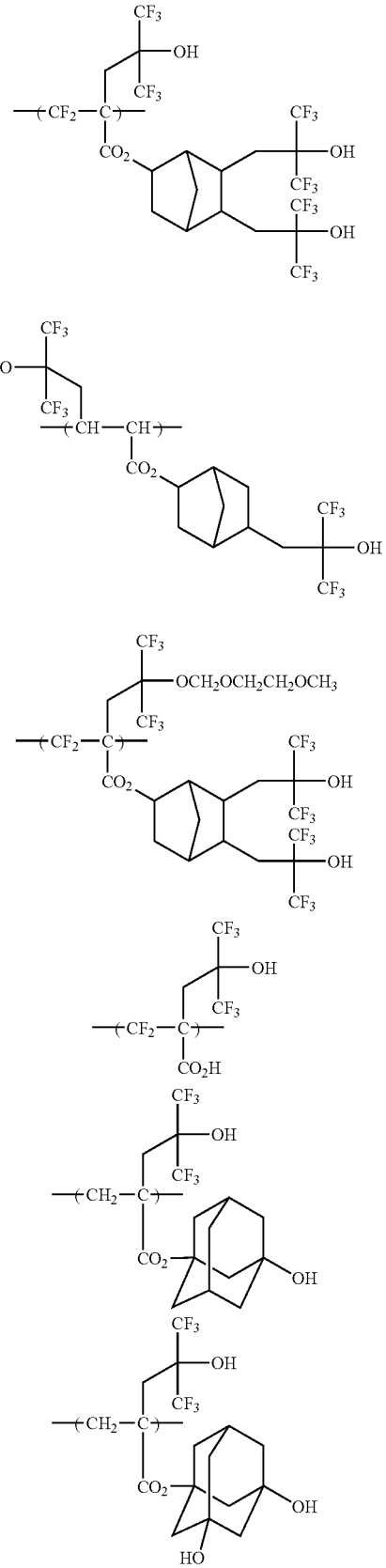

-continued
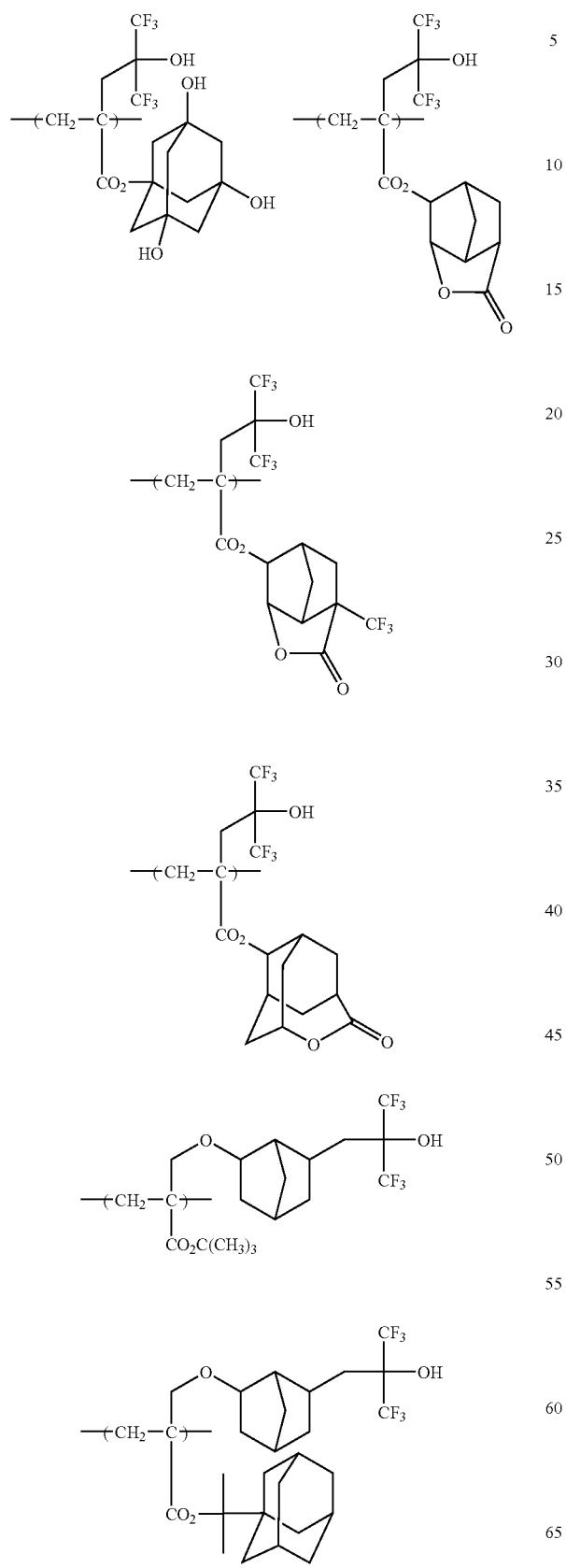
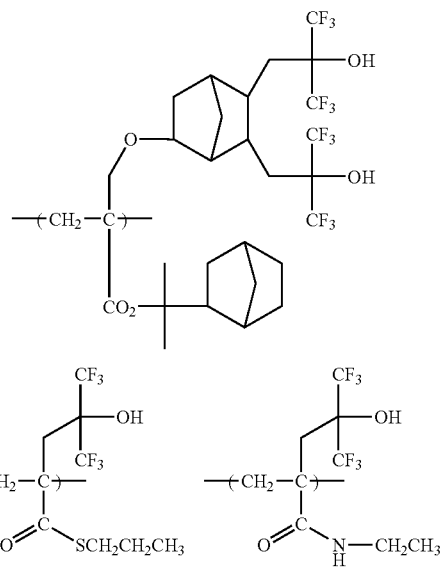
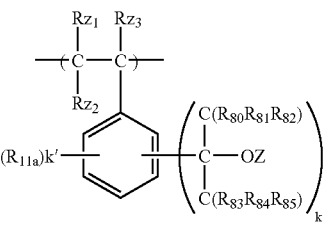
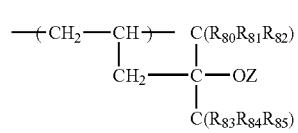
It is preferred that the resin of component (A1) further includes at least one repeating unit selected from repeating units represented by the following formulae (II) to (XII):
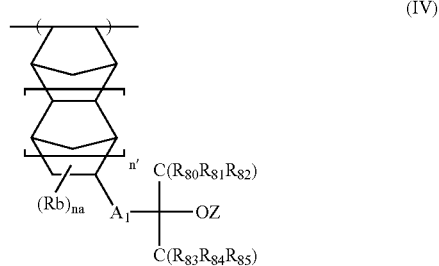
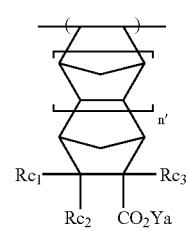

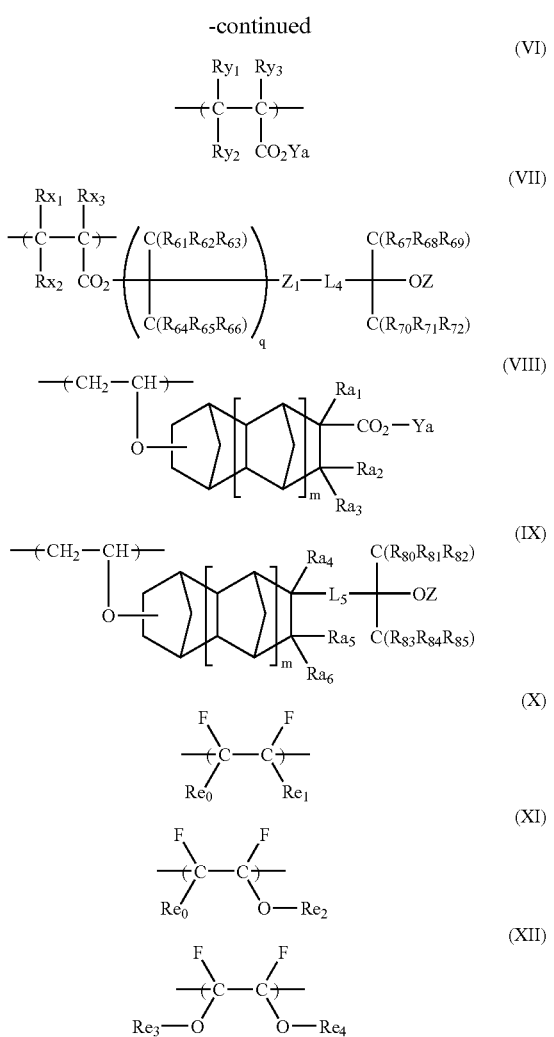

In formulae (II) to (XII), $R_{z1}$ and $R_{z2}$ each independently represents a hydrogen atom, a fluorine atom, a chlorine atom, a cyano group or an alkyl group in which at least one of the hydrogen atoms is substituted with a fluorine atom, $R_{z3}$ represents a hydrogen atom, a halogen atom, a cyano group or an alkyl group, $R_{11a}$ represents a hydrogen atom, a hydroxy group, a halogen atom, a cyano group, an alkoxy group, an acyl group, an alkyl group, a cycloalkyl group, an alkenyl group, an aralkyl group or an aryl group, $R_{80}$ and $R_{85}$ each independently represents a hydrogen atom, a fluorine atom or an alkyl group, provided that at least one of $R_{80}$ and $R_{85}$ represents a fluorine atom or an alkyl group in which at least one of the hydrogen atoms is substituted with a fluorine atom, Z represents a hydrogen atom or a monovalent organic group, k represents an integer of from 1 to 5, k' represents an integer of from 0 to 4, Rb represents a hydrogen atom, a halogen atom, a cyano group or an alkyl group, which may be the same or different when two or more Rb's are present, $A_1$ represents a single bond or a divalent connecting group, n' represents 0 or 1, na represents an integer of from 0 to 7, $R_{c1}$ and $R_{c3}$ each independently represents a hydrogen atom, a halogen atom, a cyano group or an alkyl group, Ya represents a hydrogen atom or a monovalent organic group, $R_{y1}$ and $R_{y3}$ each independently represents a hydrogen atom, a fluorine atom, a chlorine atom, a cyano group or an alkyl group in which at least one of the hydrogen atoms is substituted with a fluorine atom, $R_{x1}$ and $R_{x3}$ each independently represents a hydrogen atom, a fluorine atom, a chlorine atom, a cyano group or an alkyl group in which at least one of the hydrogen atoms is substituted with a fluorine atom, $R_{61}$ to $R_{72}$ each independently represents a hydrogen atom, a fluorine atom or an alkyl group, provided that at least one of $R_{61}$ to $R_{66}$ represents a fluorine atom and at least one of $R_{67}$ to $R_{72}$ represents a fluorine atom, $Z_1$ represents a phenylene group, a cyclohexylene group, an adamantane residue or a norbornane residue, $L_4$ represents a single bond or a divalent connecting group, q represents 0 or 1, $R_{a1}$ and $R_{a3}$ each independently represents a hydrogen atom, a halogen atom, a hydroxy group, a cyano group, an alkyl group, an aryl group, an alkoxy group or an aralkyl group, m represents 0 or 1, $R_{a4}$ and $R_{a6}$ each independently represents a hydrogen atom, a halogen atom, a hydroxy group, a cyano group, an alkyl group, an aryl group, an alkoxy group or an aralkyl group, $L_5$ represents a single bond or a divalent connecting group, $Re_0$ and $Re_1$, which may be the same or different, each represents a hydrogen atom, a fluorine atom, an alkyl group, a cycloalkyl group or an aryl group, $Re_2$ to $Re_4$, which may be the same or different, each represents an alkyl group, a cycloalkyl group or an aryl group, or $Re_0$ and $Re_1$, $Re_0$ and $Re_2$ or $Re_3$ and $Re_4$ may be combined with each other to form a ring.

The halogen atom represented by any one of $R_{z3}$, $R_{11a}$, $R_{c1}$ to $R_{c3}$ and $R_{a1}$ to $R_{a6}$ in formulae (II) to (XII) includes a fluorine atom, a chlorine atom, a bromine atom and an iodine atom.

The alkyl group represented by any one of $R_{z3}$, $R_{11a}$, Rb, $R_{c1}$ to $R_{c3}$, $R_{a1}$ to $R_{a6}$, $R_{e0}$ and $R_{e1}$ to $R_{e4}$ or the alkyl group in the alkoxy group represented by any one of $R_{11}$ and $R_{a1}$ to $R_{a6}$ is preferably an alkyl group having from 1 to 12 carbon atoms, for example, methyl, ethyl, propyl, n-butyl, sec-butyl, tert-butyl, hexyl, 2-ethylhexyl and octyl groups.

The alkyl group in which at least one of the hydrogen atoms is substituted with a fluorine atom represented by any one of $R_{z1}$, $R_{z2}$, $R_{y1}$ to $R_{y3}$ and $R_{x1}$ to $R_{x3}$ is preferably an alkyl group described above in which at least one of the hydrogen atoms is substituted with a fluorine atom and more preferably a perfluoroalkyl group. The perfluoroalkyl group is preferably that having from 1 to 12 carbon atoms, and specifically includes, for example, perfluoromethyl, perfluoroethyl, perfluoropropyl, perfluorobutyl, perfluorohexyl, perfluorooctyl, perfluorooctylethyl and perfluorododecyl groups.

The cycloalkyl group represented by any one of $R_{11a}$, $R_{e0}$ and $R_{e1}$ to $R_{e4}$ may be monocyclic or polycyclic. The monocyclic cycloalkyl group is preferably a cycloalkyl group having from 3 to 8 carbon atoms, for example, cyclopropyl, cyclopentyl, cyclohexyl, cycloheptyl and cyclooctyl groups. The polycyclic cycloalkyl group is preferably a cycloalkyl group having from 6 to 20 carbon atoms, for example, adamantyl, norbornyl, isobornyl, camphanyl, dicyclopentyl, α-pinenyl, tricyclodecanyl, tetracyclododecyl and androstanyl groups. The carbon atoms in the monocyclic or polycyclic cycloalkyl group may be partially replaced with a hetero atom, for example, an oxygen atom.

The aryl group represented by any one of $R_{11a}$, $R_{a1}$ to $R_{a6}$, $R_{e0}$ and $R_{e1}$ to $R_{e4}$ is preferably an aryl group having from 6 to 15 carbon atoms, and specifically includes, for example, phenyl, naphthyl and anthryl groups.

The acyl group represented by $R_{11a}$ is preferably an acyl group having from 1 to 10 carbon atoms and specifically includes, for example, formyl, acetyl, propanoyl, butanoyl, pivaloyl, octanoyl and benzoyl groups.

The aralkyl group represented by any one of $R_{11a}$ and $R_{a1}$ to $R_{a6}$ is preferably an aralkyl group having from 7 to 12 carbon atoms and specifically includes, for example, benzyl, phenethyl and naphthylmethyl groups.

The alkenyl group represented by any one of $R_{11a}$ is preferably an alkenyl group having from 2 to 8 carbon atoms and specifically includes, for example, vinyl, allyl, butenyl and cyclohexenyl groups.

The ring formed by connecting $Re_0$ and $Re_1$, $Re_0$ and $Re_2$ or $Re_3$ and $Re_4$ is preferably a ring structure having from 3 to 8 carbon atoms.

The alkyl group, cycloalkyl group, aryl group, aralkyl group, alkenyl group or acyl group may not have a substituent. Examples of the substituent, which the alkyl group, cycloalkyl group, aryl group, aralkyl group, alkenyl group or acyl group may have, include an alkyl group, a cycloalkyl group, an aryl group, an amino group, an amido group, a ureido group, a urethane group, a hydroxy group or a carboxy group, a halogen atom (e.g., fluorine, chlorine, bromine or iodine atom), an alkoxy group (e.g., methoxy, ethoxy, propoxy or butoxy group), a thioether group, an acyl group (e.g., acetyl, propanoyl or benzoyl group), an acyloxy group (e.g., acetoxy, propanoyloxy or benzoyloxy group), an alkoxycarbonyl group (e.g., methoxycarbonyl, ethoxycarbonyl or propoxycarbonyl group), a cyano group and a nitro group.

The alkyl group, cycloalkyl group and aryl group for the substituents includes those described above. The alkyl group may further substituted with a fluorine atom or a cycloalkyl group. The alkyl group substituted with a fluorine atom includes, for example, a perfluoroalkyl group described above.

$R_{80}$ to $R_{85}$ in formulae (II) to (XII) have the same meaning as defined for $R_{31}$ to $R_{36}$ in formula (A) respectively.

It is preferred that all $R_{80}$ to $R_{85}$ are fluorine atoms.

Z has the same meaning as defined for $Y_1$ in formula (A).

The monovalent organic group represented by Ya has the same meaning as the monovalent organic group defined for Ra in formula (I).

The divalent connecting group represented by any one of $A_1$, $L_4$ and $L_5$ has the same meaning as the divalent connecting group defined for $L_x$ in formula (A).

The alkyl group represented by any one of $R_{61}$ to $R_{72}$ has the same meaning as the alkyl group defined for $R_{31}$ to $R_{36}$ in formula (A).

It is preferred that all $R_{61}$ to $R_{72}$ are fluorine atoms.

Specific examples of the repeating unit represented by formulae (II) to (XII) are set forth below, but the invention should not be construed as being limited thereto.

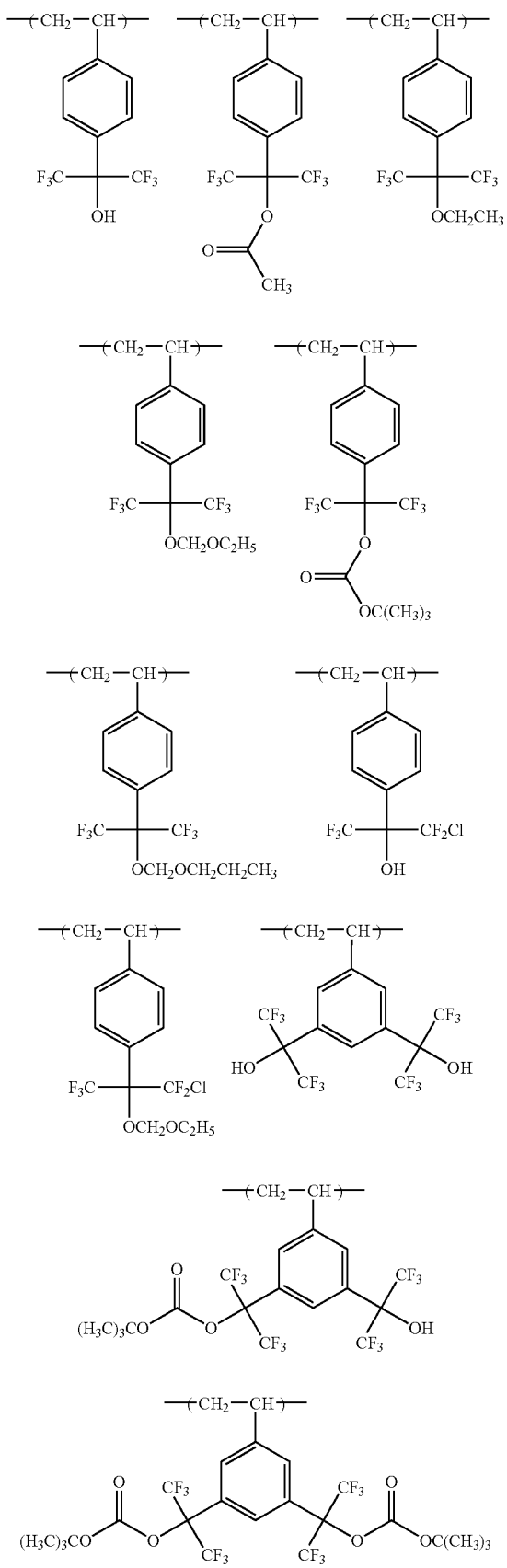

-continued
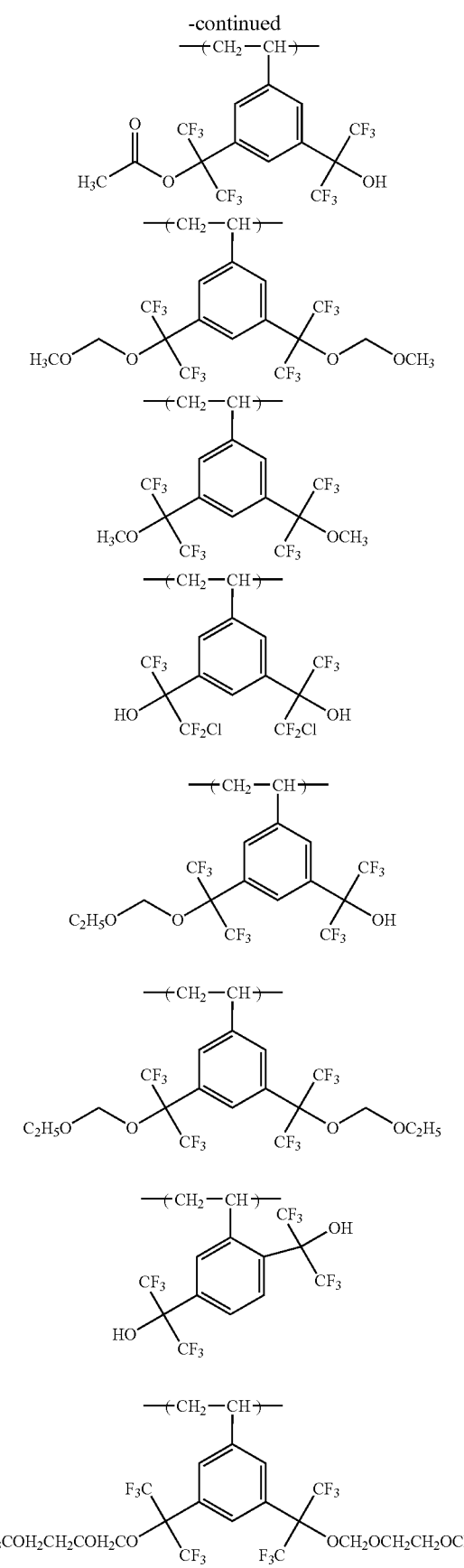
-continued
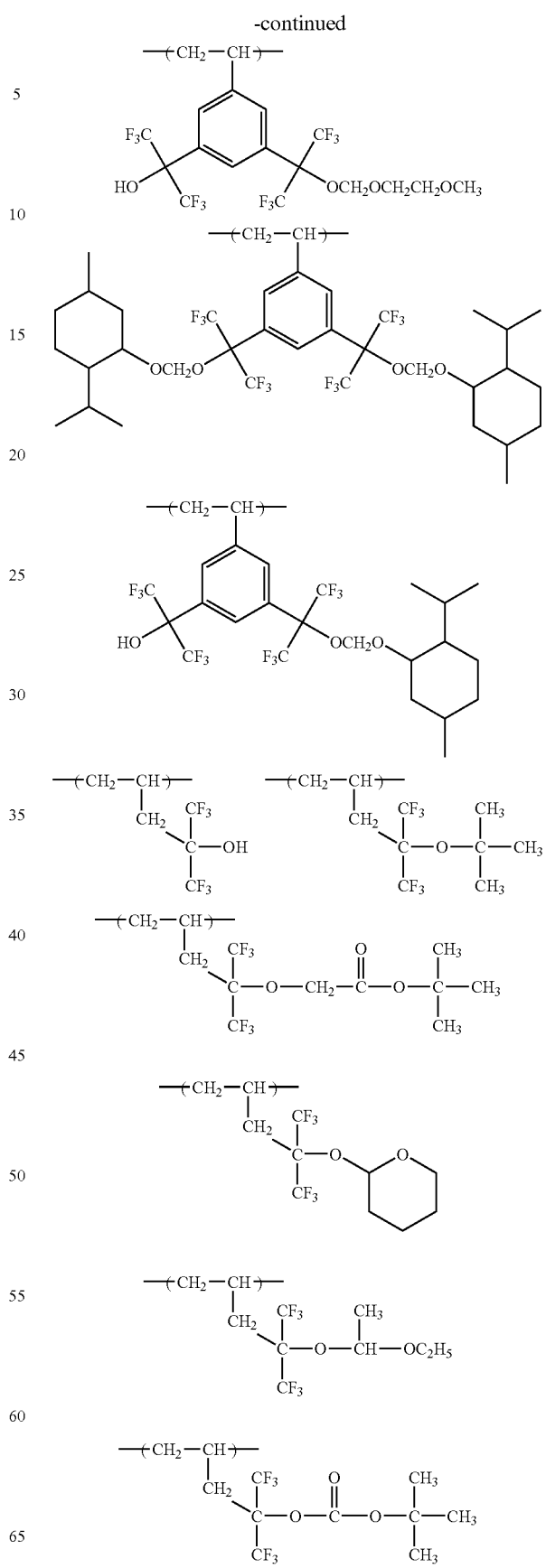

-continued
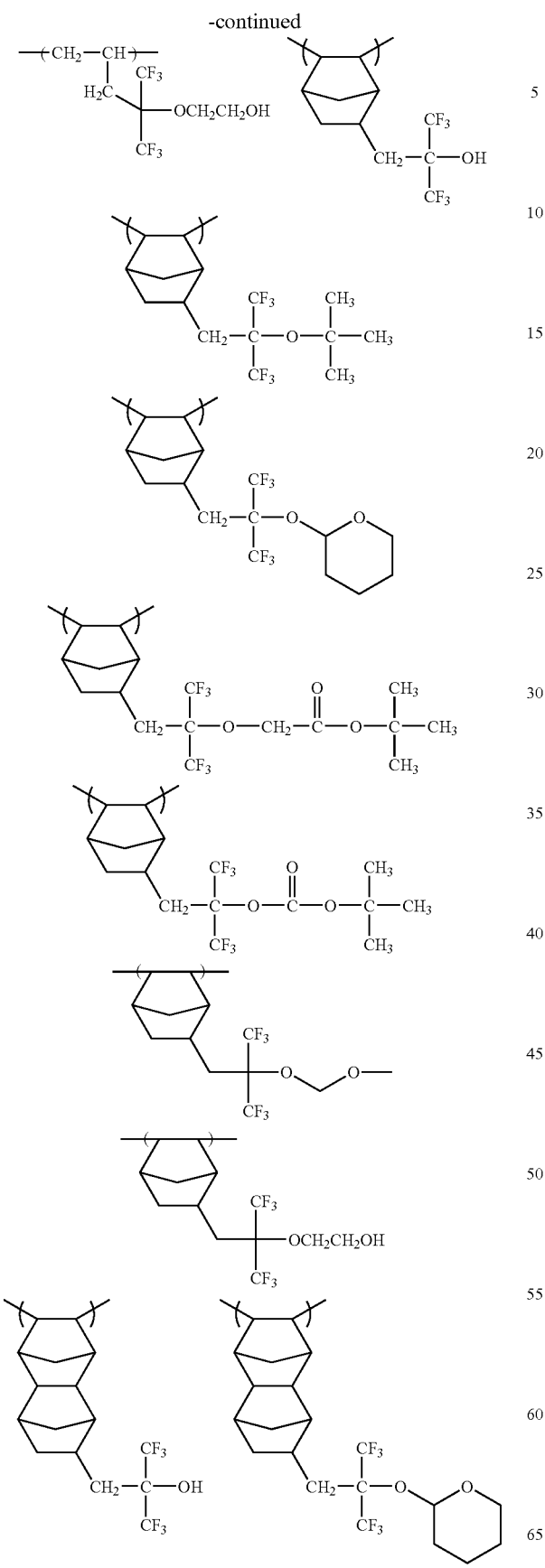
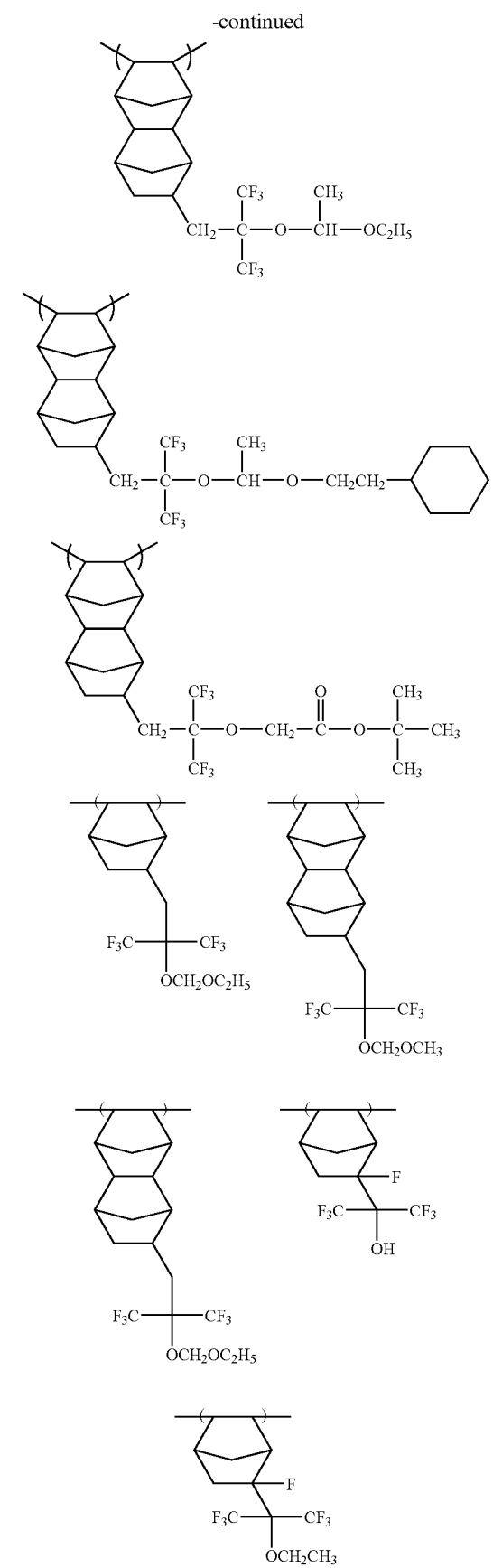

-continued
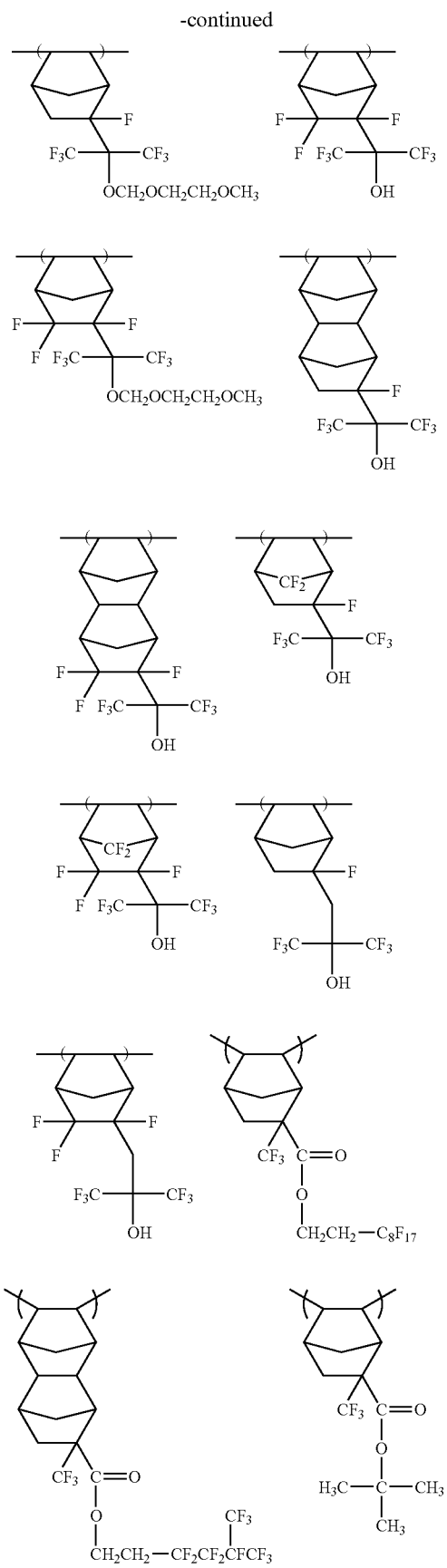
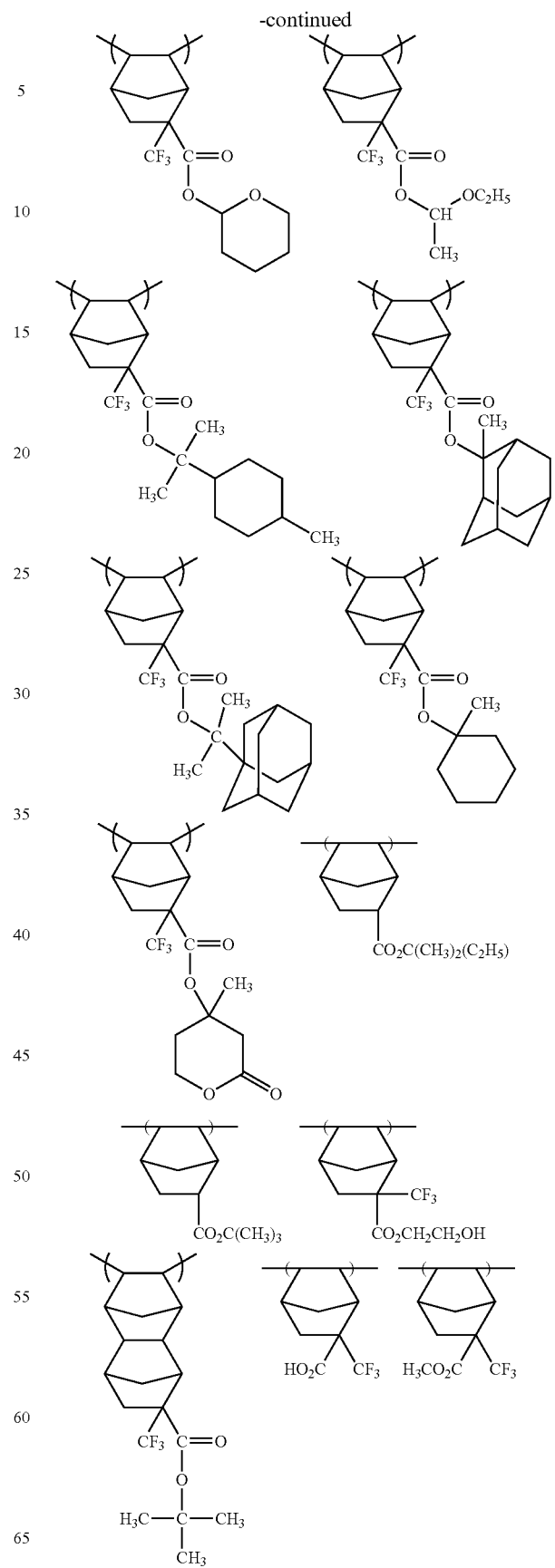

-continued
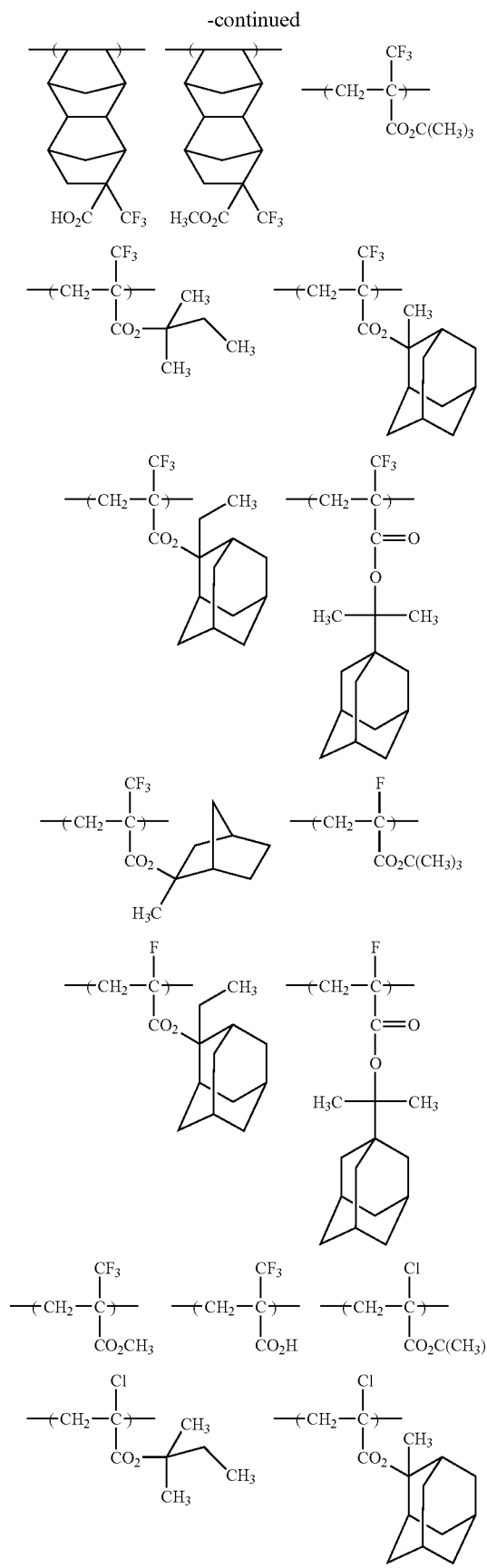
-continued
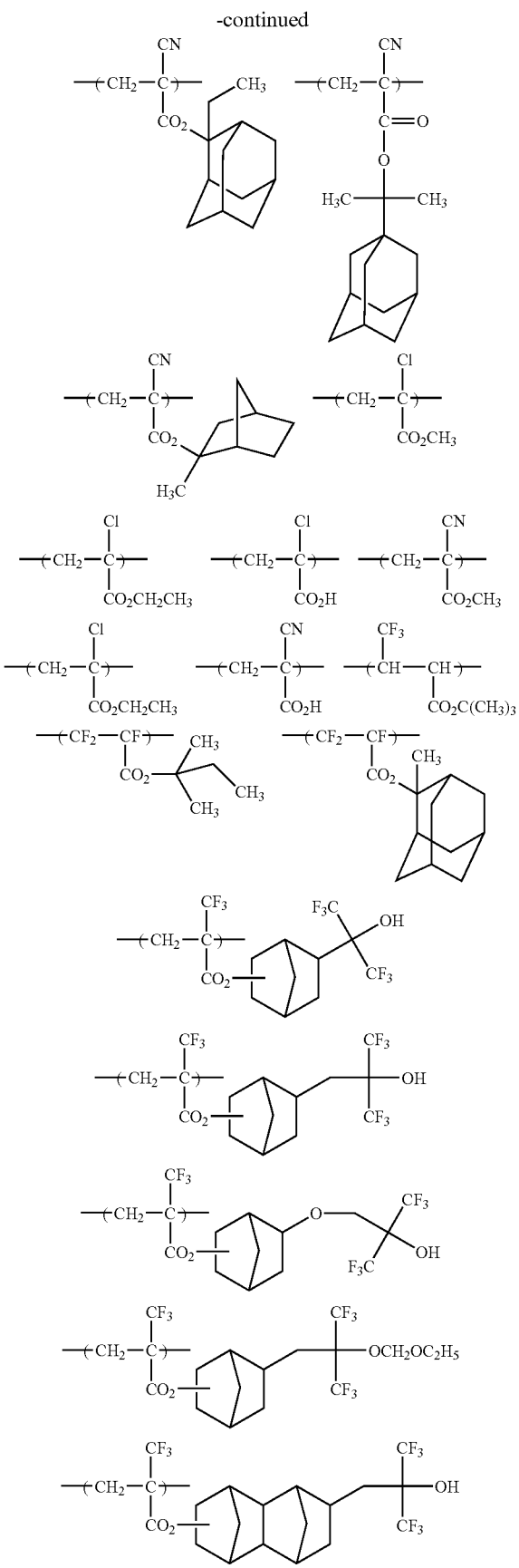

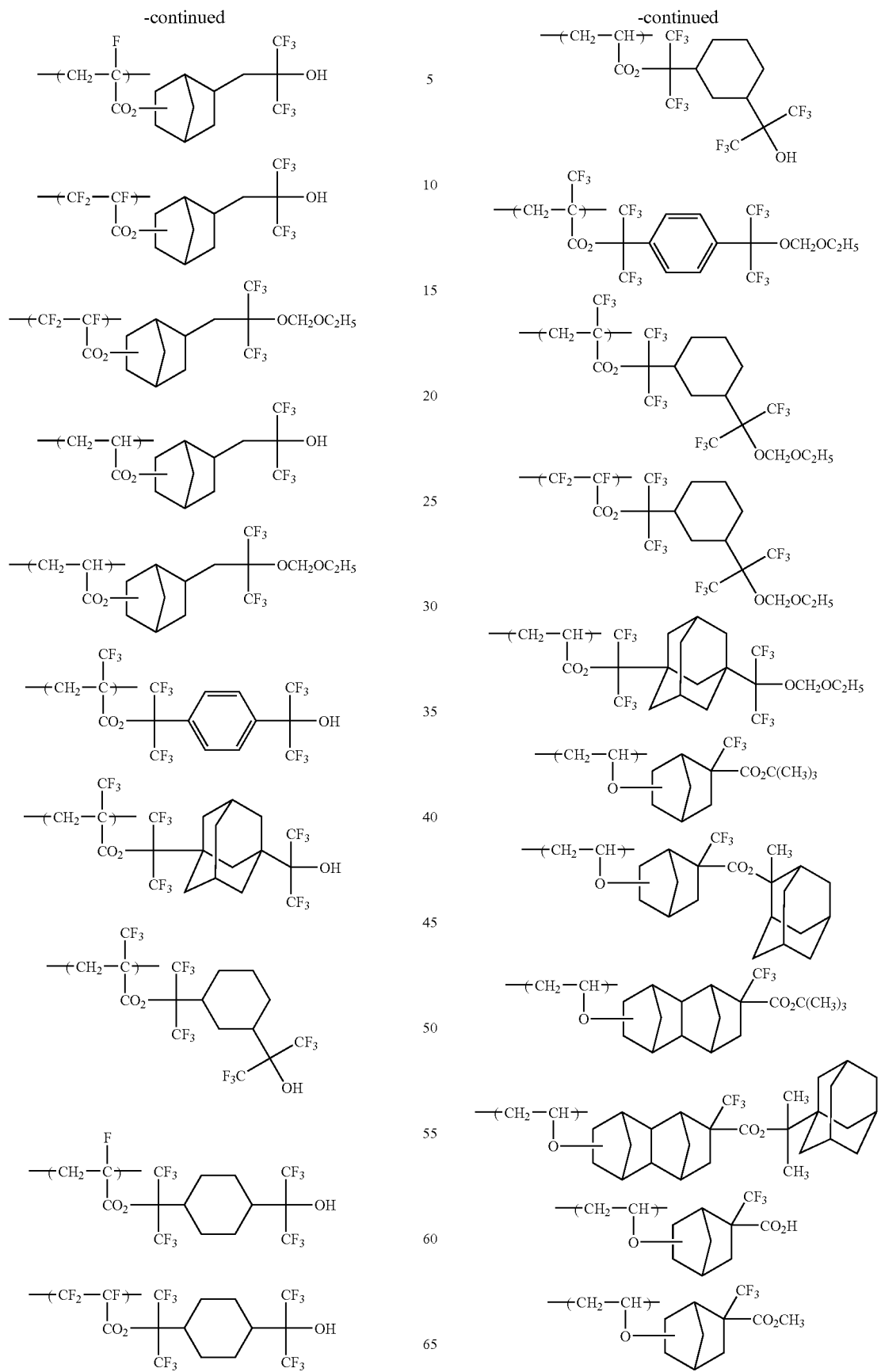

-continued

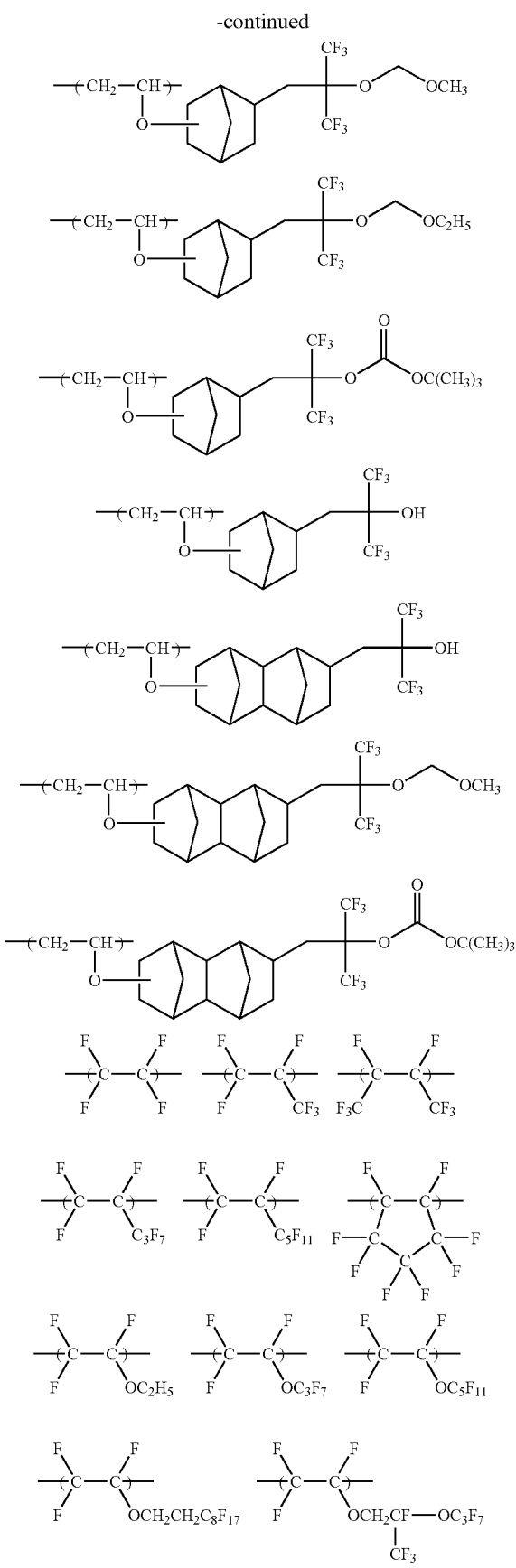

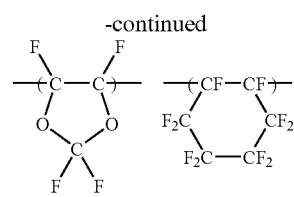

The resin of component (A1) may further include a repeating unit represented by the following formula (XIII):

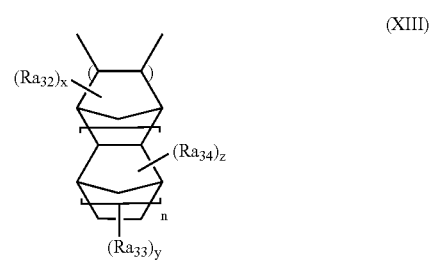

In formula (XIII), $Ra_{32}$, $Ra_{33}$ and $Ra_{34}$, which may be the same or different, each represent a hydrogen atom, a fluorine atom, an alkyl group having a fluorine atom, a cycloalkyl group having a fluorine atom, an alkenyl group having a fluorine atom, an aralkyl group having a fluorine atom, an aryl group having a fluorine atom, an alkoxy group having a fluorine atom or a hydroxyalkyl group, provided that at least one of $Ra_{32}$, $Ra_{33}$ and $Ra_{34}$ is a substituent other than a hydrogen atom. n represents 0 or 1. x, y and z each represents an integer of from 0 to 4.

The alkyl group having a fluorine atom represented by any one of $Ra_{32}$, $Ra_{33}$ and $Ra_{34}$ in formula (XIII) is an alkyl group in which at least one of the hydrogen atoms is substituted with a fluorine atom. The alkyl group is preferably an alkyl group having from 1 to 8 carbon atoms, for example, methyl, ethyl, propyl, n-butyl, sec-butyl, tert-butyl, hexyl, 2-ethylhexyl and octyl groups.

The cycloalkyl group having a fluorine atom represented by any one of $Ra_{32}$, $Ra_{33}$ and $Ra_{34}$ is a cycloalkyl group in which at least one of the hydrogen atoms is substituted with a fluorine atom. The cycloalkyl group may be monocyclic or polycyclic. The monocyclic cycloalkyl group is preferably a cycloalkyl group having from 3 to 8 carbon atoms, for example, cyclopropyl, cyclopentyl, cyclohexyl, cycloheptyl and cyclooctyl groups. The polycyclic cycloalkyl group is preferably a cycloalkyl group having from 6 to 20 carbon atoms, for example, adamantyl, norbornyl, isobornyl, camphanyl, dicyclopentyl, α-pinenyl, tricyclodecanyl, tetracyclododecyl and androstanyl groups. The carbon atoms in the cycloalkyl group may be partially replaced with a hetero atom, for example, an oxygen atom.

The aryl group having a fluorine atom represented by any one of $Ra_{32}$, $Ra_{33}$ and $Ra_{34}$ is an aryl group in which at least one of the hydrogen atoms is substituted with a fluorine atom. The aryl group is preferably an aryl group having from 6 to 15 carbon atoms, for example, phenyl, tolyl, dimethylphenyl, 2,4,6-trimethylphenyl, naphthyl, anthryl and 9,10-dimethoxyanthryl groups.

The aralkyl group having a fluorine atom represented by any one of $Ra_{32}$, $Ra_{33}$ and $Ra_{34}$ is an aralkyl group in which at least one of the hydrogen atoms is substituted with a fluorine atom. The aralkyl group is preferably an aralkyl group having from 7 to 12 carbon atoms and includes, for example, benzyl, phenethyl and naphthylmethyl groups.

The alkenyl group having a fluorine atom represented by any one of $Ra_{32}$, $Ra_{33}$ and $Ra_{34}$ is an alkenyl group in which at least one of the hydrogen atoms is substituted with a fluorine atom. The alkenyl group is preferably an alkenyl group having from 2 to 8 carbon atoms and includes, for example, vinyl, allyl, butenyl and cyclohexenyl groups.

The alkoxy group having a fluorine atom represented by any one of $Ra_{32}$, $Ra_{33}$ and $Ra_{34}$ is an alkoxy group in which at least one of the hydrogen atoms is substituted with a fluorine atom. The alkyl group in the alkoxy group has the same meaning as the alkyl group described above.

The alkyl group in the hydroxyalkyl group represented by any one of $Ra_{32}$, $Ra_{33}$ and $Ra_{34}$ has the same meaning as the alkyl group described above.

The alkyl group, cycloalkyl group, alkenyl group, aralkyl group, aryl group, alkoxy group and hydroxyalkyl group described above may have a substituent.

Specific examples of the repeating unit represented by formula (XIII) are set forth below, but the invention should not be construed as being limited thereto.

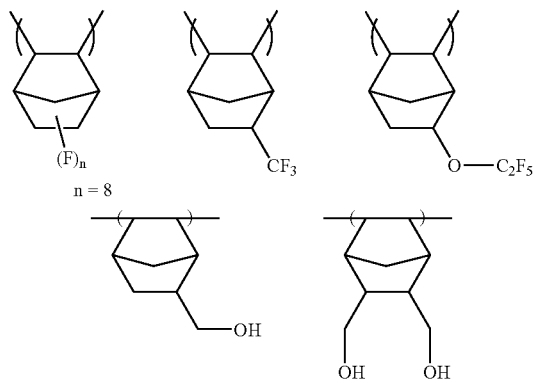

The resin of component (A1) may further include a repeating unit represented by the following formula (XIV):

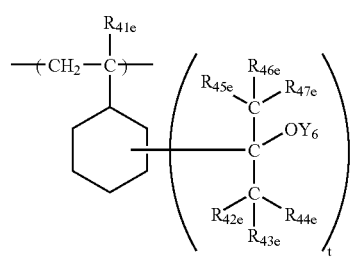

In formula (XIV), $R_{41e}$ represents a hydrogen atom, a halogen atom, a cyano group or an alkyl group.

$R_{42e}$ to $R_{47e}$ each independently represents a hydrogen atom, a fluorine atom or an alkyl group, provided that at least one of $R_{42e}$ to $R_{47e}$ represents a fluorine atom or an alkyl group in which at least one of the hydrogen atoms is substituted with a fluorine atom.

$Y_6$ represents a hydrogen atom or a monovalent organic group.

When each of $Y_6$ and $R_{42e}$ to $R_{47e}$ are present two or more, they may be the same or different.

The halogen atom represented by $R_{41e}$ in formula (XIV) includes a fluorine atom, a chlorine atom, a bromine atom and an iodine atom.

The alkyl group represented by $R_{41e}$ has the same meaning as the alkyl group represented by any one of $R_{1a}$ to $R_{3a}$ in formula (I).

$R_{42e}$ to $R_{47e}$ have the same meanings as $R_{31}$ to $R_{36}$ in formula (A).

$Y_6$ has the same meaning as $Y_1$ in formula (A)

[0205]

Specific examples of the repeating unit represented by formula (XIV) are set forth below, but the invention should not be construed as being limited thereto.

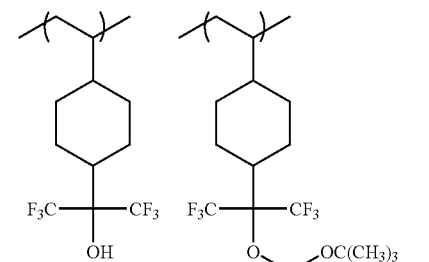

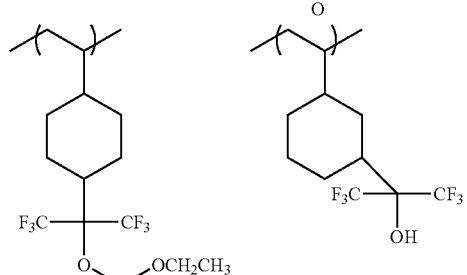

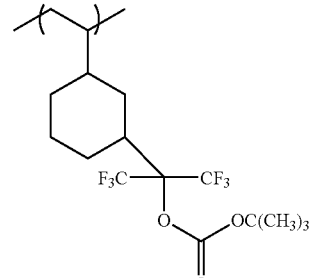

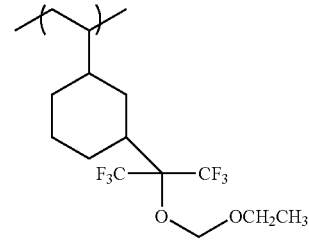

-continued

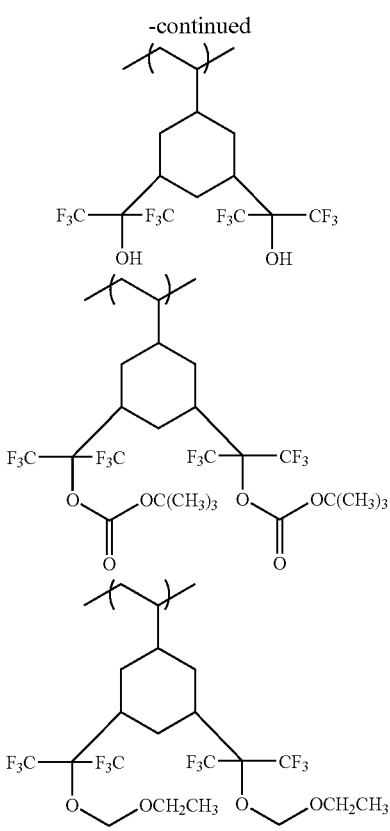

The repeating structural units shown in the specific examples may be used individually or as a mixture of two or more thereof.

The resin of component (A1) may include a repeating unit formed by copolymerization of other copolymerizable monomer in addition to the repeating structural units described above in order to further improve performances of the positive resist composition of the invention.

The copolymerizable monomer, which can be used, includes the following.

There are compounds having one addition polymerizable unsaturated bond including, for example, acrylates, acrylamides, methacrylates, methacrylamides, allyl compounds, vinyl ethers, vinyl esters, styrenes and crotonates other than those described above.

Specifically, for instance, acrylates, for example, an alkyl acrylate (preferably an alkyl acrylate containing an alkyl group having from 1 to 10 carbon atoms), e.g., methyl acrylate, ethyl acrylate, propyl acrylate, tert-butyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, furfuryl acrylate or tetrahydrofurfuryl acrylate, or an aryl acrylate e.g., phenyl acrylate; methacrylates, for example, an alkyl methacrylate (preferably an alkyl methacrylate containing an alkyl group having form 1 to 10 carbon atoms), e.g., methyl methacrylate, ethyl methacrylate, propyl methacrylate, isopropyl methacrylate, tert-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate or tetrahydrofurfuryl methacrylate, or an aryl methacrylate, e.g., phenyl methacrylate, cresyl methacrylate or naphthyl methacrylate; acrylamides, for example, acrylamide, an N-alkylacrylamide (the alkyl group of which is an alkyl group having from 1 to 10 carbon atoms, e.g., methyl, ethyl, propyl, butyl, tert-butyl, heptyl, octyl, cyclohexyl, benzyl or hydroxyethyl group), an N-arylacrylamide (the aryl group of which includes, e.g., phenyl, tolyl, nitrophenyl, naphthyl, cyanophenyl, hydroxyphenyl and carboxyphenyl groups), an N,N-dialkylacrylamide (the alkyl group of which is an alkyl group having form 1 to 10 carbon atoms, e.g., methyl, ethyl, butyl, isobutyl, ethylhexyl or cyclohexyl group), an N,N-diarylacrylamide (the aryl group of which includes, e.g., phenyl group), N-methyl-N-phenylacrylamide, N-hydroxyethyl-N-methylacrylamide or N-2-acetamidoethyl-N-acetylacrylamide; methacrylamides, for example, methacrylamide, an N-alkylmethacrylamide (the alkyl group of which is an alkyl group having from 1 to 10 carbon atoms, e.g., methyl, ethyl, tert-butyl, ethylhexyl, hydroxyethyl or cyclohexyl group), an N-arylmethacrylamide (the aryl group of which includes, e.g., phenyl group), an N,N-dialkylmethacrylamide (the alkyl group of which includes, e.g., ethyl, propyl and butyl groups), an N,N-diarylmethacrylamide (the aryl group of which includes, e.g., phenyl group), N-hydroxyethyl-N-methylmethacrylamide, N-methyl-N-phenylmethacrylamide or N-ethyl-N-phenylmethacrylamide; allyl compounds, for example, an allyl ester (e.g., allyl acetate, allyl caproate, ally caprate, allyl laurate, allyl palmitate, allyl stearate, allyl benzoate, allyl acetoacetate or ally lactate) or allyl oxyethanol; vinyl ethers, for example, an alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether or tetrahydrofurfuryl vinyl ether) or a vinyl aryl ether (e.g., vinyl phenyl ether, vinyl tolyl ether, vinyl chlorophenyl ether, vinyl 2,4-dichlorophenyl ether, vinyl naphthyl ether or vinyl anthranyl ether); vinyl esters, for example, vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl β-phenylbutyrate, vinyl cyclohexylcarboxylate, vinyl benzoate, vinyl salicylate, vinyl chlorobenzoate, vinyl tetrachlorobenzoate or vinyl naphthoate; styrenes, for example, styrene, an alkylstyrene (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene or acetoxymethylstyrene), an alkoxystyrene (e.g., methoxystyrene, 4-methoxy-3-methylstyrene or dimethoxystyrene), a halogenated styrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene or 4-fluoro-3-trifluoromethylstyrene), carboxystyrene or vinyl naphthalene; crotonates, for example, an alkyl crotonate (e.g., butyl crotonate, hexyl crotonate or glycerin monocrotonate); dialkyl itaconates, for example, dimethyl itaconate, diethyl itaconate or dibutyl itaconate; dialkyl maleates or fumarates, e.g., dimethyl maleate or dibutyl fumarate; maleic anhydride, maleimide, acrylonitrile, methacrylonitrile and maleonitrile. In addition, any addition polymerizable unsaturated compound copolymerizable with monomers corresponding to the repeating units described above may be ordinarily employed.

The content of the repeating unit represented by formula (I) (including formulae (Ia) and (Ib)) is ordinarily from 3 to 95% by mole, preferably from 5 to 80% by mole, and more preferably from 7 to 70% by mole, based on the whole binder resin.

The content of the repeating unit represented by formulae (II) to (XII) is ordinarily from 1 to 80% by mole, preferably from 3 to 65% by mole, and more preferably from 5 to 50% by mole, based on the whole binder resin.

The total content of the repeating unit represented by formulae (XIII) to (XIV) is ordinarily from 1 to 80% by mole, preferably from 3 to 65% by mole, and more preferably from 5 to 50% by mole, based on the whole binder resin.

The content of the repeating unit having an acid-decomposable group is ordinarily from 5 to 95% by mole, preferably from 7 to 80% by mole, and more preferably from 10 to 70% by mole, based on the whole binder resin.

Now, the resin of component (A2) will be described below.

The divalent connecting group represented by L in formula (X) includes, for example, an oxy group, an oxyalkylene group, an ester group, an amido group and a thio group.

The alkylene group in the oxyalkylene group includes an alkylene group having from 1 to 8 carbon atosa, for example, methylene ethylene, propylene, butylene, hexylene or octylene group.

It is preferred that L is a single bond, an oxy group, an oxyalkylene group or an ester group.

The monovalent organic group represented by RX includes, for example, an alkyl group that is not decomposed by the action of an acid, a cycloalkyl group that is not decomposed by the action of an acid and a group capable of being decomposed by the action of an acid.

The alkyl group that is not decomposed by the action of an acid for RX or the alkyl group represented by Z is preferably an alkyl group having from 1 to 20 carbon atoms, for example, methyl, ethyl, propyl, n-butyl, sec-butyl, hexyl, 2-ethylhexyl or octyl group.

The cycloalkyl group that is not decomposed by the action of an acid for RX or the cycloalkyl group represented by Z may be monocyclic or polycyclic. The monocyclic cycloalkyl group is preferably a cycloalkyl group having from 3 to 20 carbon atoms, for example, cyclopropyl, cyclopentyl, cyclohexyl, cycloheptyl and cyclooctyl groups. The polycyclic cycloalkyl group is preferably a cycloalkyl group having from 6 to 20 carbon atoms, for example, adamantyl, norbornyl, isobornyl, camphanyl, dicyclopentyl, α-pinenyl, tricyclodecanyl, tetracyclododecyl and androstanyl groups. The carbon atoms in the cycloalkyl group may be partially replaced with a hetero atom, for example, an oxygen atom.

The alkyl group that is not decomposed by the action of an acid for RX, the alkyl group represented by Z, the cycloalkyl group that is not decomposed by the action of an acid for RX and the cycloalkyl group represented by Z may have a substituent. Examples of the substituent for the alkyl group that is not decomposed by the action of an acid for RX, the alkyl group represented by Z, the cycloalkyl group that is not decomposed by the action of an acid for RX and the cycloalkyl group represented by Z include a hydroxy group, a halogen atom, a cyano group, an alkyl group and a group represented by formula (Y) described below.

The group (hereinafter also referred to as an "acid-decomposable group") capable of being decomposed by the action of an acid for RX includes, for example, for example, —C($R_{36}$)($R_{37}$)($R_{38}$), —C($R_{36}$)($R_{37}$)(O$R_{39}$), —COO—C($R_{36}$)($R_{37}$)($R_{38}$), —C($R_{01}$)($R_{02}$)(O$R_{39}$), —C($R_{01}$)($R_{02}$)COO—C($R_{36}$)($R_{37}$)($R_{38}$).

$R_{36}$ to $R_{39}$ each individually represents an alkyl group, a cycloalkyl group, an alkenyl group, an aralkyl group or an aryl group. Alternatively, $R_{36}$ and $R_{39}$ may be connected with each other to form a ring.

$R_{01}$ and $R_{02}$ each independently represents a hydrogen atom, an alkyl group, a cycloalkyl group, an alkenyl group, an aralkyl group or an aryl group.

The alkyl group represented by any one of $R_{36}$ and $R_{39}$, $R_{01}$ and $R_{02}$ is preferably an alkyl group having from 1 to 8 carbon atoms, for example, methyl, ethyl, propyl, n-butyl, sec-butyl, hexyl, 2-ethylhexyl and octyl groups.

The cycloalkyl group represented by any one of $R_{36}$ and $R_{39}$, $R_{01}$ and $R_{02}$ may be monocyclic or polycyclic. The monocyclic cycloalkyl group is preferably a cycloalkyl group having from 3 to 8 carbon atoms, for example, cyclopropyl, cyclopentyl, cyclohexyl, cycloheptyl and cyclooctyl groups. The polycyclic cycloalkyl group is preferably a cycloalkyl group having from 6 to 20 carbon atoms, for example, adamantyl, norbornyl, isobornyl, camphanyl, dicyclopentyl, α-pinenyl, tricyclodecanyl, tetracyclododecyl and androstanyl groups. The carbon atoms in the cycloalkyl group may be partially replaced with a hetero atom, for example, an oxygen atom.

The aryl group represented by any one of $R_{36}$ and $R_{39}$, $R_{01}$ and $R_{02}$ is preferably an aryl group having from 6 to 10 carbon atoms, for example, phenyl, tolyl, dimethylphenyl, 2,4,6-trimethylphenyl, naphthyl, anthryl and 9,10-dimethoxyanthryl groups.

The aralkyl group represented by any one of $R_{36}$ and $R_{39}$, $R_{01}$ and $R_{02}$ is preferably an aralkyl group having from 7 to 12 carbon atoms and includes, for example, benzyl, phenethyl and naphthylmethyl groups.

The alkenyl group represented by any one of $R_{36}$ and $R_{39}$, $R_{01}$ and $R_{02}$ is preferably an alkenyl group having from 2 to 8 carbon atoms and includes, for example, vinyl, allyl, butenyl and cyclohexenyl groups.

The groups represented by any one of $R_{36}$ and $R_{39}$, $R_{01}$ and $R_{02}$ may have a substituent. Examples of the substituent for the groups represented by any one of $R_{36}$ and $R_{39}$, $R_{01}$ and $R_{02}$ includes an alkyl group, a cycloalkyl group, an aryl group, an amino group, an amido group, a ureido group, a urethane group, a hydroxy group, a carboxy group, a halogen atom, an alkoxy group, a thioether group, an acyl group, an acyloxy group, an alkoxycarbonyl group, a cyano group and a nitro group.

It is preferred that the acid-decomposable group has a cyclic hydrocarbon structure, for example, an cycloalkyl group or an aryl group.

The protective group in the hydroxy group protected with a protective group capable of being decomposed by the action of an acid has the same meaning as the acid-decomposable group described above.

RX is preferably a hydrogen atom, an alkyl group (preferably having from 1 to 6 carbon atoms) that is not decomposed by the action of an acid, a cycloalkyl group (preferably having from 3 to 6 carbon atoms) that is not decomposed by the action of an acid or a group capable of being decomposed by the action of an acid, and more preferably a group capable of being decomposed by the action of an acid Specific examples of the repeating unit represented by formula (X) are set forth below, but the invention should not be construed as being limited thereto.
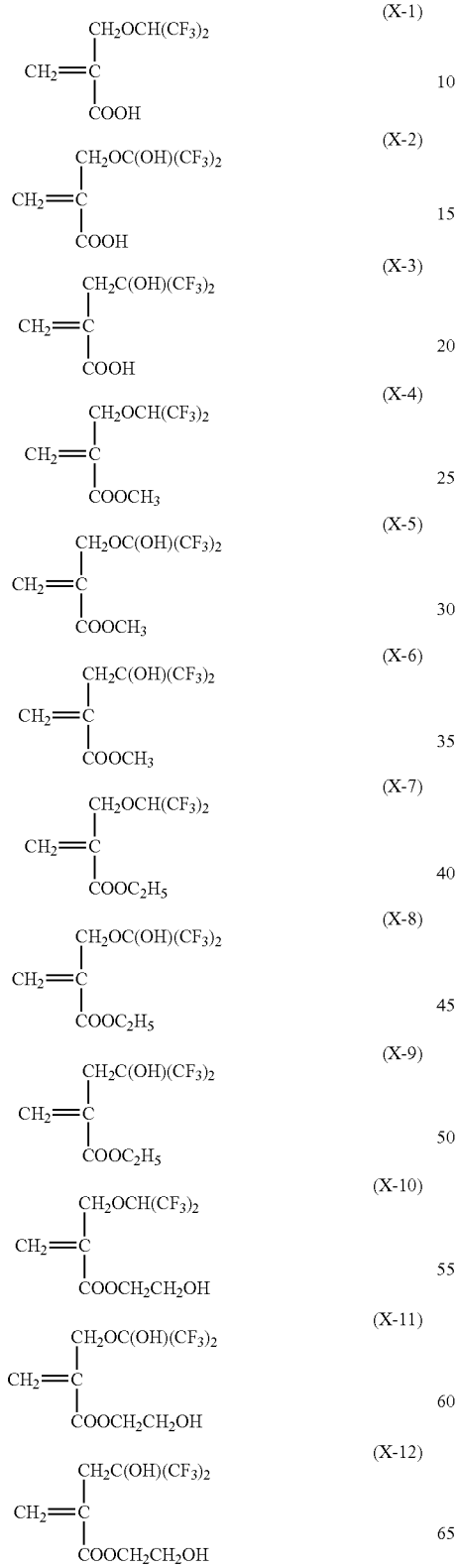
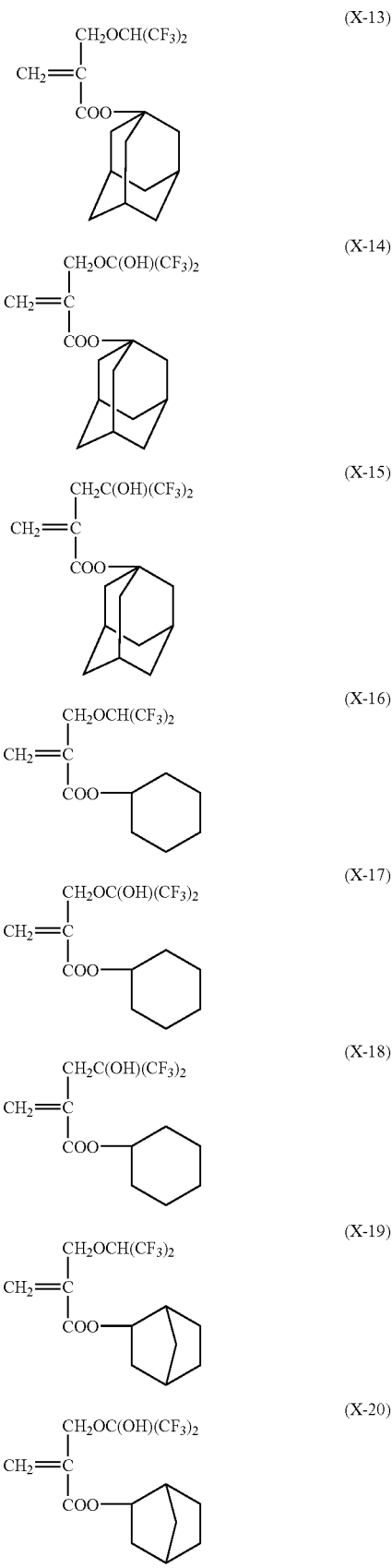

-continued
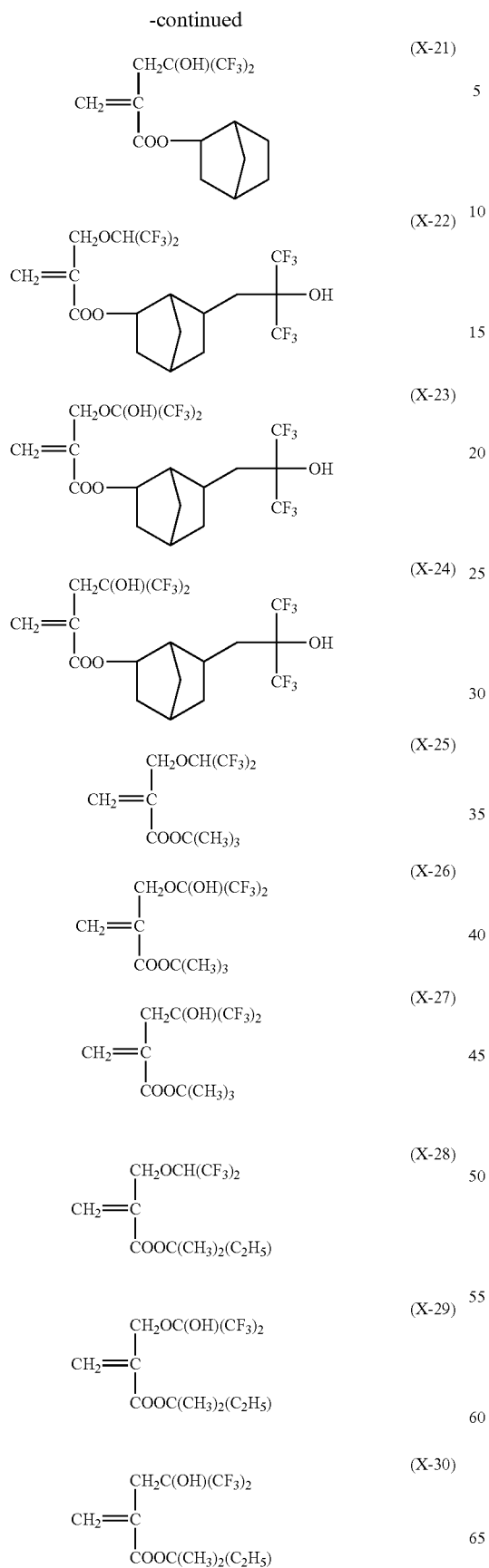
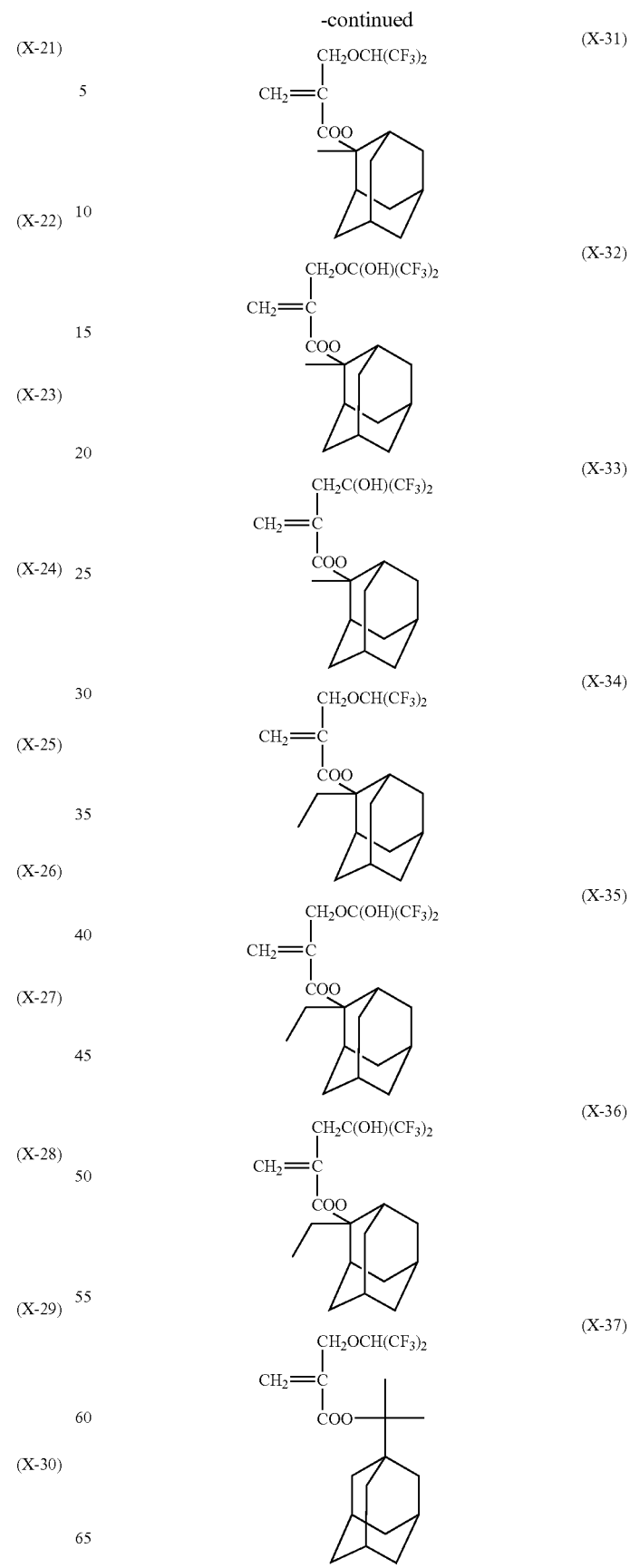

-continued (X-38) ... (X-44): [chemical structures of fluorinated adamantyl/norbornyl (meth)acrylate monomers]

(X-45) ... (X-50): [chemical structures of polymer repeating units bearing fluorinated cyclohexyl/adamantyl ester side chains]

In case of using the positive resist composition of the invention as a resist composition for $F_2$ excimer laser beam, it is preferred that the resin of component (A2) (hereinafter also referred to as an "acid-decomposable resin (AF)") for use in the resist composition for $F_2$ excimer laser beam further includes a repeating unit containing a cyclic hydrocarbon structure having a group selected from a hydroxy group, a hydroxyalkyl group and a group represented by formula (Y) shown below, in addition to the repeating unit represented by formula (X).

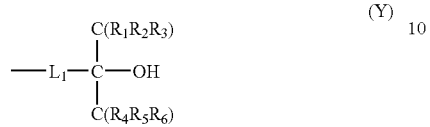

In formula (Y), $L_1$ represents a single bond or a methylene group, $R_1$ to $R_6$ each independently represents a fluorine atom or a hydrogen atom, provided that at least one of $R_1$ to $R_6$ represents a fluorine atom, or at least one of $R_1$ to $R_6$ may form a carbon chain connected to a main chain of polymer to from a ring, or $R_4$ may be connected to the carbon atom substituted with the hydroxy group to from a ring.

The hydroxyalkyl group is preferably a hydroxyalkyl group having from 1 to 3 carbon atoms, for example, hydroxymethyl or hydroxyethyl group.

The cyclic hydrocarbon structure includes, for example, an alicyclic hydrocarbon structure and an aromatic hydrocarbon structure.

The alicyclic hydrocarbon structure may be monocyclic or polycyclic. Specifically, the alicyclic hydrocarbon structure includes alicyclic hydrocarbon structures having not less than 5 carbon atoms, for example, a monocyclo, bicyclo, tricyclo or tetracyclo structure. The number of carbon atoms included therein is preferably from 6 to 30, and particularly preferably from 7 to 25.

Preferred examples of the alicyclic hydrocarbon structure include adamantane, noradamantane, decalin, tricyclodecane, tetracyclododecane, norbornane, cyclohexane, cycloheptane, cyclooctane, cyclodecane and cyclododecane structures. Of these structures, adamantane, norbornane and cyclohexane structures are more preferred.

The aromatic hydrocarbon structure preferably includes a benzene ring.

The alicyclic hydrocarbon structure and aromatic hydrocarbon structure may further have a substituent, for example, an alkyl group, an alkoxy group or a halogen atom (e.g., fluorine or chlorine atom).

At least one of $R_1$ to $R_6$ may form a carbon chain connected to a main chain of polymer to from a ring. The carbon chain includes an alkylene group having from 1 to 5 carbon atoms, for example, methylene or ethylene group.

The repeating unit containing a cyclic hydrocarbon structure having a group selected from a hydroxy group, a hydroxyalkyl group and a group represented by formula (Y) includes, for example, repeating units represented by formula (X) described above and repeating units represented by formulae (AI), (AII), (AIII), (AVI) and (AVII) described below.

It is preferred that the acid-decomposable resin (AF) further includes at least one repeating unit selected from repeating units represented by the following formulae (AI) to (AVIII):

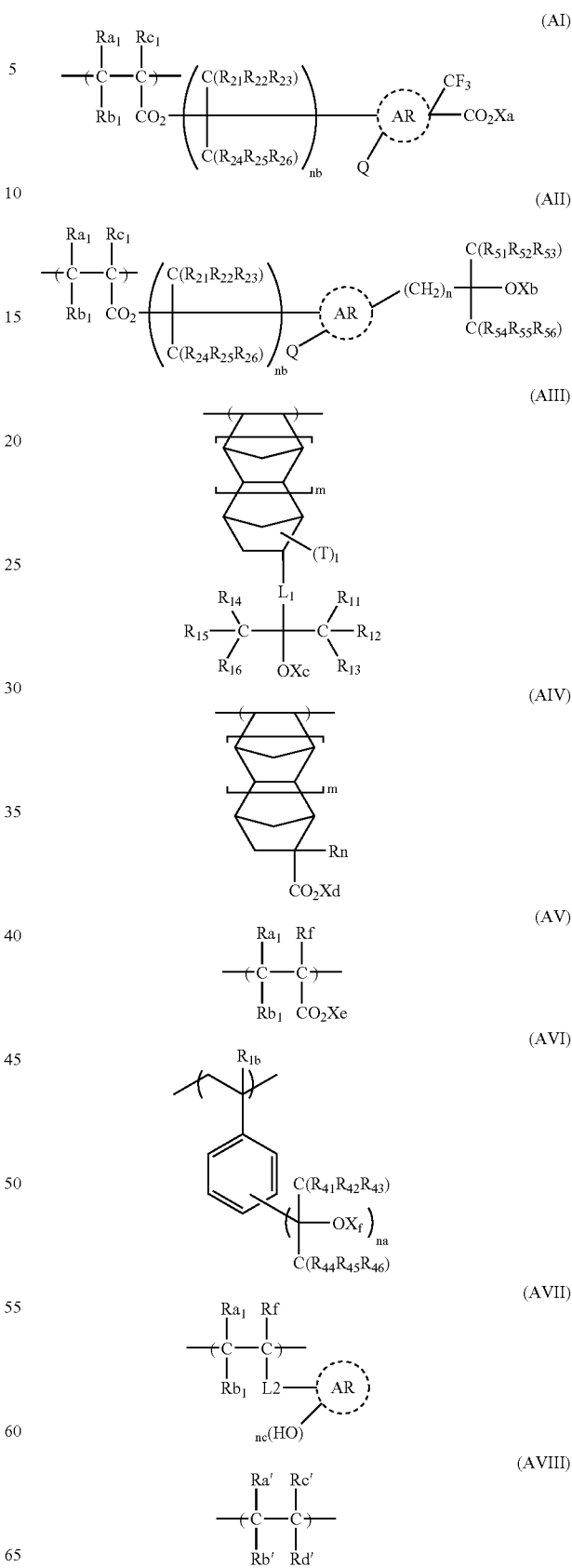

In formulae (AI) to (AIII), $R_{a1}$, $R_{b1}$ and $R_{c1}$ each independently represents a hydrogen atom, a fluorine atom, a methyl group or a fluoroalkyl group, $R_{21}$ to $R_{26}$ each independently represents a hydrogen atom, a fluorine atom or a fluoroalkyl group, provided that at least one of $R_{21}$ to $R_{26}$ is not a hydrogen atom, AR represents an alicyclic hydrocarbon structure, Q represents a hydrogen atom or a hydroxy group, Xa represents a hydrogen atom or a group capable of being decomposed by the action of an acid, $R_{51}$ to $R_{56}$ each independently represents a hydrogen atom, a fluorine atom or a fluoroalkyl group, provided that at least one of $R_{51}$ to $R_{56}$ is not a hydrogen atom, Xb represents a hydrogen atom or a group capable of being decomposed by the action of an acid, T represents a hydrogen atom, a fluorine atom or a trifluoromethyl group, which may be the same of different, when two or more T's are present, $L_1$ represents a single bond or a divalent connecting group, $R_{11}$ to $R_{16}$ each independently represents a hydrogen atom, a fluorine atom or a fluoroalkyl group, provided that at least one of $R_{11}$ to $R_{16}$ is not a hydrogen atom, Xc represents a hydrogen atom or a group capable of being decomposed by the action of an acid, Rn represents a fluorine atom or a trifluoromethyl group, Xd represents a hydrogen atom or a group capable of being decomposed by the action of an acid, Rf represents a hydrogen atom, a fluorine atom, a methyl group or a trifluoromethyl group, Xe represents a hydrogen atom or a group capable of being decomposed by the action of an acid, $R_{1b}$ represents a hydrogen atom, a fluorine atom, a chlorine atom, a bromine atom, a cyano group or a trifluoromethyl group, $R_{41}$ to $R_{46}$ each independently represents a hydrogen atom, a fluorine atom or a fluoroalkyl group, provided that at least one of $R_{41}$ to $R_{46}$ is not a hydrogen atom, Xf represents a hydrogen atom or a group capable of being decomposed by the action of an acid, L2 represents —C(=O)—O— or —O—, $R_a'$, $R_b'$, $R_c'$ and $R_d'$ each independently represents a hydrogen atom, a fluorine atom, a fluoroalkyl group or a group represented by formula (Y), provided that at least one of $R_a'$ to $R_d'$ is not a hydrogen atom, nb represents 0 or 1, n represents 0 or 1, m represents 0 or 1, l represents in integer of from 0 or 5, na represents in integer of from 1 or 5, and nc represents an integer of from 1 or 5.

The fluoroalkyl group represented by any one of $R_{a1}$ to $R_{c1}$, $R_{11}$ to $R_{16}$, $R_{21}$ to $R_{26}$, $R_{51}$ to $R_{56}$, $R_{41}$ to $R_{46}$ and $R_a'$ to $R_d'$ in formulae (AI) to (AVIII) means an alkyl group in which at least one of the hydrogen atoms is fluorinated. The fluoroalkyl group has preferably from 1 to 6 carbon atoms, and more preferably from 1 to 3 carbon atoms. Specific examples of the fluoroalkyl group include trifluoromethyl, difluoromethyl, fluoromethyl, pentafluoroethyl, 2,2,2-trifluoroethyl, 2-fluoroethyl, 3,3,3-trifluoropropyl and 3-fluoropropyl groups.

The fluoroalkyl group represented by any one of $R_{a1}$ to $R_{c1}$, $R_{11}$ to $R_{16}$, $R_{21}$ to $R_{26}$, $R_{51}$ to $R_{56}$, $R_{41}$ to $R_{46}$ and $R_a'$ to $R_d'$ may have a substituent. Examples of the substituent include a chlorine atom, a bromine atom and an iodine atom.

The alicyclic hydrocarbon structure represented by AR may be monocyclic or polycyclic. Specifically, the alicyclic hydrocarbon structure includes an alicyclic hydrocarbon structure having not less than 5 carbon atoms, for example, a monocyclo, bicyclo, tricyclo or tetracyclo structure. The number of carbon atoms included therein is preferably from 6 to 30, and particularly preferably from 7 to 25.

Preferred examples of the alicyclic hydrocarbon structure represented by AR include adamantane, noradamantane, decalin, tricyclodecane, tetracyclododecane, norbornane, cyclohexane, cycloheptane, cyclooctane, cyclodecane and cyclododecane structures. Of these structures, adamantane, norbornane and cyclohexane structures are more preferred.

The alicyclic hydrocarbon structure represented by AR may further have a substituent, for example, an alkyl group, an alkoxy group or a halogen atom (for example, fluorine or chlorine atom).

The group capable of being decomposed by the action of an acid represented by any one of Xa, Xb, Xc, Xd, Xe and Xf has the same meaning as the group capable of being decomposed by the action of an acid for RX in formula (X).

The divalent connecting group represented by $L_1$ includes, for example, an alkylene group, a cycloalkylene group, an alkenylene group, an arylene group, —O—$R_{22a}$—, —O—CO—$R_{22b}$—, —CO—O—$R_{22c}$— and —CO—N($R_{22d}$)—$R_{22e}$—. $R_{22a}$, $R_{22b}$, $R_{22c}$ and $R_{22e}$ each represents a single bond or a divalent alkylene group, cycloalkylene group, alkenylene group or arylene group, which may contain an ether group, an ester group, an amido group, a urethane group or a ureido group. $R_{22d}$ represents a hydrogen atom, an alkyl group, a cycloalkyl group, an aralkyl group or an aryl group.

The alkylene group includes an alkylene group having from 1 to 8 carbon atoms, for example, methylene, ethylene, propylene, butylene, hexylene or octylene group.

The cycloalkylene group is preferably a cycloalkyl group having from 5 to 12 carbon atoms, and includes a monocyclic residue, for example, cyclopentylene or cyclohexylene group, and a polycyclic residue, for example, norbornane or adamantane skeleton.

The alkenylene group includes an alkylene group having from 2 to 6 carbon atoms, for example, ethenylene, propenylene or butenylen group.

The arylene group includes an arylene group having from 6 to 15 carbon atoms, for example, phenylene, tolylene or naphthylene group.

The substituent, which the divalent connecting group represented by $L_1$ may have, includes, for example, a halogen atom, e.g., fluorine or chlorine atom, and a cyano group, and preferably a fluorine atom.

$L_1$ preferably represents a single bong, a methylene group or an —O— group.

Specific examples of the repeating unit represented by any one of formulae (AI) to (AIV) are set forth below, but the invention should not be construed as being limited thereto.

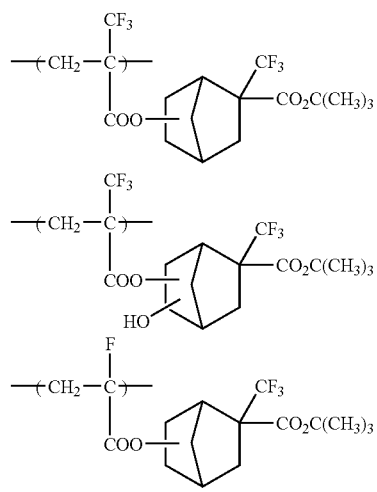

-continued
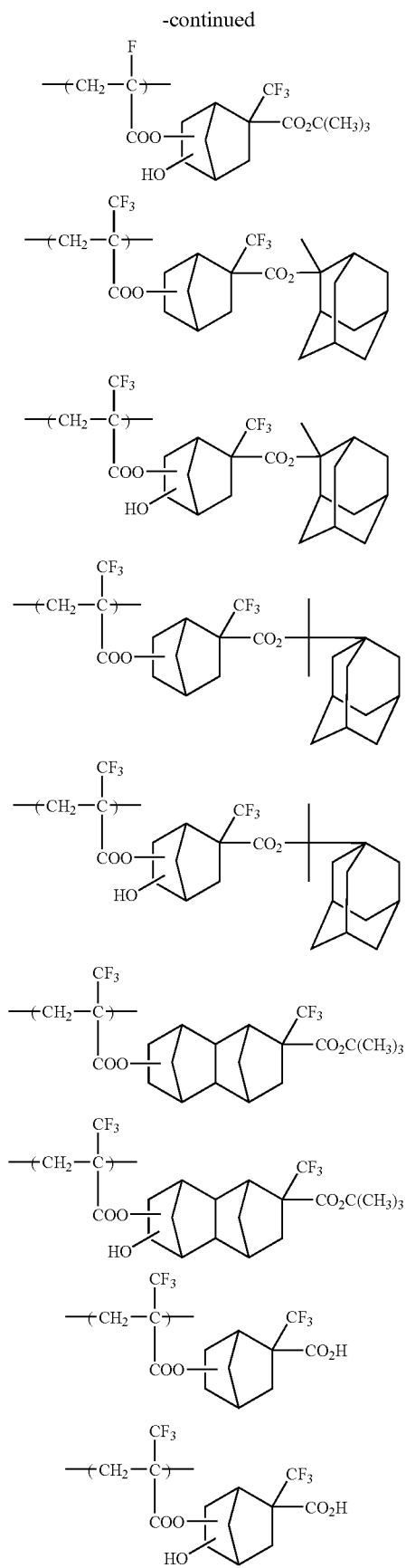
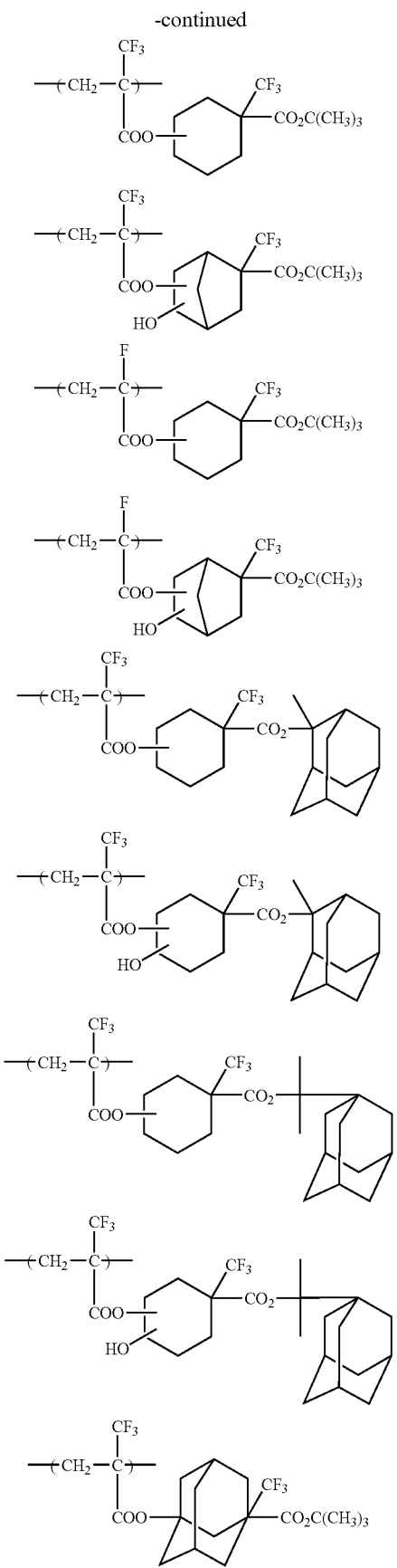

-continued
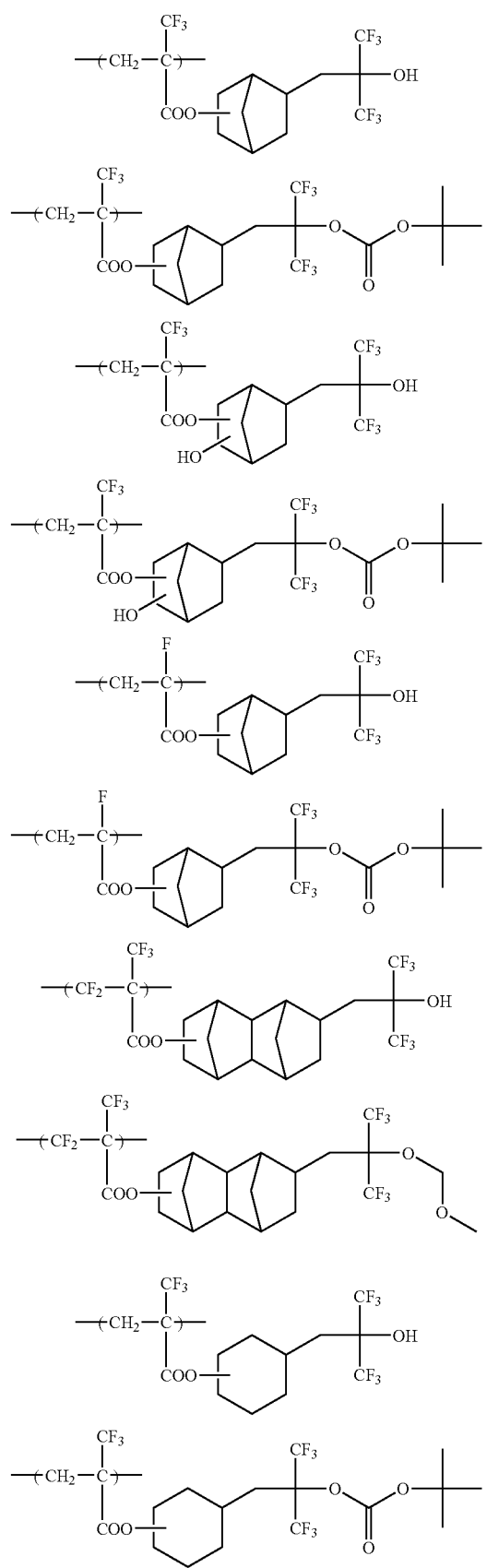
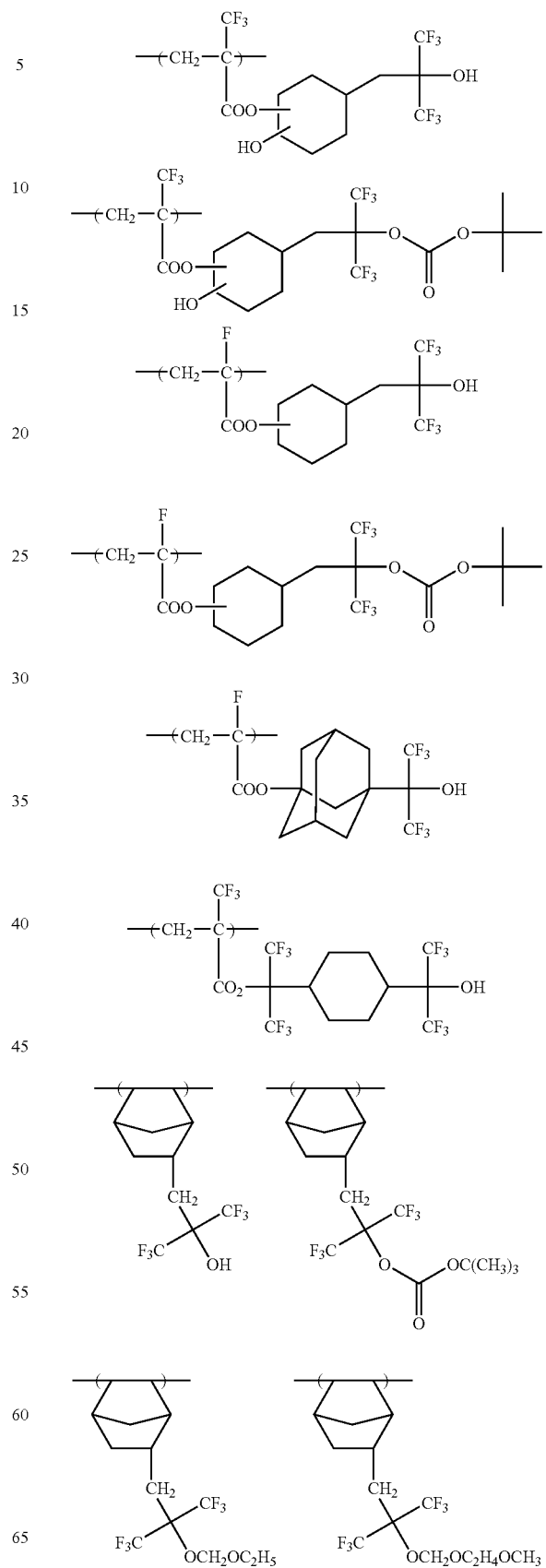

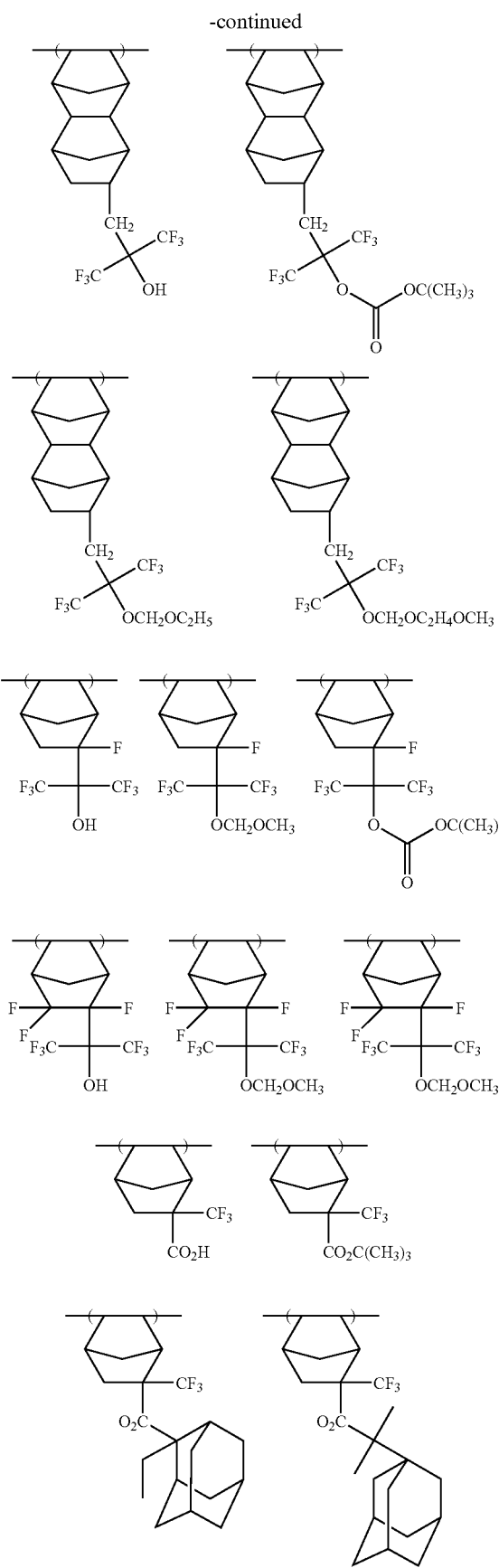
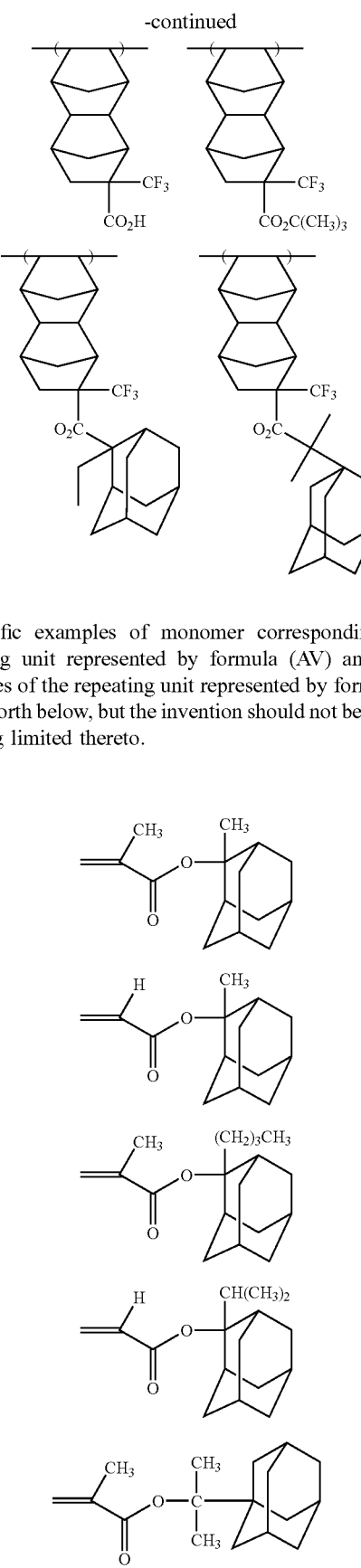
Specific examples of monomer corresponding to the repeating unit represented by formula (AV) and specific examples of the repeating unit represented by formula (AV) are set forth below, but the invention should not be construed as being limited thereto.
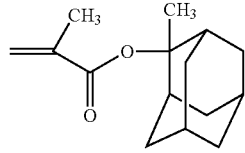
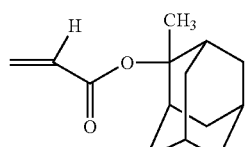
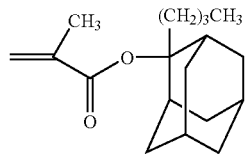
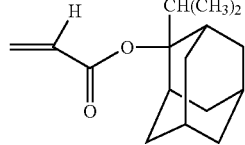
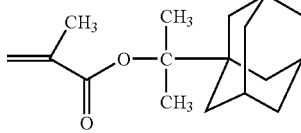

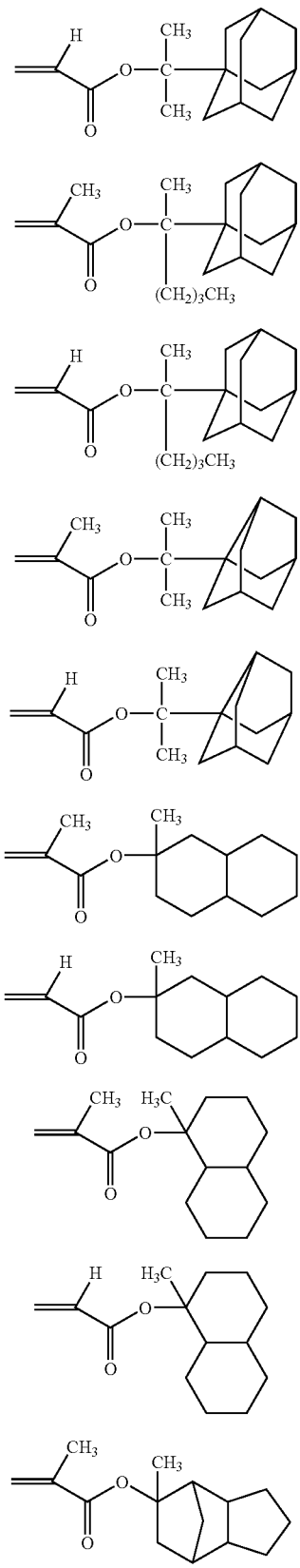
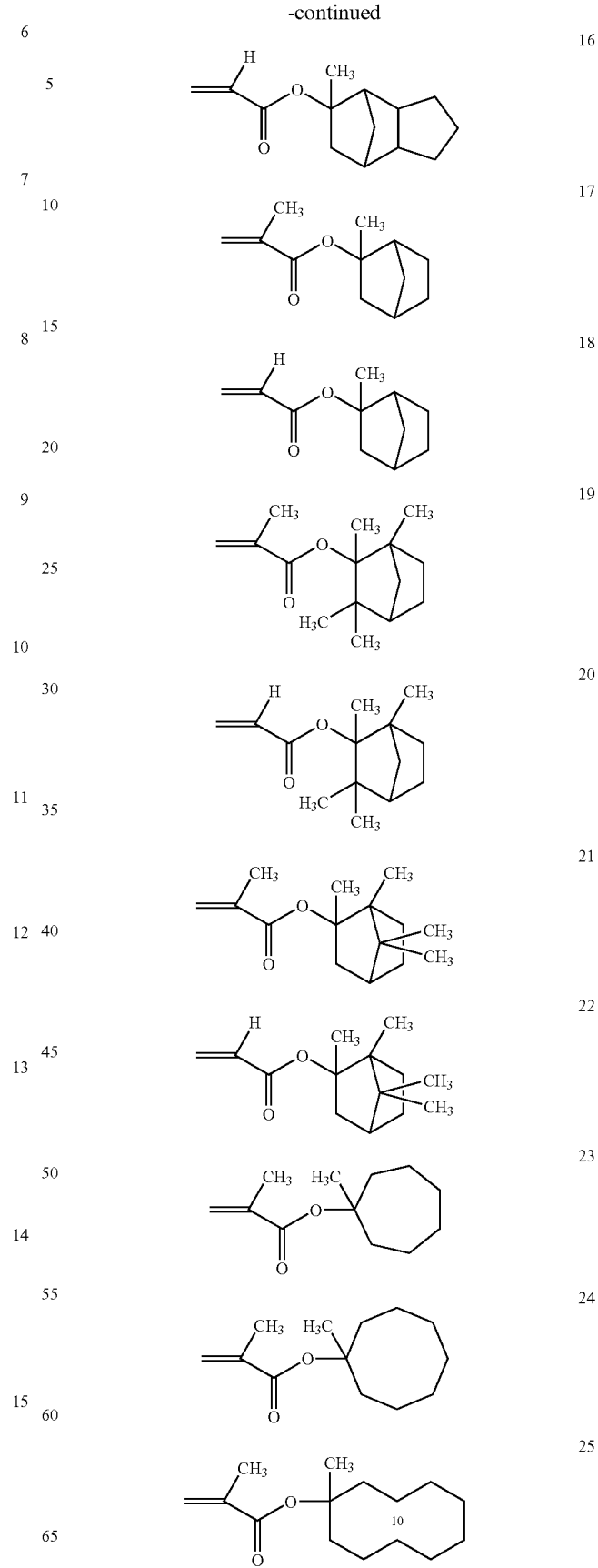

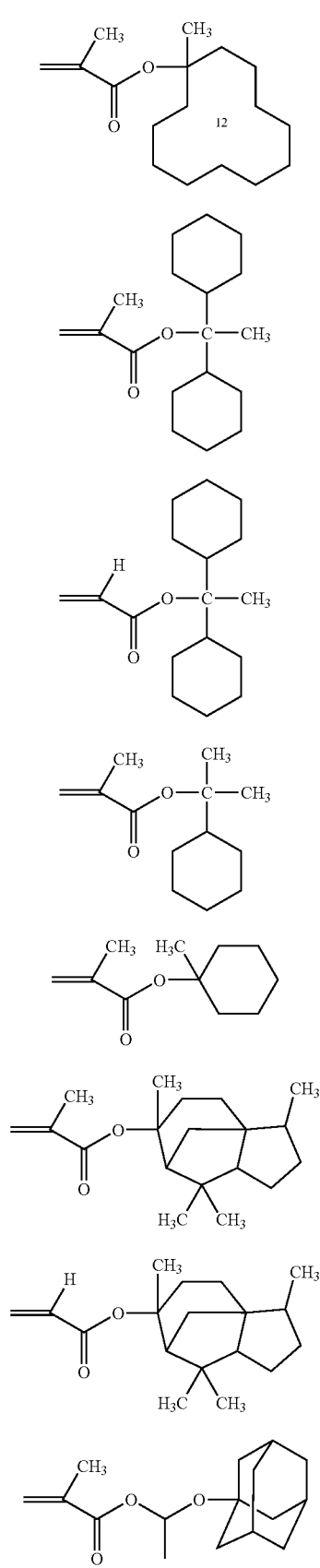
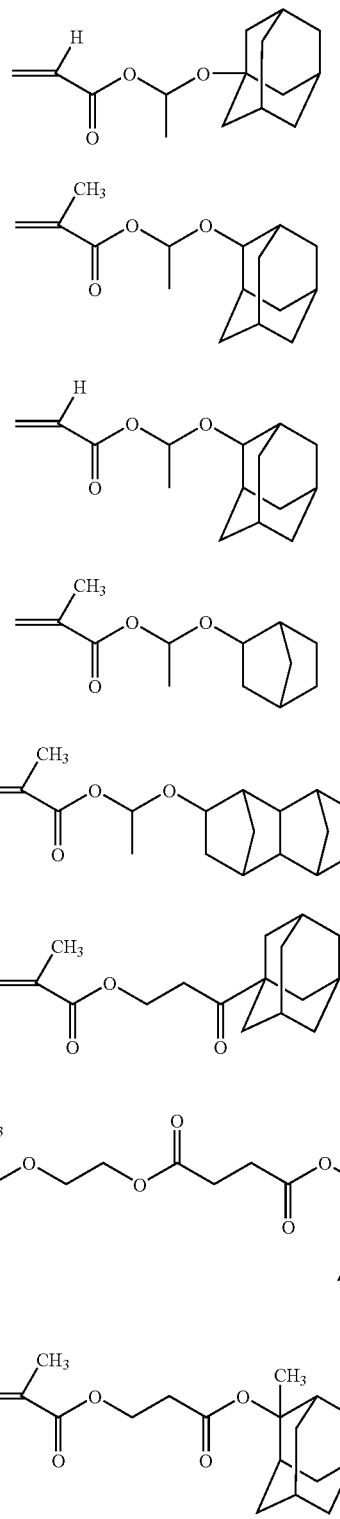
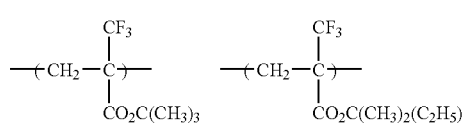

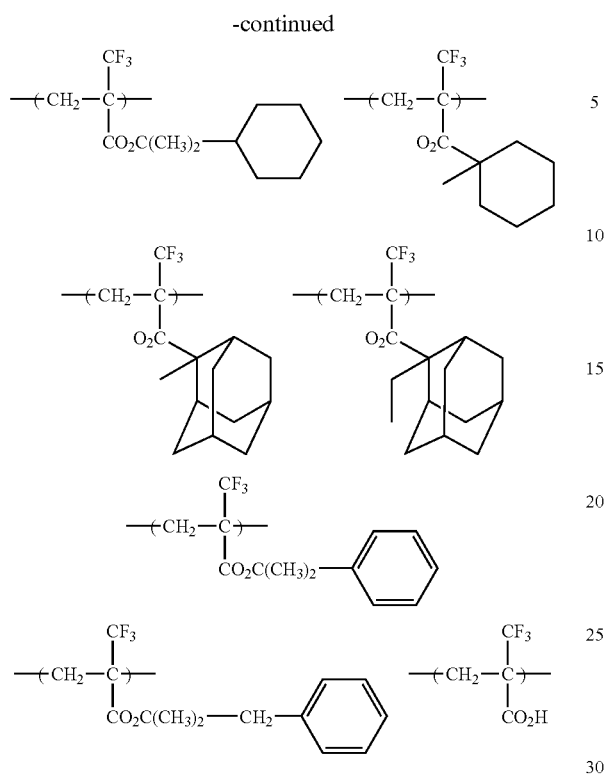
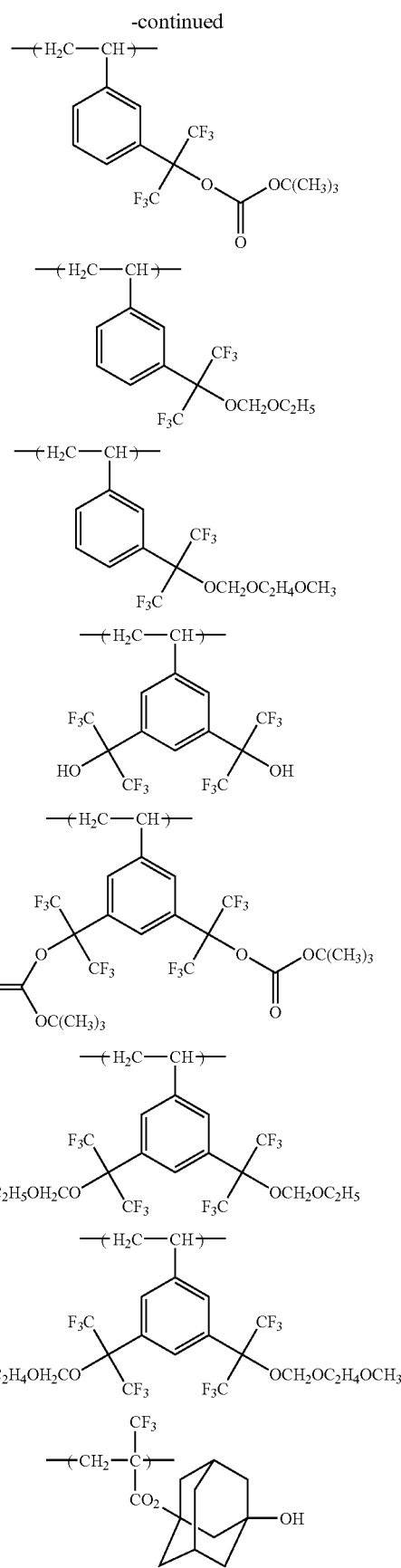
Specific examples of the repeating unit represented by any one of formulae (AVI) to (AVIII) are set forth below, but the invention should not be construed as being limited thereto.
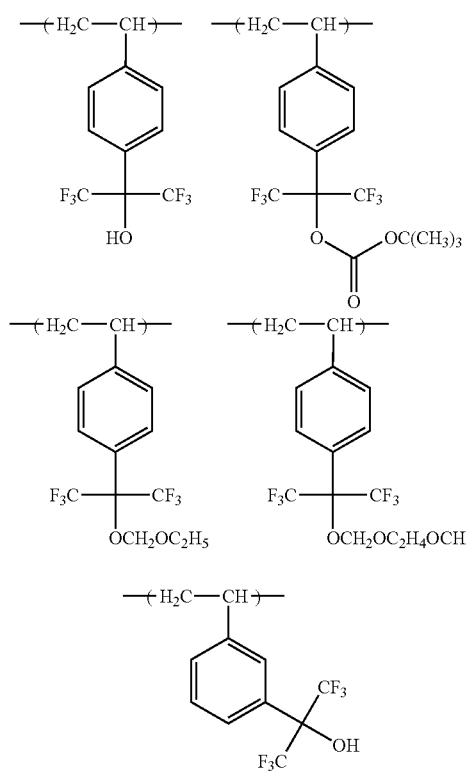

-continued

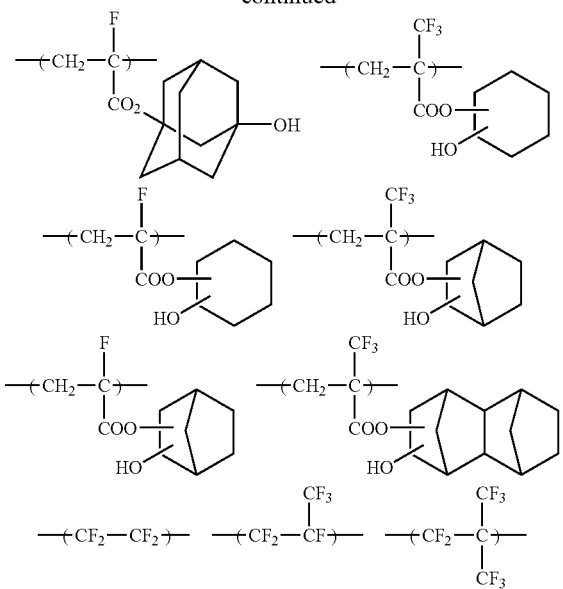

The acid-decomposable resin (AF) may further include a repeating unit formed from other polymerizable monomer in addition to the repeating units described above.

Examples of the copolymerizable monomer include acrylates, acrylamides, methacrylates, methacrylamides, allyl compounds, vinyl ethers, vinyl esters, styrenes, crotonates, dialkyl maleates, dialkyl fumarates, maleic anhydride, maleimides, acrylonitrile, methacrylonitrile, maleonitrile and $C(R_{1a})(R_{2a})=C(R_{3a})(R_{4a})$ (wherein $R_{1a}$ to $R_{4a}$, which may be the same or different, each represents a hydrogen atom, a halogen atom or an alkyl group (preferably having from 1 to 10 carbon atoms), which may be substituted with a halogen atom). Acrylonitrile, methacrylonitrile, maleic anhydride, maleimide, N-hydroxymaleimide, N-(tert-butoxycarbonyloxy)maleimide and $C(R_{1a})(R_{2a})=C(R_{3a})(R_{4a})$ are particularly preferred. In addition, any addition polymerizable unsaturated compound copolymerizable with monomers corresponding to the repeating units described above may be ordinarily employed.

In the acid-decomposable resin (AF), the content of the repeating unit represented by formula (X) is preferably from 10 to 60% by mole, and more preferably from 20 to 50% by mole.

In the acid-decomposable resin (AF), the content of the repeating unit containing a cyclic hydrocarbon structure having a group selected from a hydroxy group, a hydroxyalkyl group and the group represented by formula (Y) is preferably from 10 to 90% by mole, and more preferably from 20 to 70% by mole.

In the acid-decomposable resin (AF), the content of the repeating units represented by formulae (AI) to (AVIII) is preferably from 10 to 90% by mole, and more preferably from 20 to 70% by mole.

The acid-decomposable resin (AF) increases solubility in an alkali developing solution by the action of an acid since the group capable of being decomposed by the action of an acid is decomposed by the action of an acid to from a hydrophilic group, for example, a hydroxy group or a carboxy group.

In the acid-decomposable resin (AF), the content of the repeating unit having an acid-decomposable group is preferably from 5 to 80% by mole, and more preferably from 10 to 70% by mole.

Specific examples of the acid-decomposable resin (AF) are set forth below, but the invention should not be construed as being limited thereto.

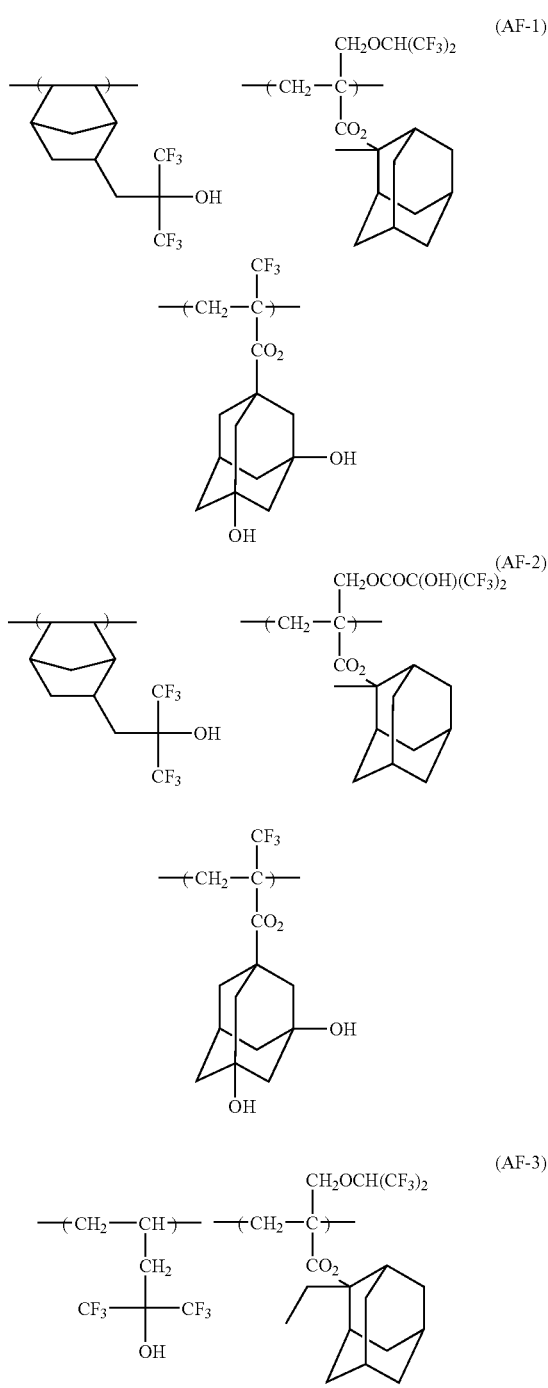

-continued
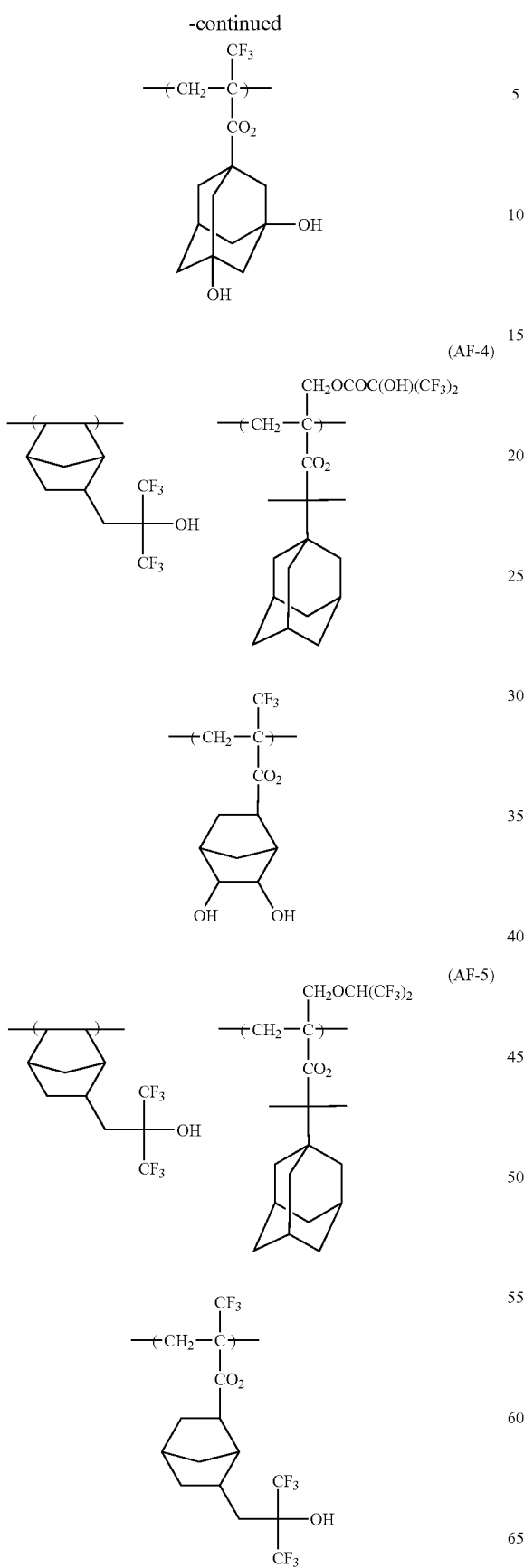
(AF-4)
(AF-5)
-continued
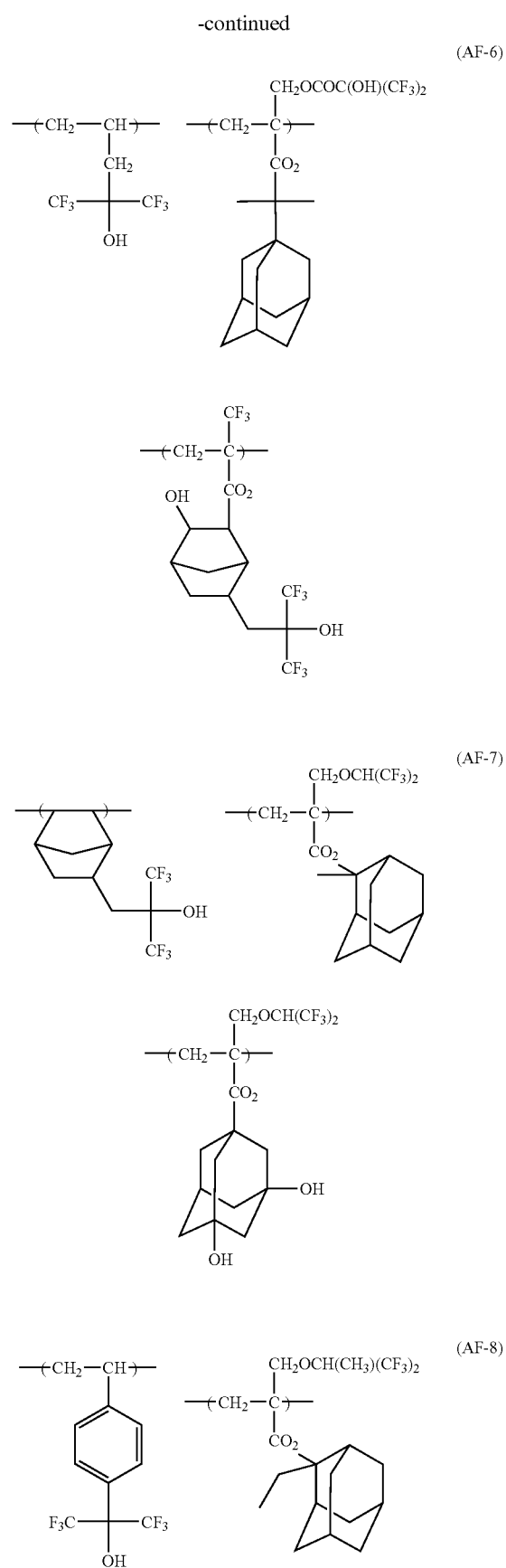
(AF-6)
(AF-7)
(AF-8)

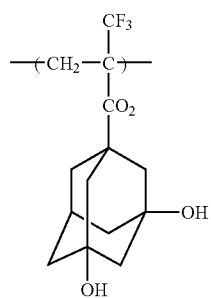
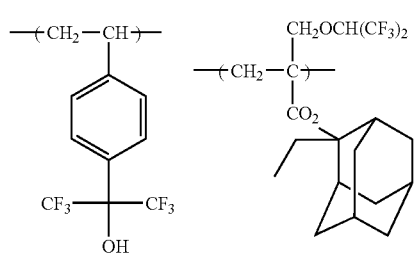
(AF-9)
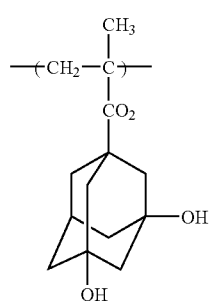
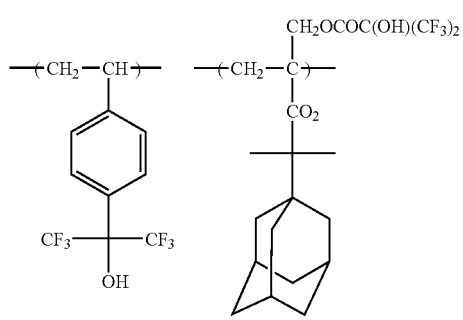
(AF-10)
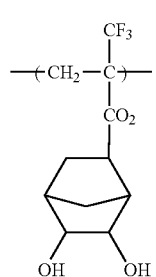
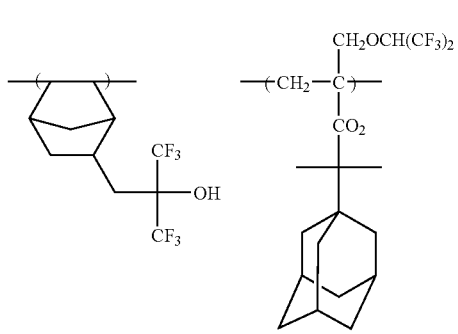
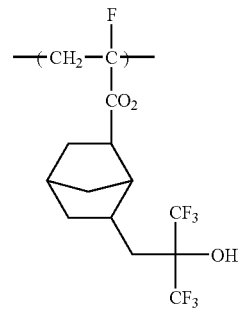
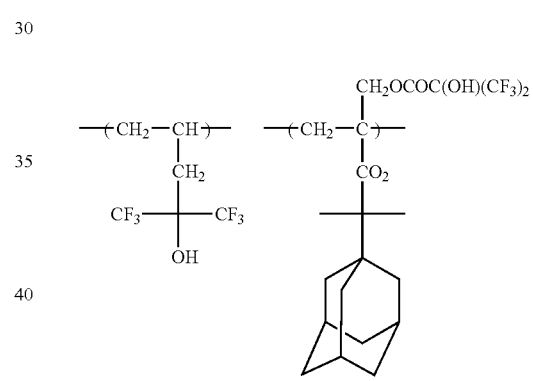
(AF-11)
(AF-12)
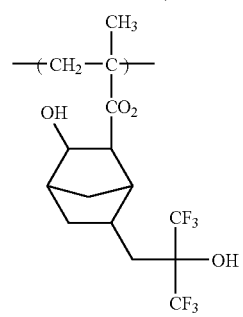
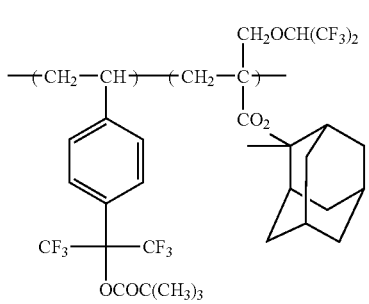
(AF-13)

-continued
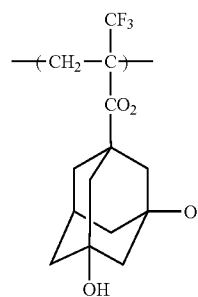
(AF-14)
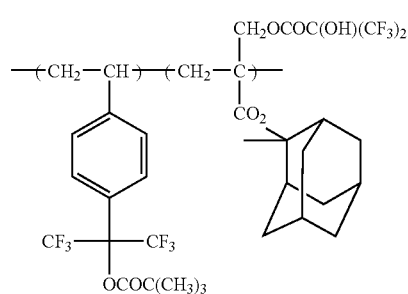
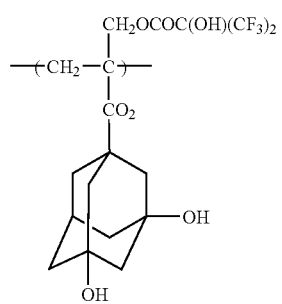
(AF-15)
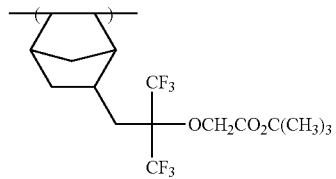
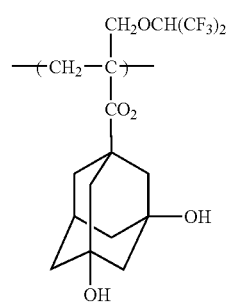
-continued
(AF-16)
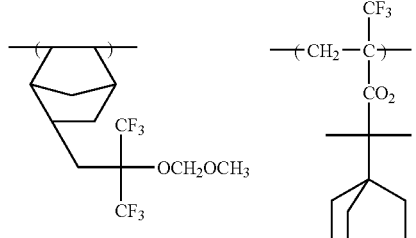
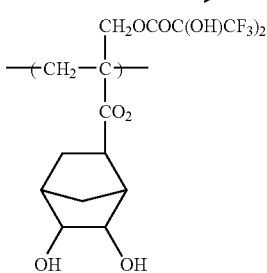
(AF-17)
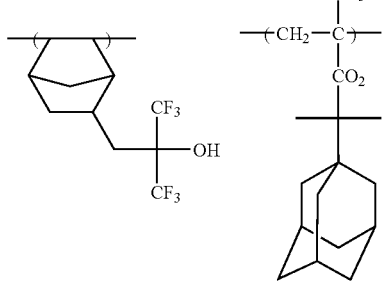
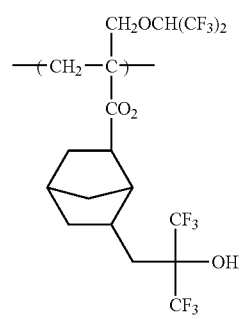
(AF-18)
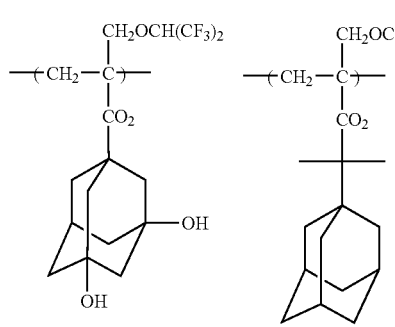

-continued
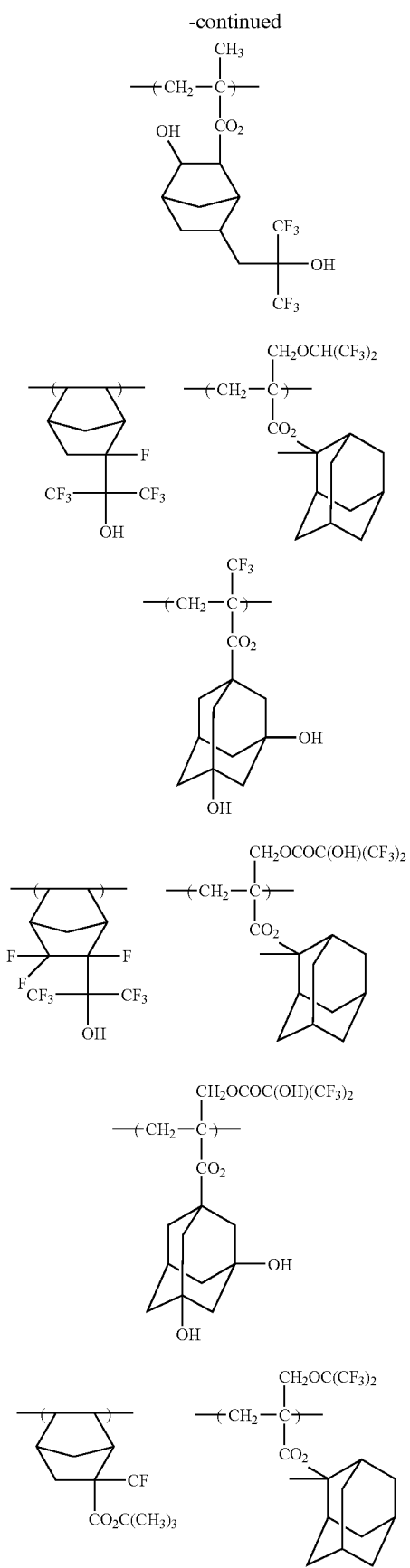
(AF-19)
(AF-20)
(AF-21)
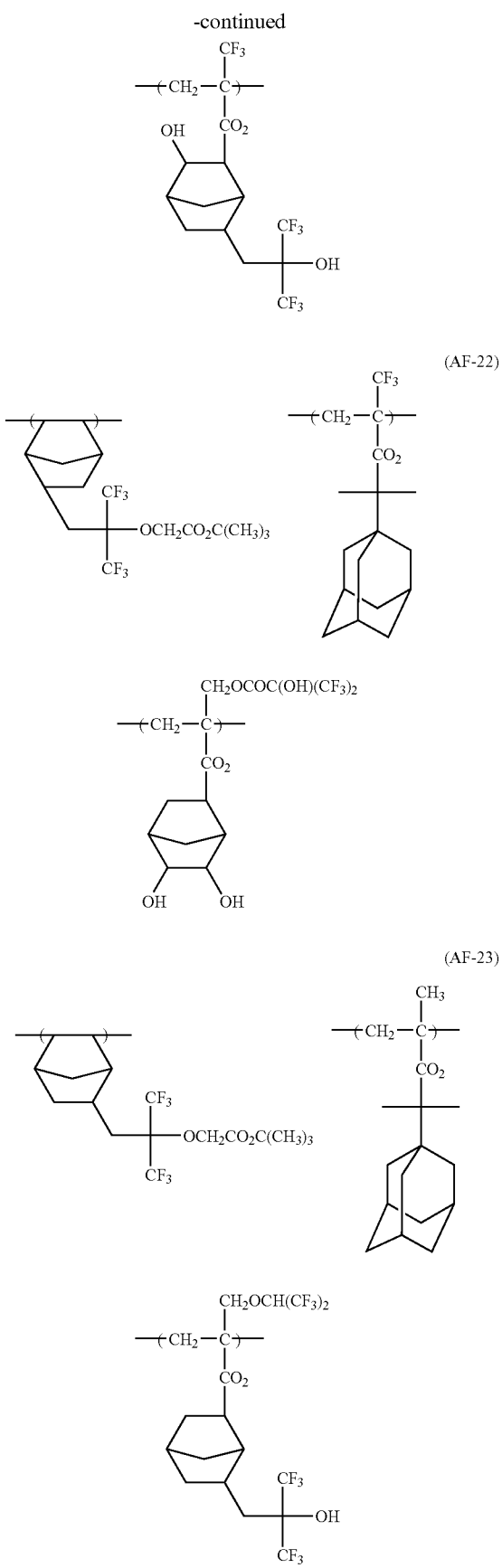
(AF-22)
(AF-23)

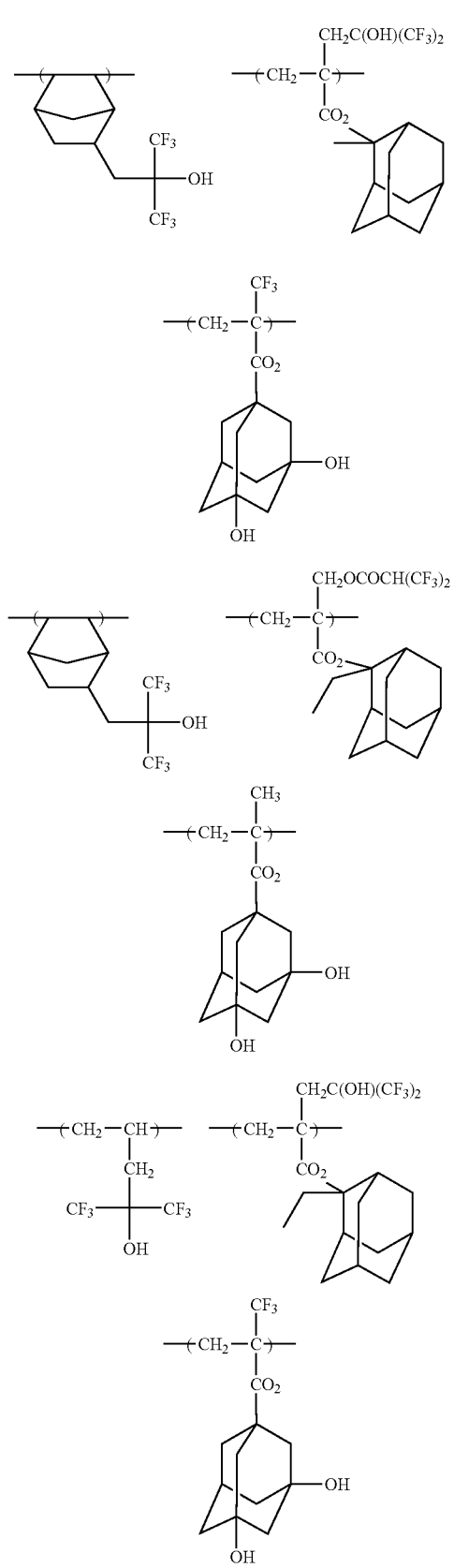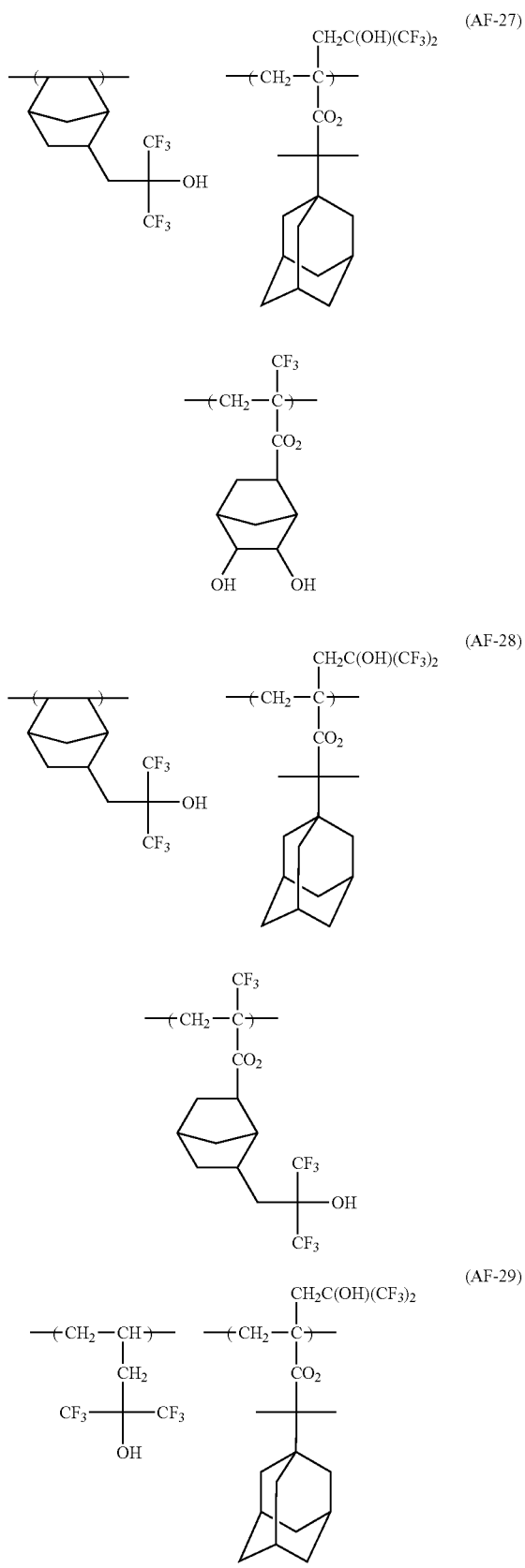

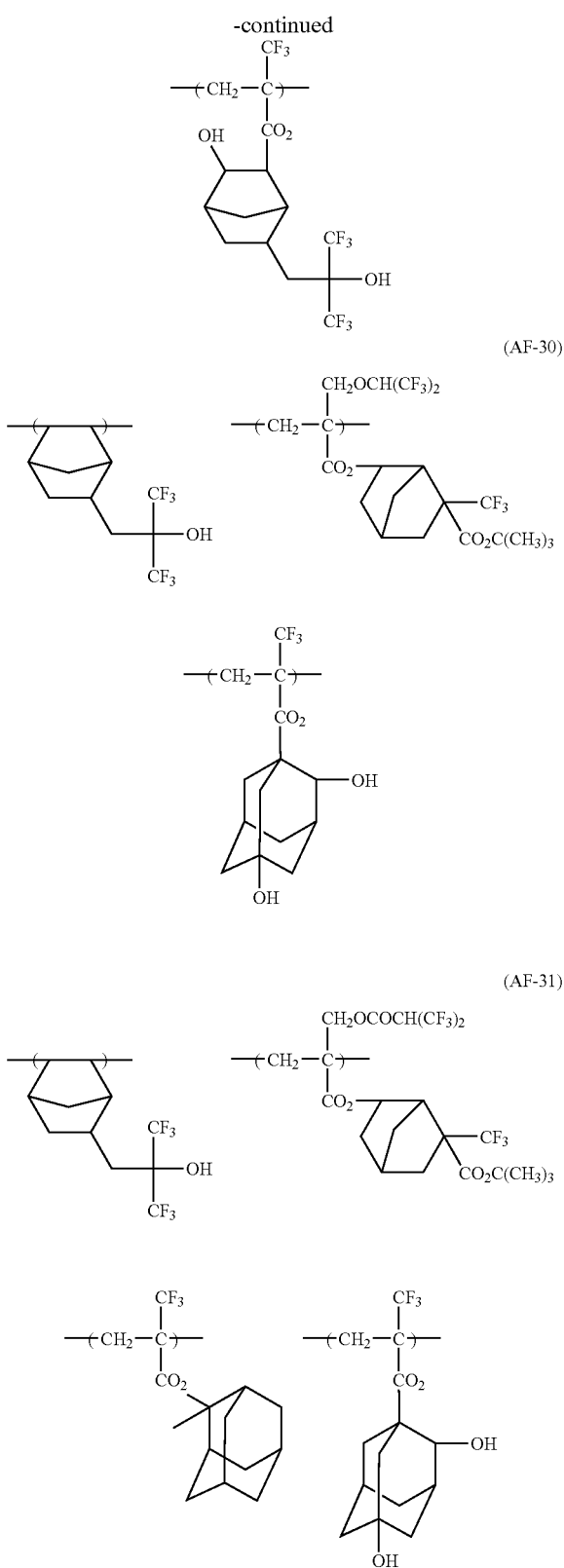

(AA)") for use in the resist composition for ArF excimer laser beam further includes a repeating unit represented by formula (A1) shown below in addition to the repeating unit represented by formula (X).

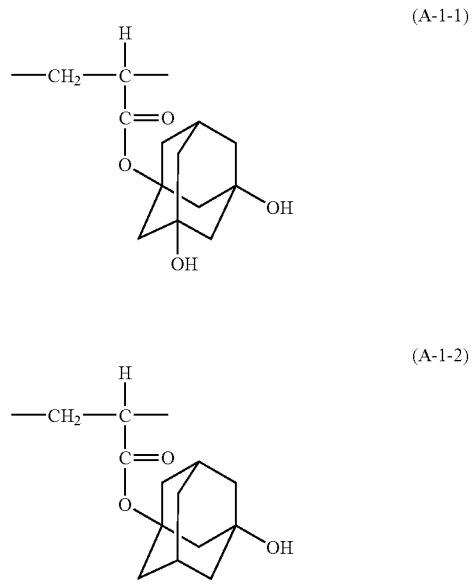

In formula (A1), $R_{56c}$, $R_{57c}$ and $R_{58c}$ each independently represents a hydrogen atom, a hydroxy group or an alkyl group, provided that at least one of $R_{56c}$, $R_{57c}$ and $R_{58c}$ represents a hydroxy group, and $R_{10c}$ represents a hydrogen atom, a methyl group or a trifluoromethyl group.

The alkyl group represented by any one of $R_{56c}$, $R_{57c}$ and $R_{58c}$ preferably includes a straight chain or branched alkyl group having from 1 to 3 carbon atoms, for example, methyl, ethyl, n-propyl or isopropyl group. The alkyl group represented by any one of $R_{56c}$, $R_{57c}$ and $R_{58c}$ may have a substituent, for example, a fluorine atom.

Specific examples of the repeating unit represented by formula (A1) are set forth below, but the invention should not be construed as being limited thereto.

In case of using the positive resist composition of the invention as a resist composition for ArF excimer laser beam, it is preferred that the resin of component (A2) (hereinafter also referred to as an "acid-decomposable resin -continued

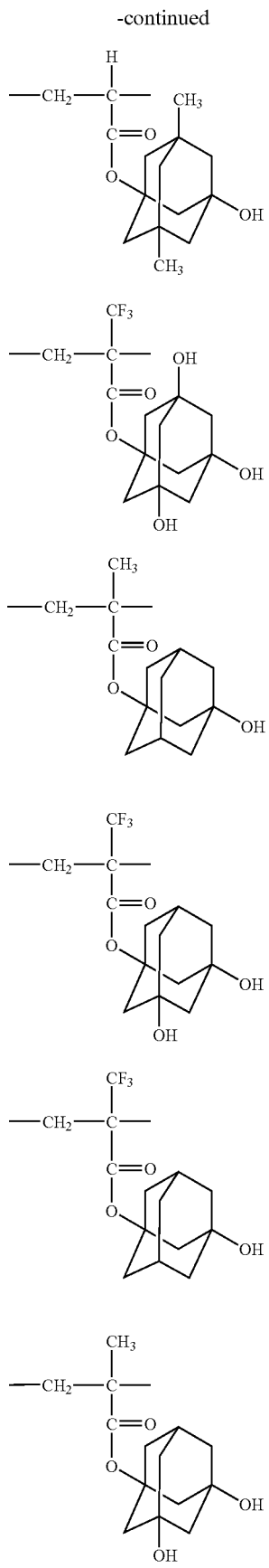

(A-1-3)
(A-1-4)
(A-1-5)
(A-1-6)
(A-1-7)
(A-1-8)

-continued

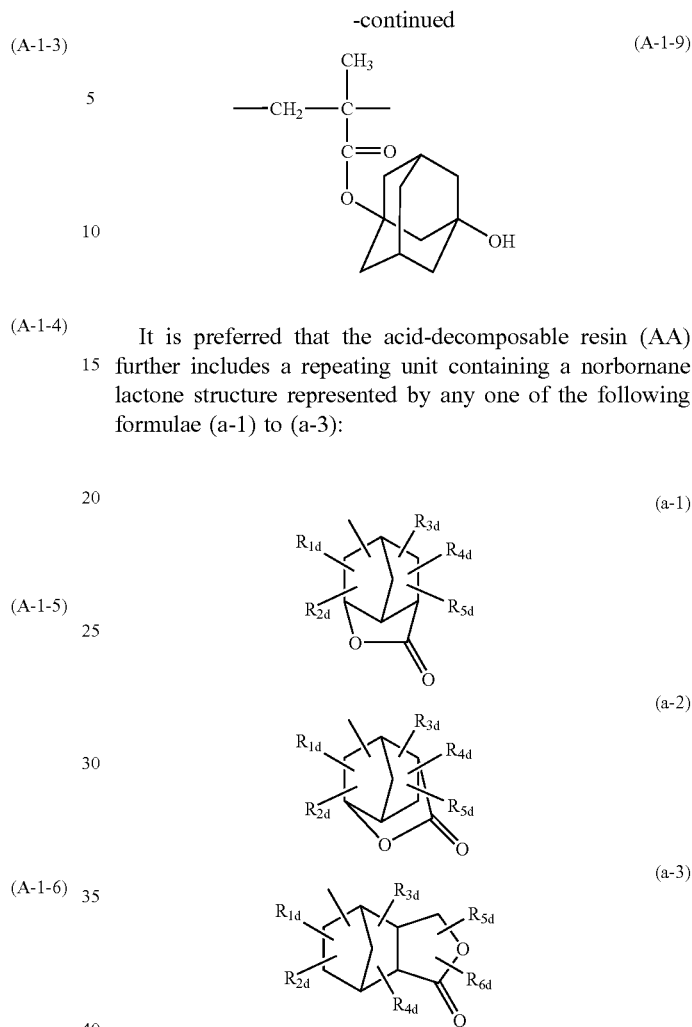

(A-1-9)

It is preferred that the acid-decomposable resin (AA) further includes a repeating unit containing a norbornane lactone structure represented by any one of the following formulae (a-1) to (a-3):

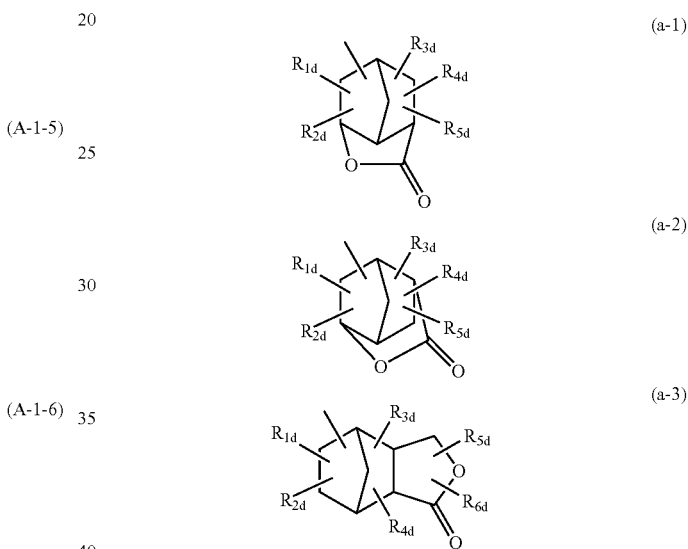

(a-1)
(a-2)
(a-3)

In formulae (a-1) to (a-3), $R_{1d}$ to $R_{6d}$ each independently represents a hydrogen atom, an alkyl group, a cycloalkyl group or an alkenyl group, or two of $R_{1d}$ to $R_{6d}$ may be combined with each other to form a ring.

The alkyl group represented by any one of $R_{1d}$ to $R_{6d}$ includes preferably a straight chain or branched alkyl group having from 1 to 12 carbon atoms, more preferably a straight chain or branched alkyl group having from 1 to 10 carbon atoms, and still more preferably methyl, ethyl, propyl, isopropyl, n-butyl, isobutyl, sec-butyl, tert-butyl, pentyl, hexyl, heptyl, octyl, nonyl and decyl group.

The cycloalkyl group represented by any one of $R_{1d}$ to $R_{6d}$ includes preferably a cycloalkyl group having from 3 to 8 carbon atoms, for example, cyclopropyl, cyclopentyl, cyclohexyl, cycloheptyl or cyclooctyl group.

The alkenyl group represented by any one of $R_{1d}$ to $R_{6d}$ includes preferably an alkenyl group having from 2 to 6 carbon atoms, for example, vinyl, propenyl, butenyl or hexenyl group.

The ring formed by combining two of $R_{1d}$ to $R_{6d}$ includes a 3-membered to 8-membered ring, for example, cyclopropane, cyclobutane, cyclopentane, cyclohexane or cyclooctane ring.

The group represented by any one of $R_{1d}$ to $R_{6d}$ in formulae (a-1) to (a-3) may be bonded to any one of the carbon atoms constituting the cyclic skeleton.

The alkyl group, cycloalkyl group or alkenyl group may have a substituent. Preferred examples of the substituent for the alkyl group, cycloalkyl group or alkenyl group include an alkoxy group having from 1 to 4 carbon atoms, a halogen atom (e.g., fluorine, chlorine, bromine or iodine atom), an acyl group having from 2 to 5 carbon atoms, an acyloxy group having from 2 to 5 carbon atoms, a cyano group, a hydroxy group, a carboxy group, an alkoxycarbonyl group having from 2 to 5 carbon atoms and a nitro group.

Examples of a repeating unit containing the group represented by any one of formulae (a-1) to (a-3) include a repeating unit represented by the following formula (A2):

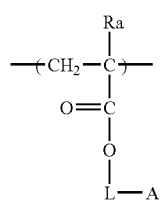

(A2)

In formula (A2), Ra represents a hydrogen atom, a halogen atom, a cyano group or an alkyl group. L represents a single bond, an ether group, an ester group, a carbonyl group, an alkylene group or a divalent group formed by combining these groups. A represents the group represented by any one of formulae (a-1) to (a-3).

The halogen atom represented by Ra includes a fluorine atom, a chlorine atom, a bromine atom and an iodine atom.

The alkyl group represented by Ra preferably includes a straight chain or branched alkyl group having from 1 to 3 carbon atoms, for example, methyl, ethyl, n-propyl or isopropyl group. The alkyl group represented by Ra may have a substituent, for example, a fluorine atom.

Examples of the divalent group formed by combination of the groups for L include groups represented by the following formulae:

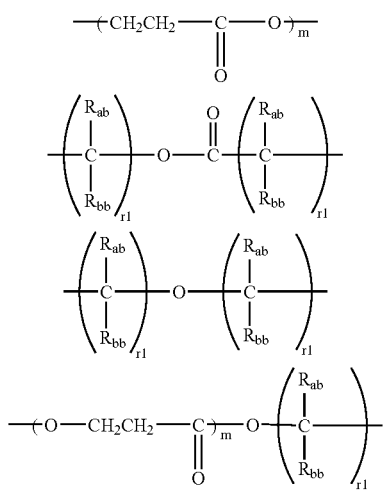

-continued

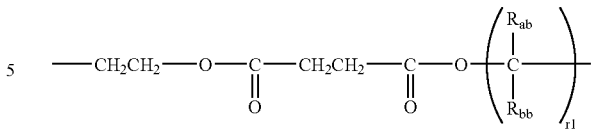

In the above-described formulae, $R_{ab}$ and $R_{bb}$, which may be the same or different, each represent a hydrogen atom, an alkyl group, a halogen atom, a hydroxy group or an alkoxy group.

The alkyl group is preferably a lower alkyl group, for example, methyl, ethyl, propyl, isopropyl or butyl, and more preferably methyl, ethyl, propyl or isopropyl group.

The alkoxy group includes an alkoxy group having from 1 to 4 carbon atoms, for example, methoxy, ethoxy, propoxy or butoxy group.

The halogen atom includes, for example, chlorine, bromine, fluorine and iodine atom.

The alkyl group or alkoxy group may have a substituent. Examples of the substituent for the alkyl group or alkoxy group include a hydroxy group, a halogen atom and an alkoxy group having from 1 to 4 carbon atoms.

r1 represents an integer of from 1 to 10, and preferably an integer of from 1 to 4. m represents an integer of from 1 to 3, and preferably 1 or 2.

Specific examples of the repeating unit represented by formula (A2) are set forth below, but the invention should not be construed as being limited thereto.

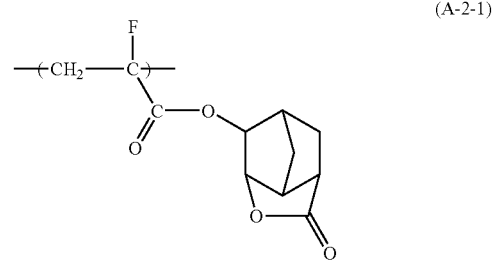
(A-2-1)

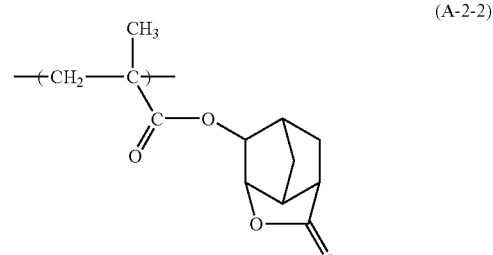
(A-2-2)

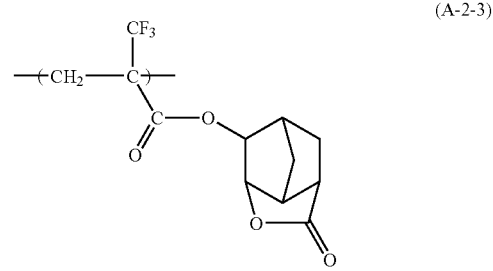
(A-2-3)

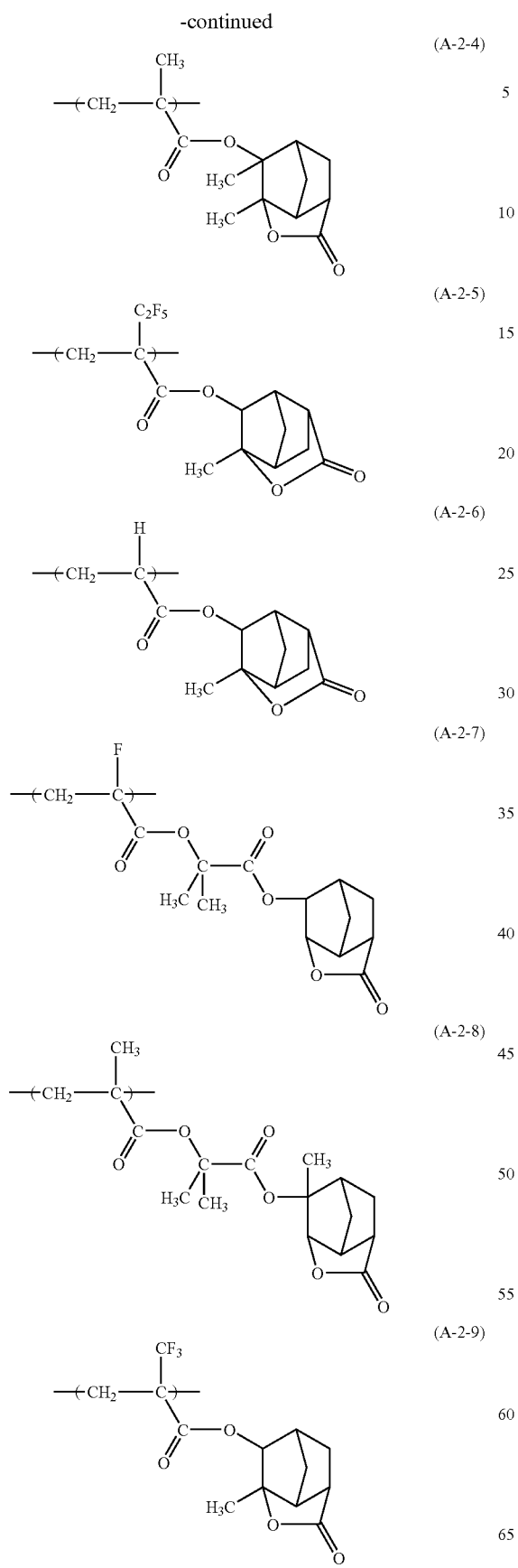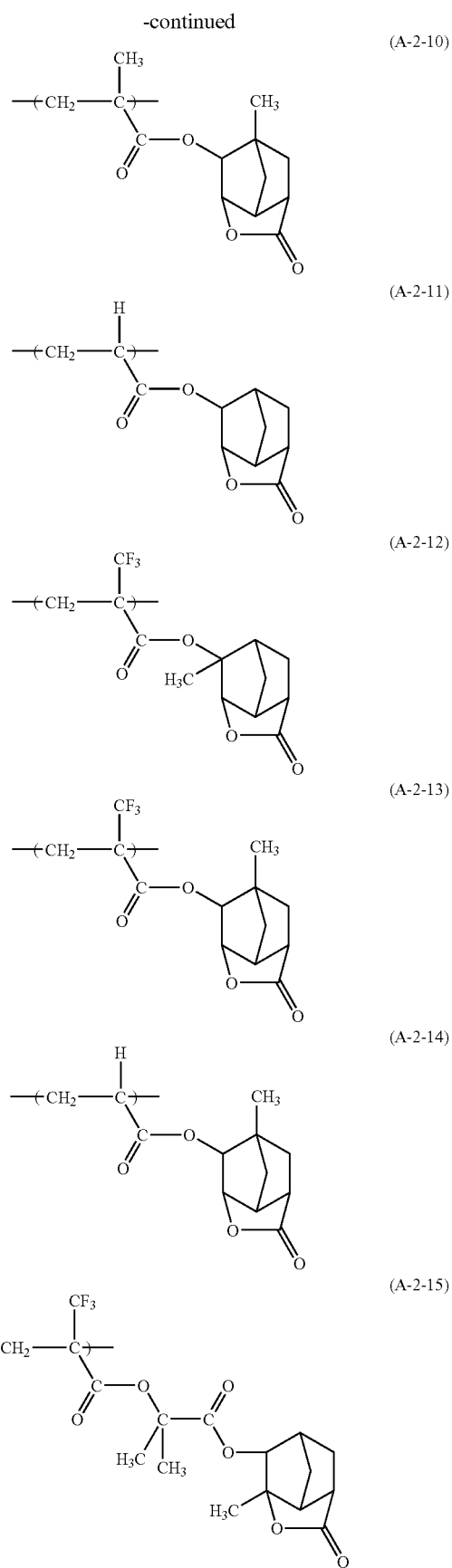

-continued
(A-2-16)
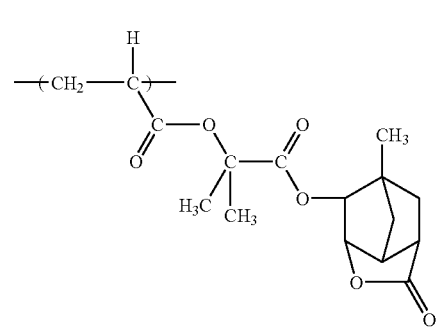
(A-2-17)
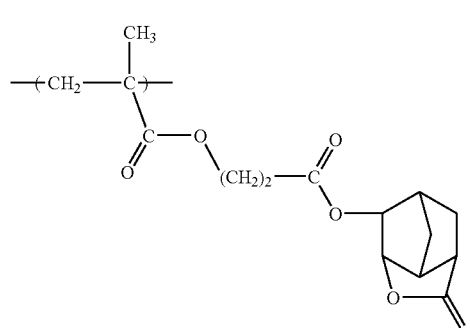
(A-2-18)
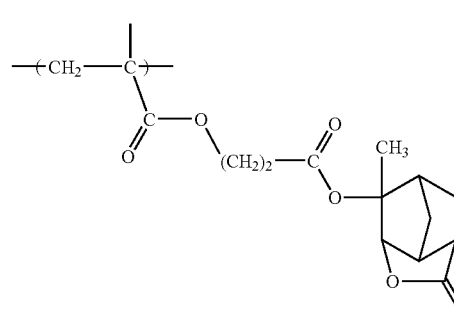
(A-2-19)
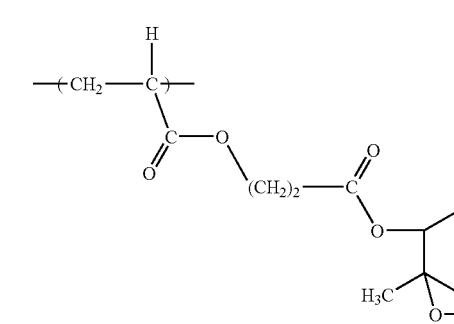
(A-2-20)
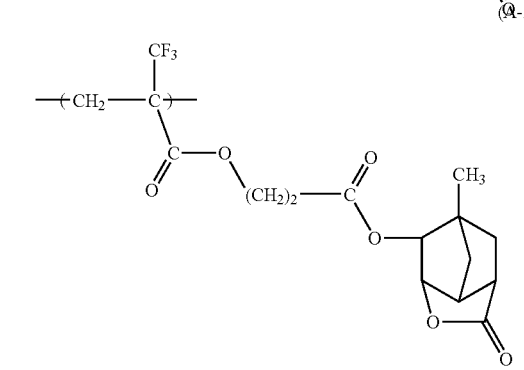
-continued
(A-2-21)
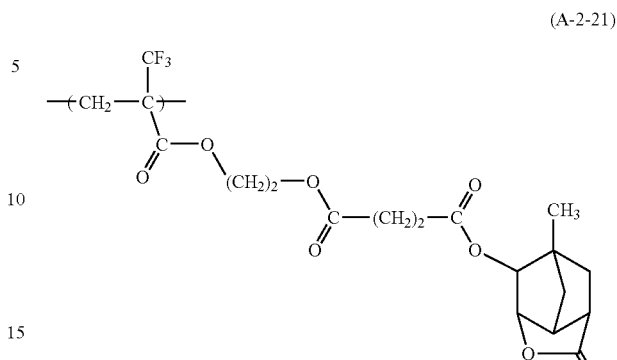
(A-2-22)
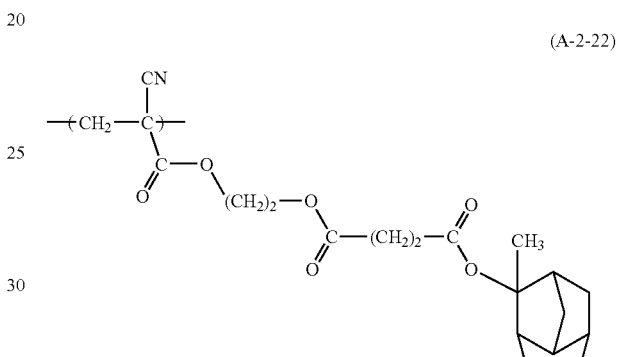
(A-2-23)
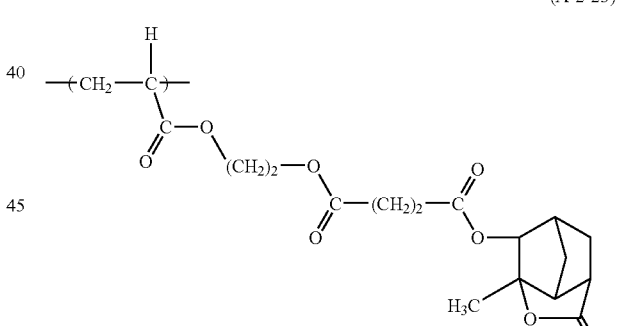
(A-2-24)
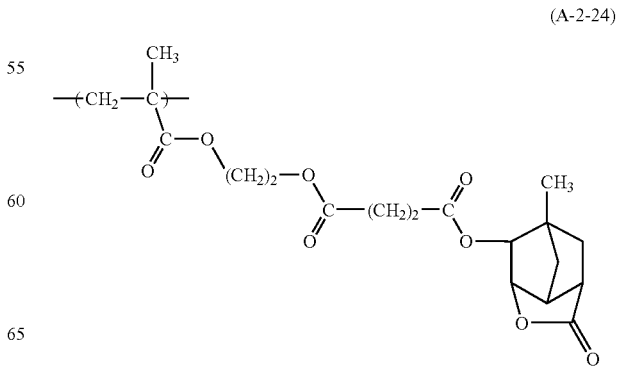

-continued

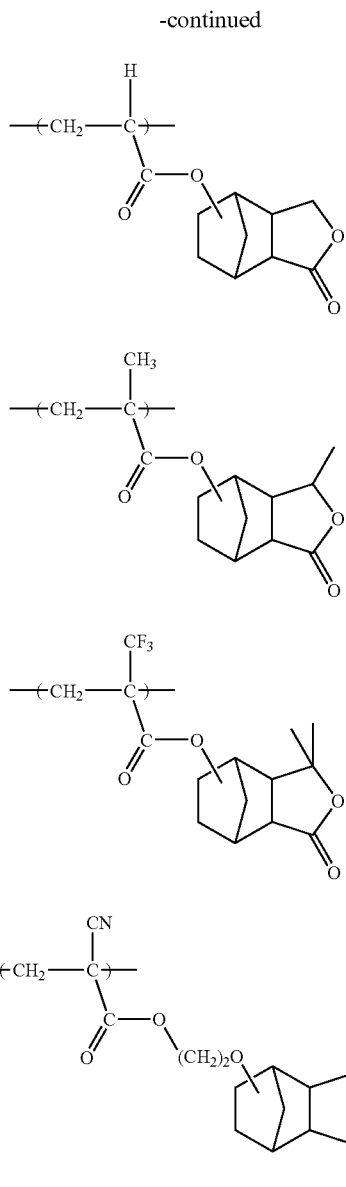

(A-2-25)

(A-2-26)

(A-2-27)

(A-2-28)

It is preferred that the acid-decomposable resin (AA) further includes a repeating unit represented by the following formula (A3):

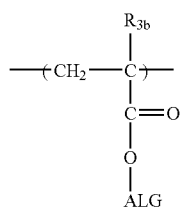

(A3)

In formula (A3), $R_{3b}$ represents a hydrogen atom, a methyl group or a trifluoromethyl group. ALG represents a group represented by the following formula (pI) or (PII):

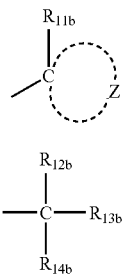

(pI)

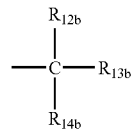

(pII)

In formulae (pI) and (pII), $R_{11b}$ represents a methyl group, an ethyl group, a n-propyl group, an isopropyl group, a n-butyl group, an isobutyl group or a sec-butyl group. Z represents an atomic group necessary for forming an alicyclic hydrocarbon group together with the carbon atom. $R_{12b}$ to $R_{14b}$ each independently represents an alkyl group having from 1 to 4 carbon atoms or an alicyclic hydrocarbon group, provided that at least one of $R_{12b}$ to $R_{14b}$ or either $R_{15}$ or $R_{16}$ represents an alicyclic hydrocarbon group.

The alkyl group represented by any one of $R_{12b}$ to $R_{14b}$ in formula (pII) is preferably a straight chain or branched alkyl group having from 1 to 4 carbon atoms. Specific examples of the alkyl group include a methyl group, an ethyl group, a n-propyl group, an isopropyl group, a n-butyl group, an isobutyl group, a sec-butyl group and a tert-butyl group. The alkyl group may have a substituent. Examples of the substituent for the alkyl group include an alkoxy group having from 1 to 4 carbon atoms, a halogen atom (e.g., fluorine, chlorine, bromine or iodine atom), an acyl group, an acyloxy group, a cyano group, a hydroxy group, a carboxy group, an alkoxycarbonyl group and a nitro group.

The alicyclic hydrocarbon group in any one of $R_{12b}$ to $R_{14b}$ or the alicyclic hydrocarbon group formed by Z and the carbon atom may be a monocyclic group or a polycyclic group. Specific examples thereof include a group having not less than 5 carbon atoms and including, for example, a monocyclo, bicyclo, tricyclo or tetracyclo structure. The number of carbon atoms included therein is preferably from 6 to 30, and more preferably from 7 to 25. The alicyclic hydrocarbon group may have a substituent.

Examples of the structure of alicyclic portion in the alicyclic hydrocarbon group are set forth below.

(1)

(2)

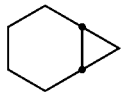

(3)

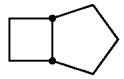

(4)

-continued
(5)
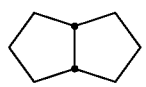
(6)
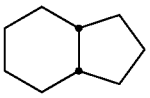
(7)
(8)
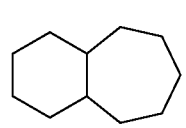
(9)
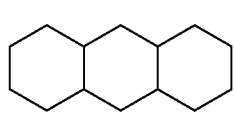
(10)
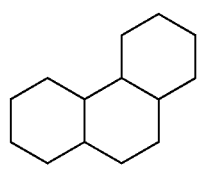
(11)
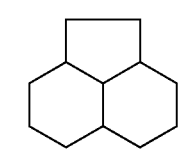
(12)
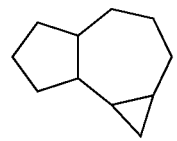
(13)
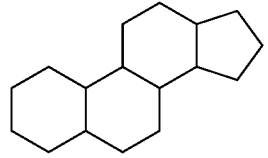
(14)
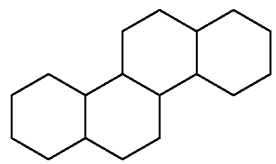
(15)
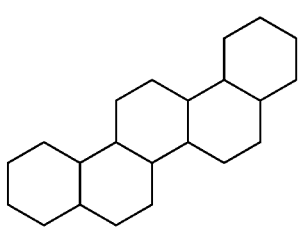
-continued
(16)
(17)
(18)
(19)
(20)
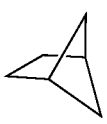
(21)
(22)
(23)
(24)
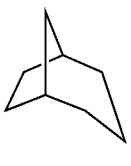
(25)
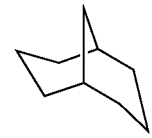
(26)
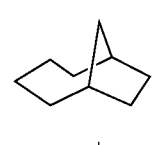
(27)
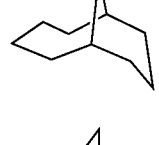
(28)

-continued

(29) 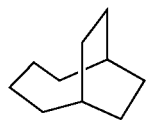

(30) 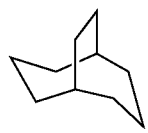

(31) 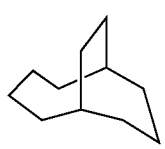

(32) 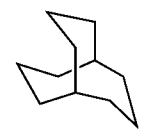

(33) 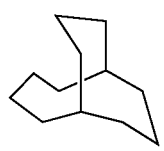

(34) 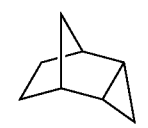

(35) 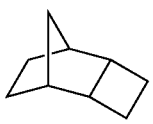

(36) 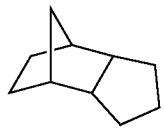

(37) 

(38) 

(39) 

(40) 

-continued

(41) 

(42) 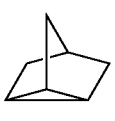

(43) 

(44) 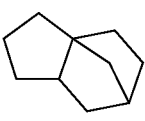

(45) 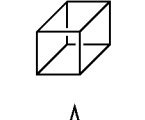

(46) 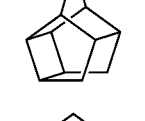

(47) 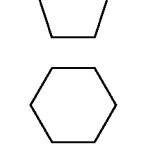

(48) 

(49) 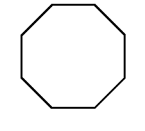

(50) 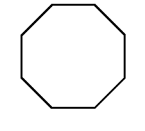

Preferred examples of the alicyclic hydrocarbon group include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. Of these groups, an adamantyl group, a decalin residue, a norbornyl group, a cedrol group, a cyclohexyl group, a cycloheptyl group, a cyclooctyl group, a cyclodecanyl group, a cyclododecanyl group and a tricyclodecanyl group are more preferred.

Examples of the substituent for the alicyclic hydrocarbon group include an alkyl group, a halogen atom, a hydroxy group, an alkoxy group, a carboxy group and an alkoxycarbonyl group.

The alkyl group is preferably a lower alkyl group, for example, methyl, ethyl, propyl, isopropyl or butyl group, and more preferably methyl, ethyl, propyl or isopropyl group.

The alkoxy group includes an alkoxy group having from 1 to 4 carbon atoms, for example, methoxy, ethoxy, propoxy or butoxy group.

The alkyl group or the alkoxy group may have a substituent. Examples of the substituent for the alkyl group or alkoxy group include a hydroxy group, a halogen atom and an alkoxy group.

From the standpoint of low fluctuation (SEM resistance) of pattern size when observed by a scanning electron microscope (SEM), repeating units represented by formula (A3) wherein ALG represents a group represented by formula (ALG-1) shown below are particularly preferred.

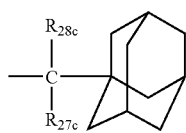
(ALG-1)

wherein $R_{26c}$ and $R_{27c}$ each independently represents a straight chain or branched alkyl group having from 1 to 4 carbon atoms.

Specific examples of the monomer corresponding to the repeating unit represented by formula (A3) and the repeating unit represented by formula (A3) are set forth below.

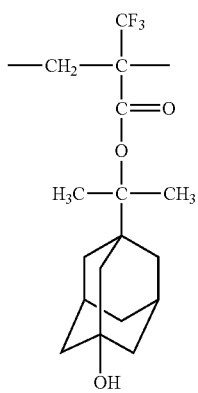
(A-3-1)

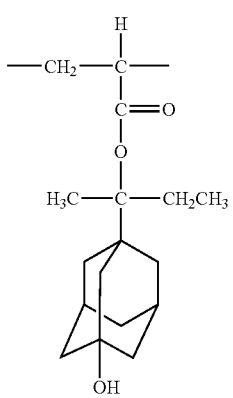
(A-3-2)

-continued

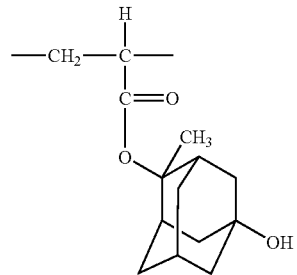
(A-3-3)

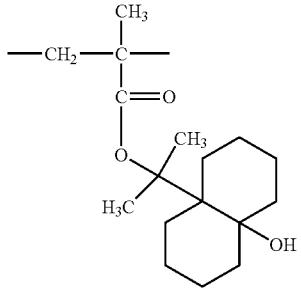
(A-3-4)

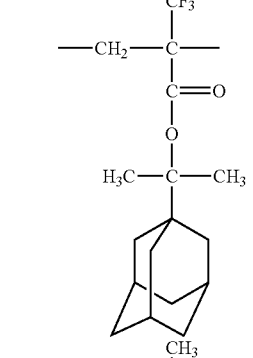
(A-3-5)

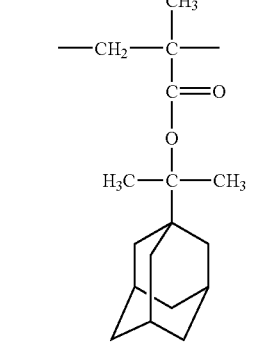
(A-3-6)

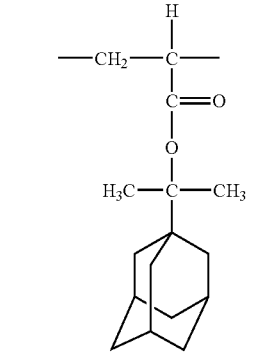
(A-3-7)

-continued

The acid-decomposable resin (AA) may further contain a repeating unit formed from other polymerizable monomer in addition to the repeating units described above.

Examples of the copolymerizable monomer include acrylates, acrylamides, methacrylates, methacrylamides, allyl compounds, vinyl ethers, vinyl esters, styrenes, crotonates, dialkyl maleates, dialkyl fumarates, maleic anhydride, maleimides, acrylonitrile, methacrylonitrile, maleonitrile and $C(R_{1a})(R_{2a})=C(R_{3a})(R_{4a})$ (wherein $R_{1a}$ to $R_{4a}$, which may be the same or different, each represent a hydrogen atom, a halogen atom or an alkyl group (preferably having from 1 to 10 carbon atoms), which may be substituted with a halogen atom). Acrylonitrile, methacrylonitrile, maleic anhydride, maleimide, N-hydroxymaleimide, N-(tert-butoxycarbonyloxy)maleimide and $C(R_{1a})(R_{2a})=C(R_{3a})(R_{4a})$ are particularly preferred. In addition, any addition polymerizable unsaturated compound copolymerizable with monomers corresponding to the repeating units described above may be ordinarily employed.

The acid-decomposable resin (AA) is preferably a resin in which all repeating units comprises an acrylic acid repeating unit, an acrylate repeating unit, an α-position substituted acrylic acid repeating unit or an α-position substituted acrylate repeating unit.

The term "α-position substitution" in the α-position substituted acrylic acid or α-position substituted acrylate means that a hydrogen atom at the α-position of the carbonyl group in the acrylic acid structure is substituted with a substituent, for example, an alkyl group, a halogen atom or a cyano group.

The alkyl group is preferably a straight chain or branched alkyl group having from 1 to 5 carbon atoms, for example, methyl, ethyl, propyl, n-butyl, sec-butyl or tert-butyl group.

The alkyl group may have a substituent. Examples of the substituent for the alkyl group include a halogen atom, a hydroxy group, an alkoxy group (preferably having from 1 to 5 carbon atoms) and an alkoxycarbonyl group (preferably having from 1 to 5 carbon atoms). The alkoxy group or alkoxycarbonyl group may further have a substituent. Examples of the substituent for the alkoxy group or alkoxycarbonyl group include a halogen atom, a hydroxy group and an alkoxy group (preferably having from 1 to 5 carbon atoms).

The acrylate group in the acrylate or α-position substituted acrylate includes, for example, the —COO—RX group (provided that RX is not a hydrogen atom) in formula (X), the —CO$_2$-hydroxyadamantyl group in formula (A1), the —COO-L-A group in formula (A2) and the —COO-ALG group in formula (A3).

The repeating units of acrylic acid acrylate, α-position substituted acrylic acid and α-position substituted acrylate include, for example, the repeating unit represented by formula (X), the repeating unit represented by formula (A1), the repeating unit represented by formula (A2) and the repeating unit represented by formula (A3).

The acid-decomposable resin (AA) preferably has a glass transition temperature of from 90 to 170° C., more preferably from 100 to 150° C.

In the acid-decomposable resin (AA), the content of the repeating unit represented by formula (X) is preferably from 10 to 60% by mole, and more preferably from 20 to 50% by mole.

In the acid-decomposable resin (AA), the content of the repeating unit represented by formula (A1) is preferably from 20 to 70% by mole, and more preferably from 25 to 60% by mole.

In the acid-decomposable resin (AA), the content of the repeating unit represented by formula (A2) is preferably from 5 to 60% by mole, and more preferably from 10 to 55% by mole.

In the acid-decomposable resin (AA), the content of the repeating unit represented by formula (A3) is preferably from 20 to 70% by mole, and more preferably from 25 to 65% by mole.

The acid-decomposable resin (AA) increases solubility in an alkali developing solution by the action of an acid since the group capable of being decomposed by the action of an acid is decomposed by the action of an acid to from a hydrophilic group, for example, a hydroxy group or a carboxy group.

The repeating unit having an acid-decomposable group in the acid-decomposable resin (AA) includes, for example, the repeating unit represented by formula (X) (wherein RX represents an acid-decomposable group or Z represents a hydroxy group protected by an acid-decomposable group) and the repeating unit represented by formula (A3).

In the acid-decomposable resin (AA), the content of the repeating unit having an acid-decomposable group is preferably from 5 to 80% by mole, and more preferably from 10 to 70% by mole.

The molecular weight of the acid-decomposable resin (A) is preferably from 2,000 to 50,000, more preferably from 3,000 to 30,000, and particularly preferably from 5,000 to 15,000, in terms of a weight average molecular weight.

The dispersion degree of molecular weight (Mw/Mn) of the acid-decomposable resin (A) is preferably from 1.0 to 3.0, more preferably from 1.1 to 2.0, and particularly preferably from 1.1 to 1.5. In order to reduce the dispersion degree of molecular weight, there are a method in which a polymer obtained by a conventional radical polymerization is dissolved in a good solvent and then a poor solvent is added thereto to remove low molecular weight components and a method using a living polymerization method, for example, a living radical polymerization method, and any of these methods can be preferably employed.

As the living radical polymerization method, any of method using nitroxide by Georges et al. and method using metal complex by Sawamoto or Matyjaszewski can be used.

From the standpoint of improvement in the roughness of pattern, it is preferred to apply a dropping polymerization method (radical polymerization method in which during radical polymerization of monomer in the presence of a radical polymerization initiator, a monomer is further added continuously or intermittently) to the above-described conventional radical polymerization method.

In the dropping polymerization method, species and composition of monomer put in first in a reaction vessel and species and composition of monomer added later in progress of the radical polymerization may be the same or different.

Also, with respect to the polymerization initiator, it is preferred to utilize a method of further adding it together with the monomer added later because an amount of the remaining unreacted monomer is reduced.

The acid-decomposable resin (A) is used in an amount ordinarily from 50 to 99.5% by weight, preferably from 80 to 99% by weight, and more preferably from 90 to 98% by weight, based on the total solid content of the resist composition.

[2] Compound (B) that generates an acid upon irradiation of an actinic ray or radiation:

The positive resist composition of the invention includes a compound (hereinafter also referred to as a "photo-acid generator") that generates an acid upon irradiation of an actinic ray or radiation.

The photo-acid generator can be appropriately selected from photoinitiators for photo-cationic polymerization, photoinitiators for photo-radical polymerization, photo-achromatic agents for dyes, photo-discoloring agents, known compounds generating an acid by the action of an actinic ray or radiation for use in microresist or the like, and mixtures of these compounds.

Examples of the photo-acid generators include a diazonium salt, a phosphonium salt, a sulfonium salt, an iodonium salt, an imidosulfonate, an oximesulfonate, a diazodisulfone, a disulfone and an o-nitrobenzylsulfonate.

Also, polymer compounds in which a group or compound generating an acid by the action of an actinic ray or radiation is introduced into the main chain or side chain thereof, for example, compounds as described, for example, in U.S. Pat. No. 3,849,137, West German Patent 3,914,407, JP-A-63-26653, JP-A-55-164824, JP-A-62-69263, JP-A-63-146038, JP-A-63-163452, JP-A-62-153853 and JP-A-63-146029 can be used.

Further, compounds generating an acid with light as described, for example, in U.S. Pat. No. 3,779,778 and European Patent 126,712 can be used.

Preferred examples of the compound that is decomposed by the action of an actinic ray or radiation to generate an acid include compounds represented by the following formulae (ZI), (ZII) and (ZIII):

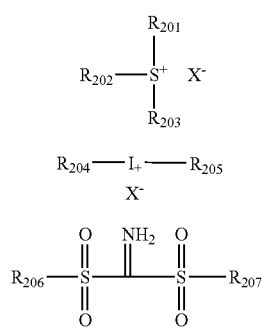

In formula (ZI), $R_{201}$, $R_{202}$ and $R_{203}$ each independently represent an organic group.

A number of carbon atoms included in the organic group represented by any one of $R_{201}$, $R_{202}$ and $R_{203}$ is ordinarily from 1 to 30, and preferably from 1 to 20.

Also, two of $R_{201}$, $R_{202}$ and $R_{203}$ may be combined with each other to from a ring structure, and the ring structure may include an oxygen atom, a sulfur atom, an ester bond, an amido bond or a carbonyl group.

A group formed by combining two of $R_{201}$, $R_{202}$ and $R_{203}$ include an alkylene group (for example, a butylene group or a pentylene group).

$X^-$ represents a non-nucleophilic anion.

The non-nucleophilic anion represented by $X^-$ includes, for example, a sulfonic acid anion, a carboxylic acid anion, a sulfonylimido anion, a bis(alkylsulfonyl)imido anion and a tris(alkylsulfonyl)methyl anion.

The non-nucleophilic anion means an anion having an extremely low ability for causing a nucleophilic reaction and an anion capable of restraining decomposition by an intramolecular nucleophilic reaction with the lapse of time. By means of the non-nucleophilic anion, preservation stability of the resist composition is improved.

Examples of the sulfonic acid anion include an alkylsulfonic acid anion, an arylsulfonic acid anion and camphorsulfonic acid anion.

Examples of the carboxylic acid anion include an alkylcarboxylic acid anion, an arylcarboxylic acid anion and an aralkylcarboxylic acid anion.

The alkyl moiety in the alkylsulfonic acid anion may be a chain alkyl group or a cycloalkyl group and preferably includes an alkyl group having from 1 to 30 carbon atoms and a cycoalkyl group having from 3 to 30 carbon atoms, for example, a methyl group, an ethyl group, a propyl group, an isopropyl group, a n-butyl group, an isobutyl group, a sec-butyl group, a pentyl group, a neopentyl group, a hexyl group, a heptyl group, an octyl group, a nonyl group, a decyl group, a undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group or a bornyl group.

The aryl group in the arylsulfonic acid anion is preferably an aryl group having from 6 to 14 carbon atoms, for example, a phenyl group, a tolyl group or a naphthyl group.

The alkyl group, cycloalkyl group and aryl group in the alkylsulfonic acid anion and arylsulfonic acid anion may have a substituent.

Examples of the substituent include a nitro group, a halogen atom (for example, fluorine, chlorine, bromine or iodine atom), a carboxy group, a hydroxy group, an amino group, a cyano group, an alkoxy group (preferably having from 1 to 5 carbon atoms), a cycloalkyl group (preferably having from 3 to 15 carbon atoms), an aryl group (preferably having from 6 to 14 carbon atoms), an alkoxycarbonyl group (preferably having from 2 to 7 carbon atoms), an acyl group (preferably having from 2 to 12 carbon atoms) and an alkoxycarbonyloxy group (preferably having from 2 to 7 carbon atoms). The aryl group and ring structure included in each of these groups may further have a substituent, for example, an alkyl group (preferably having from 1 to 15 carbon atoms).

The alkyl moiety in the alkylcarboxylic acid anion is same as the alkyl group and cycloalkyl group in the alkylsulfonic acid anion.

The aryl group in the arylcarboxylic acid anion is same as the aryl group in the arylsulfonic acid anion.

The aralkyl group in the aralkylcarboxylic acid anion is preferably an aralkyl group having from 7 to 12 carbon atoms, for example, a benzyl group, a phenethyl group, a naphthylmethyl group or a naphthylethyl group.

The alkyl group, cycloalkyl group, aryl group and aralkyl group in the alkylcarboxylic acid anion, arylcarboxylic acid anion and aralkylcarboxylic acid anion may have a substituent. Examples of the substituent include those described for the arylsulfonic acid anion, for example, a halogen atom, an alkyl group, a cycloalkyl group, an alkoxy group or an alkylthio group.

Examples of the sulfonylimido anion include saccharin anion.

The alkyl group in the bis(alkylsulfonyl)imido anion or tris(alkylsulfonyl)methyl anion preferably includes an alkyl group having from 1 to 5 carbon atoms, for example, a methyl group, an ethyl group, a propyl group, an isopropyl group, a n-butyl group, an isobutyl group, a sec-butyl group, a pentyl group or a neopentyl group. The alkyl group may have a substituent and examples of the substituent include a halogen atom, an alkyl group substituted with a halogen atom, an alkoxy group and an alkylthio group. Of the substituents, an alkyl group substituted with a fluorine atom is preferred.

Other examples of the non-nucleophilic anion include phosphorus fluoride, boron fluoride and antimony fluoride.

Of the non-nucleophilic anions represented by $X^-$, an alkanesulfonic acid anion wherein the α-position of the sulfonic acid is substituted with a fluorine atom, an arylsulfonic acid anion substituted with a fluorine atom or a group having a fluorine atom, a bis(alkylsulfonyl)imido anion wherein the alkyl group is substituted with a fluorine atom and a tris(alkylsulfonyl)methyl anion wherein the alkyl group is substituted with a fluorine atom are preferred. As the non-nucleophilic anions for $X^-$, a perfluoroalkanesulfonic anion having from 4 to 8 carbon atoms and a benzenesulfonic acid anion having a fluorine atom are particularly preferred and, nonafluorobutanesulfonic acid anion, perfluorooctanesulfonic acid anion, a pentafluorobenzenesulfonic acid anion and a 3,5-bis(trifluoromethyl)benzenesulfonic acid anion are most preferred.

Specific examples of the organic group represented by any one of $R_{201}$, $R_{202}$ and $R_{203}$ include the corresponding groups in Compounds (Z1-1), (Z1-2) and (Z1-3) described below.

Compounds having two or more of the structures represented by formula (ZI) may also be used. For example, a compound having a structure in which at least one of $R_{201}$, $R_{202}$ and $R_{203}$ in one compound represented by formula (ZI) is connected to at least one of $R_{201}$, $R_{202}$ and $R_{203}$ in another compound represented by formula (ZI).

As more preferable compounds of the compounds represented by formula (ZI), Compounds (Z1-1), (Z1-2) and (Z1-3) described below are exemplified.

Compound (Z1-1) is an arylsulfonium compound wherein at least one of $R_{201}$, $R_{202}$ and $R_{203}$ in formula (ZI) is an aryl group, that is, a compound including an arylsulfonium as a cation.

In the arylsulfonium compound, all of $R_{201}$, $R_{202}$ and $R_{203}$ may be aryl groups, or a part of $R_{201}$, $R_{202}$ and $R_{203}$ may be an aryl group and the remainder may be an alkyl group or a cycloalkyl group.

Examples of the arylsulfonium compound include triarylsulfonium compounds, diarylalkylsulfonium compounds and aryldialkylsulfonium compounds.

As the aryl group in the arylsulfonium compound, a phenyl group or a naphthyl group is preferable and a phenyl group is more preferable. When the arylsulfonium compound includes two or more aryl groups, the two or more aryl groups may be the same or different from each other.

The alkyl group or cycloalkyl group, which is included in the arylsulfonium compound, if desired, is preferably a straight chain or branched alkyl group having from 1 to 15 carbon atoms or a cycloalkyl group having from 3 to 15 carbon atoms, and includes a methyl group, an ethyl group, a propyl group, a n-butyl group, a sec-butyl group, a tert-butyl group, a cyclopropyl group, a cyclobutyl group and a cyclohexyl group.

The aryl group, alkyl group or cycloalkyl group represented by any one of $R_{201}$, $R_{202}$ and $R_{203}$ may have as a substituent, an alkyl group (for example, an alkyl group having from 1 to 15 carbon atoms), a cycloalkyl group having from 3 to 15 carbon atoms), an aryl group (for example, an aryl group having from 6 to 14 carbon atoms), an alkoxy group (for example, an alkoxy group having from 1 to 15 carbon atoms), a halogen atom, a hydroxy group or a phenylthio group. Preferred examples of the substituent include a straight chain or branched alkyl group having from 1 to 12 carbon atoms, a cycloalkyl group having from 3 to 12 carbon atoms and a straight-chain, branched or cyclic alkoxy group having from 1 to 12 carbon atoms. An alkyl group having from 1 to 4 carbon atoms and an alkoxy group having from 1 to 4 carbon atoms are most preferred. The substituent may be substituted on any one of $R_{201}$, $R_{202}$ and $R_{203}$ or the substituents may be substituted on all of $R_{201}$, $R_{202}$ and $R_{203}$. When $R_{201}$, $R_{202}$ or $R_{203}$ represents an aryl group, the substituent is preferably substituted on the p-position of the aryl group.

Now, Compound (Z1-2) is described below.

Compound (Z1-2) is a compound wherein $R_{201}$, $R_{202}$ and $R_{203}$ in formula (ZI) each independently represent an organic group including no aromatic ring. The term "aromatic ring" used herein also includes an aromatic ring containing a hetero atom.

The organic group including no aromatic ring represented by any one of $R_{201}$, $R_{202}$ and $R_{203}$ has ordinarily from 1 to 30 carbon atoms, and preferably from 1 to 20 carbon atoms.

$R_{201}$, $R_{202}$ and $R_{203}$ each independently preferably represent an alkyl group, a cycloalkyl group, an allyl group or a vinyl group, more preferably a straight chain or branched 2-oxoalkyl group, a 2-oxocycloalkyl group or an alkoxycarbonylmethyl group, and most preferably a straight chain or branched 2-oxoalkyl group.

The alkyl group or cycloalkyl group represented by any one of $R_{201}$, $R_{202}$ and $R_{203}$ preferably includes a straight-chain or branched alkyl group having from 1 to 10 carbon atoms (for example, a methyl group, an ethyl group, a propyl group, a butyl group or a pentyl group) and a cycloalkyl group having from 3 to 10 carbon atoms (for example, a cyclopentyl group, a cyclohexyl group or a norbornyl group). More preferred examples of the alkyl group include a 2-oxoalkyl group and an alkoxycarbonylmethyl group.

The 2-oxoalkyl group may be any one of straight-chain and branched 2-oxoalkyl groups, and preferably includes a 2-oxoalkyl group in which >C=O is present at the 2-position of each of the above-described alkyl groups.

The 2-oxocycloalkyl group preferably includes a 2-oxocycloalkyl group in which >C=O is present at the 2-position of each of the above-described cycloalkyl groups.

The alkoxy group of the alkoxycarbonylmethyl group includes preferably an alkoxy group having from 1 to 5 carbon atoms (for example, a methoxy group, an ethoxy group, a propoxy group, a butoxy group or a pentoxy group).

The group represented by any one of $R_{201}$, $R_{202}$ and $R_{203}$ may further be substituted with a halogen atom, an alkoxy group (for example, an alkoxy group having from 1 to 5 carbon atoms), a hydroxy group, a cyano group or a nitro group.

Two of $R_{201}$, $R_{202}$ and $R_{203}$ may be combined with each other to from a ring structure, and the ring structure may include an oxygen atom, a sulfur atom, an ester bond, an amido bond or a carbonyl group. A group formed by connecting with two of $R_{201}$, $R_{202}$ and $R_{203}$ includes an alkylene group (for example, a butylene group or a pentylene group).

Compound (Z1-3) is a compound represented by formula (Z1-3) shown below, and a compound containing a phenacylsulfonium salt structure.

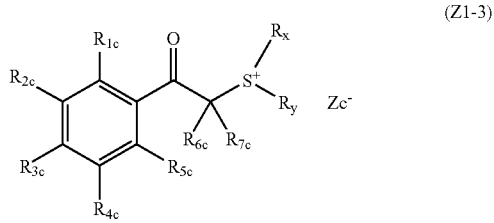

(Z1-3)

wherein $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

At least any two of $R_{1c}$ to $R_{5c}$, or $R_x$ and $R_y$ may be combined with each other to form a cyclic structure, and the cyclic structure may include an oxygen atom, a sulfur atom, an ester bond or an amido bond.

$Zc^-$ represents a non-nucleophilic anion, and includes non-nucleophilic anions same as those defined for $X^-$ in formula (ZI).

The alkyl group represented by any one of $R_{1c}$ to $R_{7c}$ may be any one of a straight chain or branched alkyl group, and includes, for example, an alkyl group having from 1 to 20 carbon atoms. Preferred examples thereof include a straight chain or branched alkyl group having from 1 to 12 carbon atoms (for example, a methyl group, an ethyl group, a straight chain or branched propyl group, a straight chain or branched butyl group or a straight chain or branched pentyl group). The cycloalkyl group includes a cyclic alkyl group having from 3 to 8 carbon atoms (for example, a cyclopentyl group or a cyclohexyl group).

The alkoxy group represented by any one of $R_{1c}$ to $R_{5c}$ may be any one of a straight chain, branched or cyclic alkoxy group, and includes, for example, an alkoxy group having from 1 to 10 carbon atoms. Preferred examples thereof include a straight chain or branched alkoxy group having from 1 to 5 carbon atoms (for example, a methoxy group, an ethoxy group, a straight chain or branched propoxy group, a straight chain or branched butoxy group or a straight chain or branched pentoxy group) and a cyclic alkoxy group having from 3 to 8 carbon atoms (for example, a cyclopentyloxy group or a cyclohexyloxy group).

Preferably, any one of $R_{1c}$ to $R_{5c}$ represents a straight chain or branched alkyl group, a cycloalkyl group or a straight chain, branched or cyclic alkoxy group, and more preferably, the total number of carbon atoms included in $R_{1c}$ to $R_{5c}$ is from 2 to 15. This makes it possible to improve solubility in a solvent, whereby the generation of particles during storage of the resist composition is restrained.

The alkyl group and cycloalkyl group for any one of $R_x$ and $R_y$ is same as the alkyl group or cycloalkyl group for any one of $R_{1c}$ to $R_{7c}$, and preferably includes a 2-oxoalkyl group, a 2-oxocycloalkyl group and an alkoxycarbonylmethyl group.

Examples of the 2-oxoalkyl group or 2-oxocycloalkyl group include a 2-oxoalkyl group or 2-oxocycloalkyl group having >C=O at the 2-position of the alkyl group or cycloalkyl group for any one of $R_{1c}$ to $R_{7c}$.

The alkoxy group of the alkoxycarbonylmethyl group is same as the alkoxy group for any one of $R_{1c}$ to $R_{5c}$.

Examples of the group formed by combining with $R_x$ and $R_y$ include a butylene group and a pentylene group.

$R_x$ and $R_y$ each preferably represents an alkyl group or cycloalkyl group having not less than 4 carbon atoms, more preferably an alkyl group or cycloalkyl group having not less than 6 carbon atoms, and still more preferably an alkyl group or cycloalkyl group having not less than 8 carbon atoms.

In formula (ZII) or (ZIII), $R_{204}$ to $R_{207}$ each independently represents an aryl group, an alkyl group or a cycloalkyl group.

The aryl group represented by any one of $R_{204}$ to $R_{207}$ is preferably a phenyl group or a naphthyl group, and more preferably a phenyl group.

The alkyl group or cycloalkyl group represented by any one of $R_{204}$ to $R_{207}$ preferably includes a straight chain or branched alkyl group having from 1 to 10 carbon atoms (for example, a methyl group, an ethyl group, a propyl group, a butyl group or a pentyl group) and a cyclic alkyl group having from 3 to 10 carbon atoms (for example, a cyclopentyl group, a cyclohexyl group or a norbornyl group)

The substituent, which may be present on the group represented by any one of $R_{204}$ to $R_{207}$, includes an alkyl group (for example, an alkyl group having from 1 to 15 carbon atoms), a cycloalkyl group having from 3 to 15 carbon atoms), an aryl group (for example, an aryl group having from 6 to 15 carbon atoms), an alkoxy group (for example, an alkoxy group having from 1 to 15 carbon atoms), a halogen atom, a hydroxy group or a phenylthio group.

$X^-$ represents a non-nucleophilic anion, and has the same meaning as the non-nucleophilic anion represented by $X^-$ in formula (ZI).

Preferred examples of the compound that is decomposed by the action of an actinic ray or radiation to generate an acid also include compounds represented by the following formulae (ZIV), (ZV) and (ZVI):

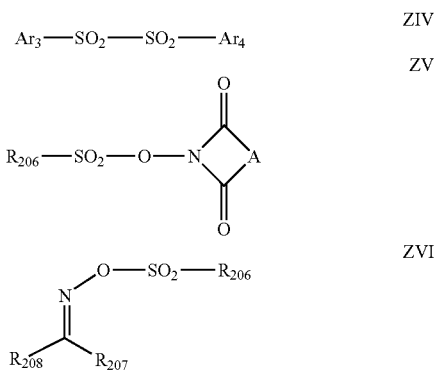

In formulae (ZIV), (ZV) and (ZVI), $Ar_3$ and $Ar_4$ each independently represents an aryl group.

$R_{206}$, $R_{207}$ and $R_{208}$ each independently represents an alkyl group or an aryl group.

A represents an alkylene group, an alkenylene group or an arylene group.

Of the compounds that are decomposed by the action of an actinic ray or radiation to generate an acid, the compounds represented by formulae (Z1) to (ZIII) are more preferred.

Also, as the compound that is decomposed by the action of an actinic ray or radiation to generate an acid, a compound that generates a sulfonic acid having one sulfonic acid is preferred, and a compound that generates a monovalent perfluoroalkanesulfonic acid and a compound that generates an aromatic sulfonic acid substituted with a fluorine atom or a group having a fluorine atom are more preferred.

Particularly preferred examples of the compound that is decomposed by the action of an actinic ray or radiation to generate an acid are set forth below.

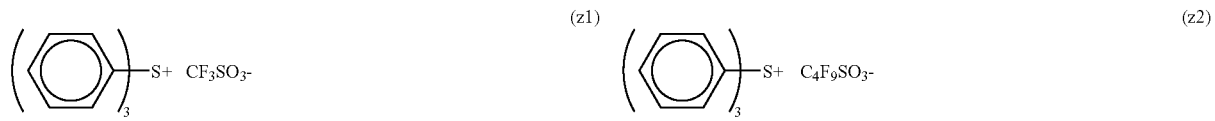

-continued
(z3) 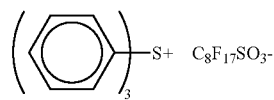
(z4) 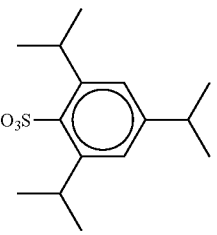
(z5) 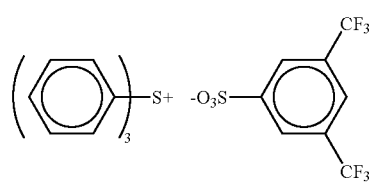
(z6) 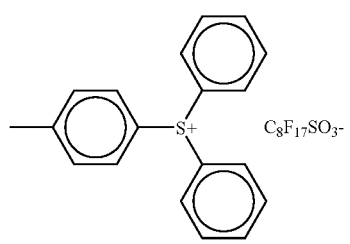
(z7) 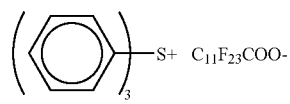
(z8) 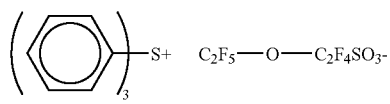
(z9) 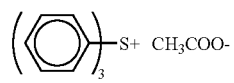
(z10) 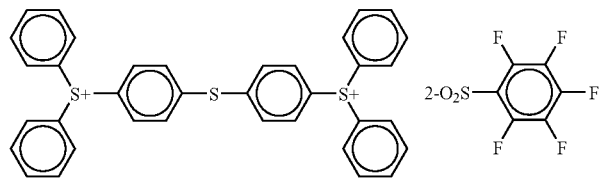
(z11) 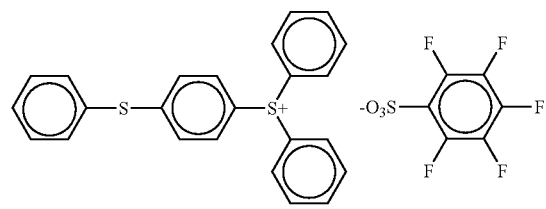
(z12) 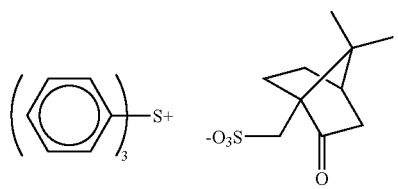
(z13) 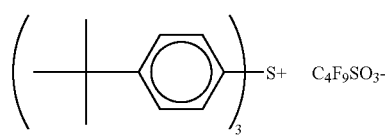
(z14) 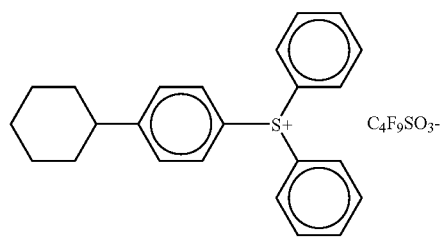
(z15) 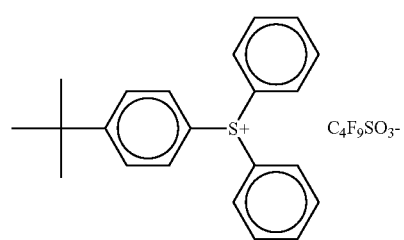
(z16) 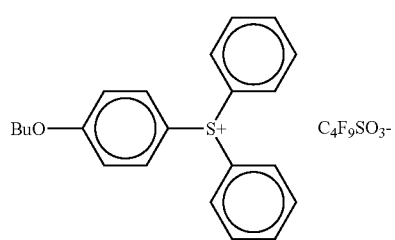

-continued
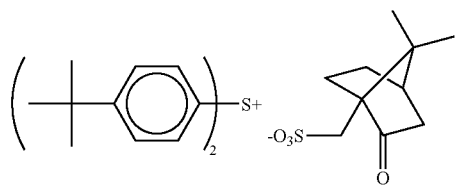 (z17)
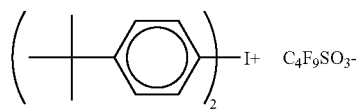 (z18)
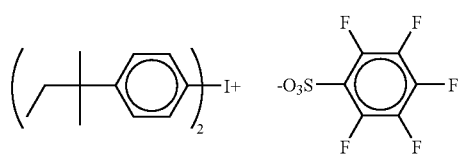 (z19)
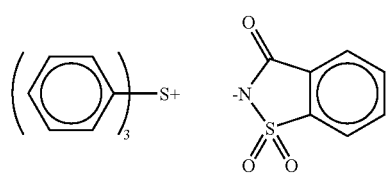 (z20)
 (z21)
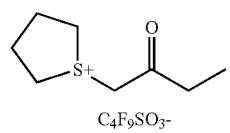 (z22)
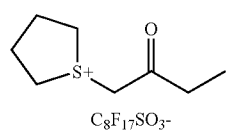 (Z23)
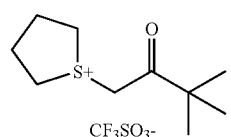 (z24)
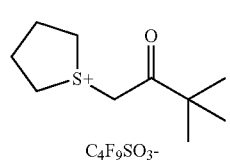 (z25)
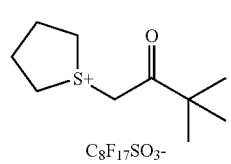 (z26)
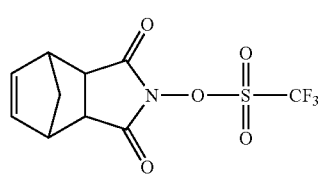 (z27)
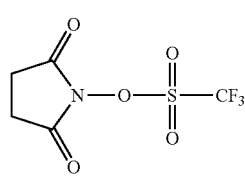 (z28)
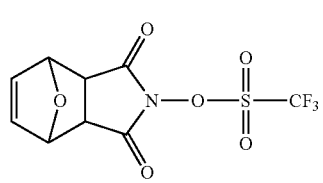 (z29)
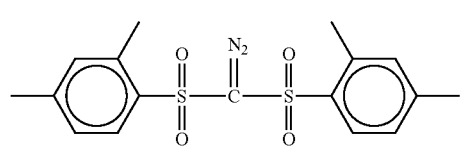 (z30)
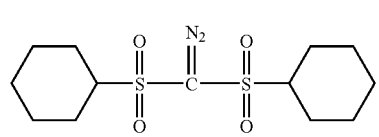 (z31)
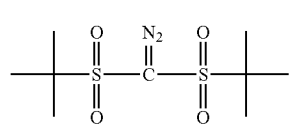 (z32)
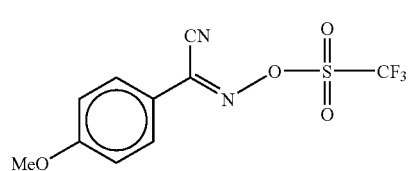 (z33)

-continued
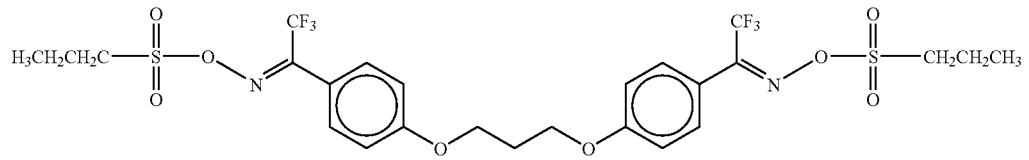
(z34)
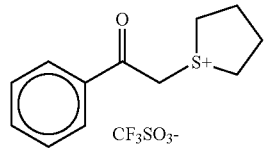
(z35)
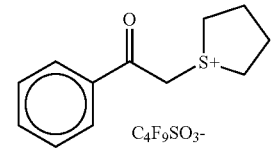
z(36)
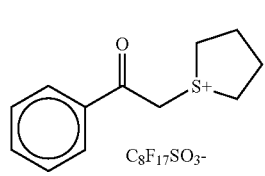
(z37)
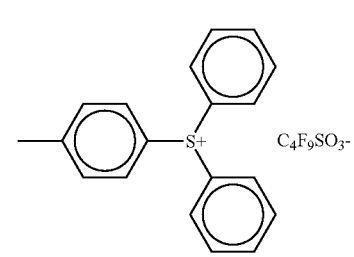
z(38)
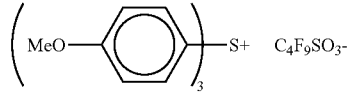
(z39)
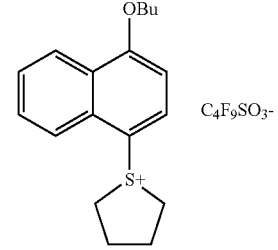
(z40)
(z41)
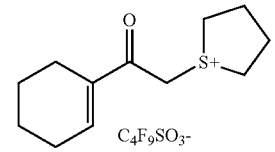
(z42)
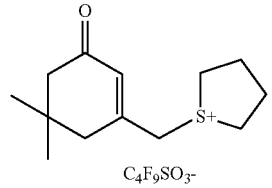
(z43)
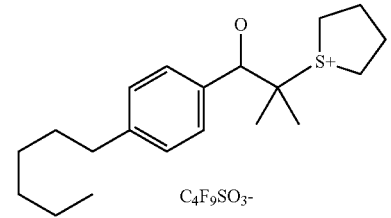
(z44)
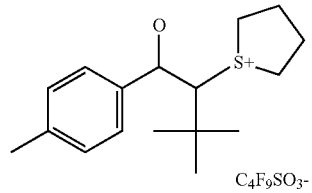
(z45)
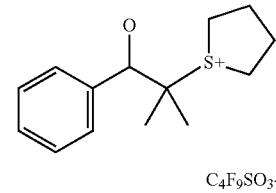
(z46)

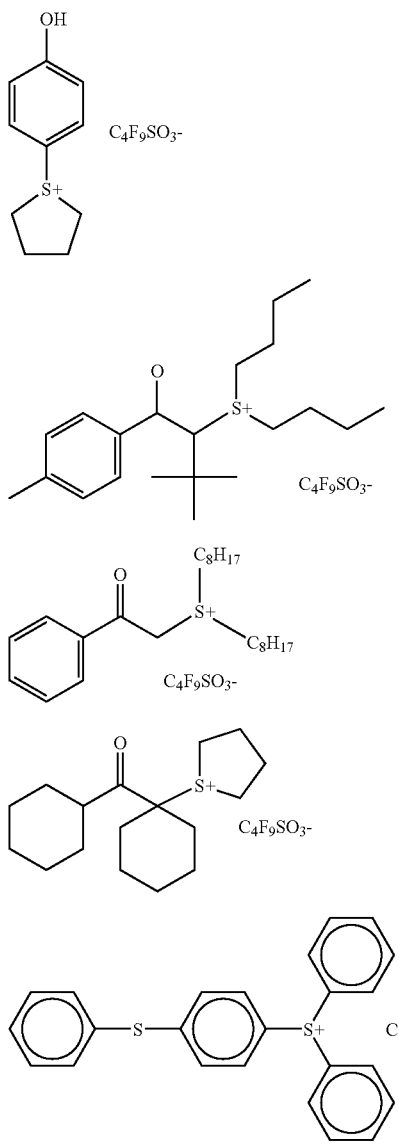

It is preferred in the invention to use a compound (B1) that generates an organic sulfonic acid upon irradiation of an actinic ray or radiation as the compound that generates an acid upon irradiation of an actinic ray or radiation. Examples of the compound that generates an organic sulfonic acid upon irradiation of an actinic ray or radiation include compounds represented by formulae (z1) to (z6), (z8) and (z10) to (z56) described above.

It is preferred in the invention to further use a compound (B2) that generates a carboxylic acid upon irradiation of an actinic ray or radiation together as the compound that generates an acid upon irradiation of an actinic ray or radiation. Examples of the compound that generates a carboxylic acid upon irradiation of an actinic ray or radiation include compounds represented by formulae (z7) and (z9) described above.

To use the component (B1) together with the component (B2) can increase contrast of concentration distribution a strong acid generated by irradiation of an actinic ray or radiation in the vicinity of interface between the irradiation area with an actinic ray or radiation and the non-irradiation area (low energy irradiation area).

A weight ratio of the component (B1) and the component (B2) is ordinarily from 100/100 to 100/0, preferably from 100/100 to 100/10, and particularly preferably from 100/50 to 100/20.

The amount of the photo-acid generator added is ordinarily from 0.5 to 20% by weight, preferably from 0.75 to 15% by weight, and more preferably from 1 to 10% by weight, based on the total solid content of the positive resist composition.

[3] Organic Basic Compound:

It is preferred that the positive resist composition of the invention contains an organic basic compound for the purpose of preventing fluctuations in performances (for example, formation of T-top shaped pattern, fluctuation in sensitivity or fluctuation in linewidth of pattern) with the lapse of time between the irradiation of an actinic ray or radiation and a heat treatment, fluctuations in performances with the lapse of time after coating, or excessive diffusion of the acid at the heat treatment after the irradiation of an actinic ray or radiation, which results in deterioration of the resolution. AS the organic basic compound, for example, an organic basic compound containing a basic nitrogen atom is exemplified, and a compound exhibiting pKa of a conjugated acid of not less than 4 is preferably used.

Specifically, compounds having a structure represented by any one of formulae (A) to (E) shown below are used.

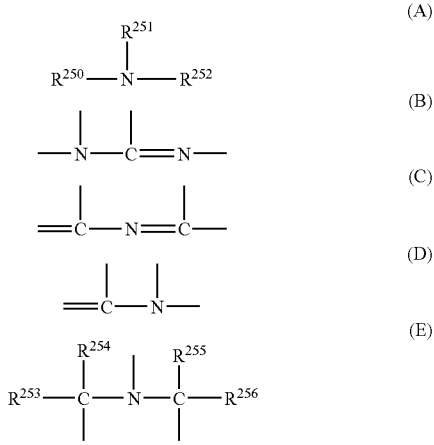

In the above formulae, $R^{250}$, $R^{251}$ and $R^{252}$, which may be the same or different, each represents a hydrogen atom, an alkyl group having from 1 to 20 carbon atoms, a cycloalkyl group having from 3 to 20 carbon atoms or an aryl group having from 6 to 20 carbon atoms, or $R^{251}$ and $R^{252}$ may be combined with each other to form a ring.

The alkyl group, cycloalkyl group and aryl group represented by any one of $R^{250}$, $R^{251}$ and $R^{252}$ may have a substituent. The alkyl group or cycloalkyl group, which may have a substituent, include, for example, an aminoalkyl group having from 1 to 20 carbon atoms, an aminocycloalkyl group having from 3 to 20 carbon atoms, a hydroxyalkyl group having from 1 to 20 carbon atoms and a hydroxycycloalkyl group having from 3 to 20 carbon atoms.

$R^{253}$, $R^{254}$, $R^{255}$ and $R^{256}$, which may be the same or different, each represents an alkyl group having from 1 to 20 carbon atoms or a cycloalkyl group having from 3 to 20 carbon atoms.

More preferred compounds are nitrogen-containing basic compounds having two or more nitrogen atoms having different chemical circumstances per molecule, and particularly preferred compounds are compounds having both a substituted or unsubstituted amino group and a cyclic structure containing a nitrogen atom and compounds having an alkylamino group.

Preferred examples of the organic basic compound include substituted or unsubstituted guanidines, substituted or unsubstituted aminopyridines, substituted or unsubstituted aminoalkylpyridines, substituted or unsubstituted aminopyrrolidines, substituted or unsubstituted indazoles, substituted or unsubstituted imidazoles, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted pyrazolines, substituted or unsubstituted piperazines, substituted or unsubstituted aminomorpholines and substituted or unsubstituted aminoalkylmorpholines. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

Particularly preferred examples of the organic basic compound include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine. However, the organic basic compound for use in the invention should not be construed as being limited to these compounds.

The organic basic compounds may be used individually or as a mixture of two or more thereof.

A ratio of the acid generator to the organic basic compound (acid generator)/(organic basic compound) used in the positive resist composition is preferably from 2.5 to 300 in a molar ratio. The molar ratio of (acid generator)/(organic basic compound) is preferably from 5.0 to 200, and more preferably from 7.0 to 150.

[4] Surfactant:

It is preferred that the positive resist composition of the invention contains a surfactant, particularly, a fluorine-based and/or silicon-based surfactant. Specifically, the positive resist composition of the invention preferably contains one or more of a fluorine-based surfactant, a silicon-based surfactant and a surfactant containing both a fluorine atom and a silicon atom. The addition of such a fluorine-based and/or silicon-based surfactant is effective for the suppression of development defect and the improvement in coating property.

Examples of the fluorine-based and/or silicon-based surfactant include those as described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. Commercially available surfactants described below may also be used as they are.

Examples of the commercially available fluorine-based and/or silicon-based surfactant, which can be used, include fluorine-based surfactants or silicon-based surfactants, e.g., Eftop EF301 and EF303 (manufactured by Shin-Akita Kasei Co., Ltd.), Florad FC430 and 431 (manufactured by Sumitomo 3M Ltd.), Megafac F171, F173, F176, F189 and R08 (manufactured by Dainippon Ink and Chemicals, Inc.), Surflon S-382, SC101, 102, 103, 104, 105 and 106 (manufactured by Asahi Glass Co., Ltd.) and Troysol S-366 (manufactured by Troy Chemical Corp.). A polysiloxane polymer KP-341 (manufactured by Shin-Etsu Chemical Co., Ltd.) is also used as the silicon-based surfactant.

Besides the above described known surfactants, a surfactant comprising a polymer including a fluoroaliphatic group derived from a fluoroaliphatic compound produced by a telomerization method (also referred to as a telomer method) or an oligomerization method (also referred to as an oligomer method) can be used as the fluorine-based and/or silicon-based surfactant. The fluoroaliphatic compound can be synthesized according to methods described in JP-A-2002-90991.

As the polymer including a fluoroaliphatic group, a copolymer of a monomer having a fluoroaliphatic group with (poly(oxyalkylene))acrylate and/or (poly(oxyalkylene))methacrylate is preferred. The copolymer may be a random copolymer or a block copolymer. The poly(oxyalkylene) group includes, for example, a poly(oxyethylene) group, a poly(oxypropylene) group and a poly(oxybutylene) group. Also, a unit containing alkylenes having different chain lengths in the chain thereof, for example, poly(oxyethylene-oxypropylene-oxyethylene block connecting group) or poly(oxyethylene-oxypropylene block connecting group) may be used. Further, the copolymer of a monomer having a fluoroaliphatic group with a (poly(oxyalkylene)) acrylate (or methacrylate) may be not only a binary copolymer but also a ternary or more component-containing copolymer obtained by copolymerizing simultaneously two or more different monomers having a fluoroaliphatic group with two or more different (poly(oxyalkylene))acrylates (or methacrylates).

Examples of the commercially available polymeric fluorine-based and/or silicon-based surfactants include Megafac F178, F-470, F-473, F-475, F-476 and F-472 (manufactured by Dainippon Ink and Chemicals, Inc.). Also, copolymers of acrylate (or methacrylate) having a $C_6F_{13}$ group and (poly(oxyalkylene))acrylate (or methacrylate), copolymers of acrylate (or methacrylate) having a $C_6F_{13}$ group, (poly(oxyethylene))acrylate (or methacrylate) and (poly(oxypropylene))acrylate (or methacrylate), copolymers of acrylate (or methacrylate) having a $C_8F_{17}$ group and (poly(oxyalkylene))acrylate (or methacrylate), copolymers of acrylate (or methacrylate) having a $C_8F_{17}$ group, (poly(oxyethylene))acrylate (or methacrylate) and (poly(oxypropylene))acrylate (or methacrylate) are exemplified.

The amount of the fluorine-based and/or silicon-based surfactant used is preferably from 0.0001 to 2% by weight, more preferably from 0.001 to 1% by weight, and particularly preferably from 0.01 to 1% by weight, based on the total amount of the positive resist composition (excluding a solvent).

[5] Solvent:

The positive resist composition of the invention is used by dissolving the above-described components in a solvent that can dissolve the components, and coating the resulting solution on a substrate. Preferred examples of the solvent used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monoethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone, tetrahydrofuran and 3-methoxy-1-butanol. The solvents may be used individually or as a mixture of two or more thereof.

It is preferred in the invention to use a mixed solvent in which a propylene glycol monoalkyl ether acetate, for example, propylene glycol monomethyl ether acetate is mixed with a propylene glycol monoalkyl ether, for example, propylene glycol monomethyl ether or propylene glycol monoethyl ether or an alkyl lactate, for example, ethyl lactate.

A solid content concentration when the above-described components are dissolved in a solvent is preferably from 3 to 15% by weight, and more preferably from 5 to 10% by weight.

The steps of pattern formation on a resist film, for example, in the production of precise integrated circuit devices, comprises applying the positive resist composition of the invention to a substrate (for example, silicon/silicon dioxide coating, a transparent substrate, e.g., glass substrate or ITO substrate), irradiating the resist film using an actinic ray or radiation drawing apparatus, followed by heating, developing, rinsing and drying. Thus, good resist patterns are obtained.

The developing solution, which can be used for the positive resist composition of the invention, is an aqueous solution of alkali, for example, an inorganic alkali, e.g., sodium hydroxide, potassium hydroxide, sodium carbonate, sodium silicate, sodium metasilicate or aqueous ammonia; a primary amine, e.g., ethylamine or n-propylamine; a secondary amine, e.g., diethylamine or di-n-butylamine; a tertiary amine, e.g., triethylamine or methyldiethylamine; an alcohol amine, e.g., dimethylethanolamine or triethanolamine; a quaternary ammonium salt, e.g., tetramethylammonium hydroxide, tetraethylammonium hydroxide or choline; and a cyclic amine, e.g., pyrrole or piperidine. A developing solution prepared by adding an appropriate amount of an alcohol, for example, isopropyl alcohol or a surfactant, for example, a nonionic surfactant, to the above-described aqueous solution of alkali is also used.

Of the developing solutions, those containing a quaternary ammonium salt are preferred and, those containing tetramethylammonium hydroxide or choline are more preferred.

The alkali concentration of the alkali developing solution is ordinarily from 0.1 to 20% by weight, preferably from 0.2 to 15% by weight, and more preferably from 0.5 to 10% by weight.

The pH of the alkali developing solution is ordinarily from 10.0 to 15.0, preferably from 10.5 to 14.5, and more preferably from 11.0 to 14.0.

The present invention will be described in more detail with reference to the following examples, but the invention should not be construed as being limited thereto.

SYNTHESIS EXAMPLE 1

Synthesis of Intermediate (MA)

In 500 ml of tetrahydrofuran were dissolved 56.05 g (0.5 mol) of itaconic anhydride and 92.4 g (0.65 mol) of trifluoromethyltrimethylsilane and the resulting solution was cooled to −10° C. under nitrogen atmosphere with stirring. To the solution was dropwise added 25 ml (0.025 mol) of a 1 M tetrahydrofuran solution of tetrabutylammonium fluoride. After the completion of the dropwise addition, the temperature of the reaction solution was raised to room temperature, followed by further stilling for 3 hours. Then, a saturated aqueous solution of sodium hydrogen carbonate and ethyl acetate were added to the reaction solution to conduct separation operation. The organic layer was dehydrated with anhydrous sodium sulfate, and the solvent was distilled off. The product was purified by silica gel column chromatography to obtain 42.85 g (yield: 34%) of Intermediate (MA) shown below.

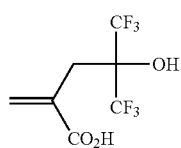
(MA)

SYNTHESIS EXAMPLE 2

Synthesis of Intermediate (MB)

In 200 ml of tetrahydrofuran were dissolved 37.82 g (0.15 mol) of Intermediate (MA) and 50 ml of triethylamine and the resulting solution was cooled to 0° C. under nitrogen atmosphere with stirring. To the solution was dropwise added 38.28 g (0.38 mol) acetic anhydride over a period of 2 hours. After the dropwise addition, the reaction solution was heated to 90° C., followed by stirring for 4 hours. The reaction solution was neutralized with 1N aqueous hydrochloric acid solution, washed with ethyl acetate-water and extracted. The organic layer was dehydrated with anhydrous sodium sulfate, and the solvent was distilled off to obtain 37.95 g (yield: 86%) of Intermediate (MB) shown below.

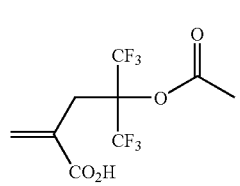
(MB)

SYNTHESIS EXAMPLE 3

Synthesis of Intermediate (MC)

In 200 ml of tetrahydrofuran were dissolved 32.36 g (0.11 mol) of Intermediate (MB), 24.46 g of tert-butyl alcohol and 10.75 g (0.088 mol) of 4-dimethylaminopyridine, followed by stilling. To the solution was dropwise added a chloroform (25 mol) solution containing 24.97 g (0.12 mol) of dicyclohexylcarbodiimide. After the dropwise addition, the reaction solution was further stirred for 3 hours, and 1N aqueous hydrochloric acid solution and ethyl acetate were added thereto to conduct separation operation. The organic layer was washed with a saturated aqueous solution of sodium hydrogen carbonate, dehydrated with anhydrous sodium sulfate, and the solvent was distilled off. The product was purified by silica gel column chromatography to obtain 29.28 g (yield: 76%) of Intermediate (MC) shown below.

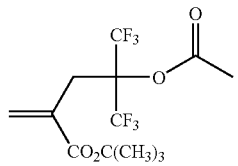
(MC)

SYNTHESIS EXAMPLE 4

Synthesis of Monomer (MI)

In 50 ml of methanol and 10 ml of a 3N aqueous sodium hydroxide solution was dissolved 17.51 g (0.05 mol) of Intermediate (MC), and the solution was stirred at room temperature for 6 hours. The reaction solution was neutralized with 1N aqueous hydrochloric acid solution, and extracted by adding ethyl acetate. The organic layer was dehydrated with anhydrous sodium sulfate, and the solvent was distilled off to obtain 13.56 g (yield: 88%) of Monomer (MI) shown below.

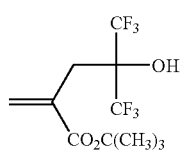
(MI)

SYNTHESIS EXAMPLE 5

Synthesis of Resin (A-1)

In a pressure vessel were charged 12.33 g (0.04 mol) of Monomer (MI), 10.97 g (0.04 mol) of 5-{2,2-bis(trifluoromethyl)-2-hydroxyethyl}bicyclo[2.2.1]hept-2-ene, 50 ml of 1,1,2-trichlorotrifluoroethylene and 0.788 g (4.8 mmol) of AIBN as a polymerization initiator. The vessel was closed, cooled with dry ice and exhausted, then 8.00 g (0.08 mol) of tetrafluoroethylene was charged in the vessel and pressurized. The content of the vessel was heated at 60° C. with stirring, followed by continuing heating and stirring for 12 hours. The vessel was allowed to cool to room temperature to obtain a viscous polymer solution. The polymer solution was dropwise added to methanol to deposit powder. The powder was collected and dried under a reduced pressure to obtain 13.15 g Resin (A-1). Resin (A-1) obtained was subjected to measurement of molecular weight by gel permeation chromatography (GPC) and it was found that the weight average molecular weight and degree of dispersion were 10,600 and 1.43, respectively. Also, a molar ratio of Monomer (MI)/5-{2,2-bis(trifluoromethyl)-2-hydroxyethyl}bicyclo[2.2.1]hept-2-ene/tetrafluoroethylene was 36/33/31 according to $^1$H-NMR and $^{19}$F and $^{13}$C-NMR analysis.

Resins (A-2) to (A-8) and Comparative Resin (1) were obtained in the same manner as above except for changing the monomers added.

The structures of Resins (A-1) to (A-8) and Comparative Resin (1) are shown below.

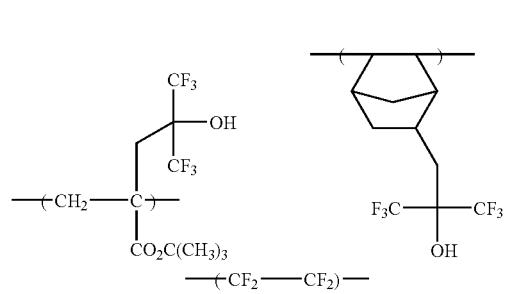
(A-1)
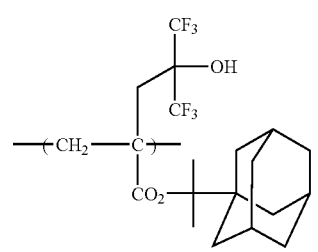
(A-2)
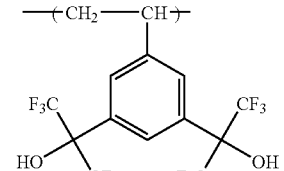
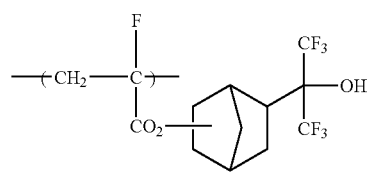
(A-3)
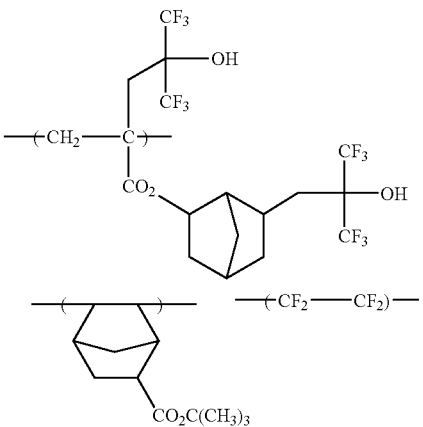
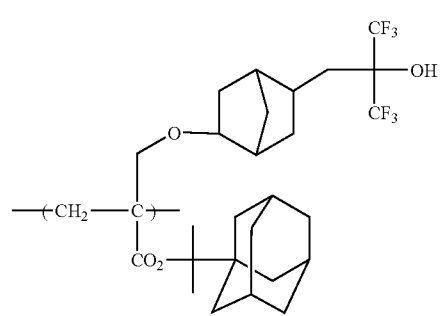
(A-4)
-continued
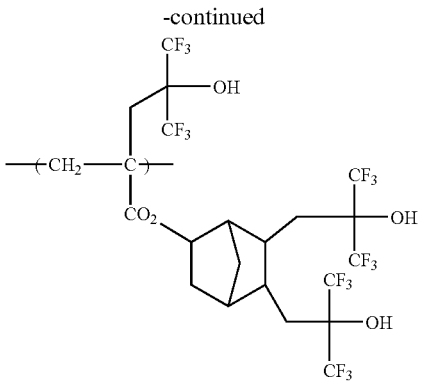
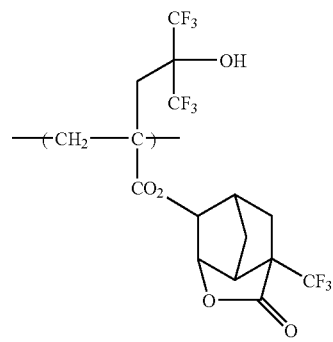
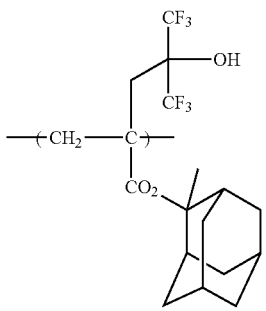
(A-5)
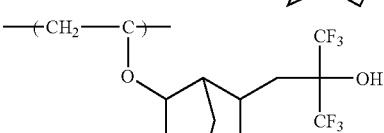
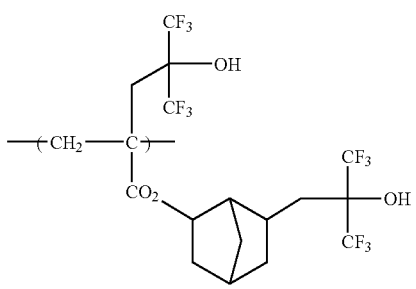
(A-6)
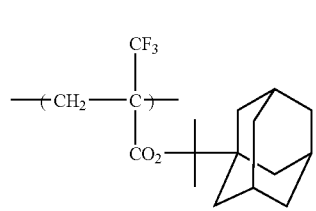

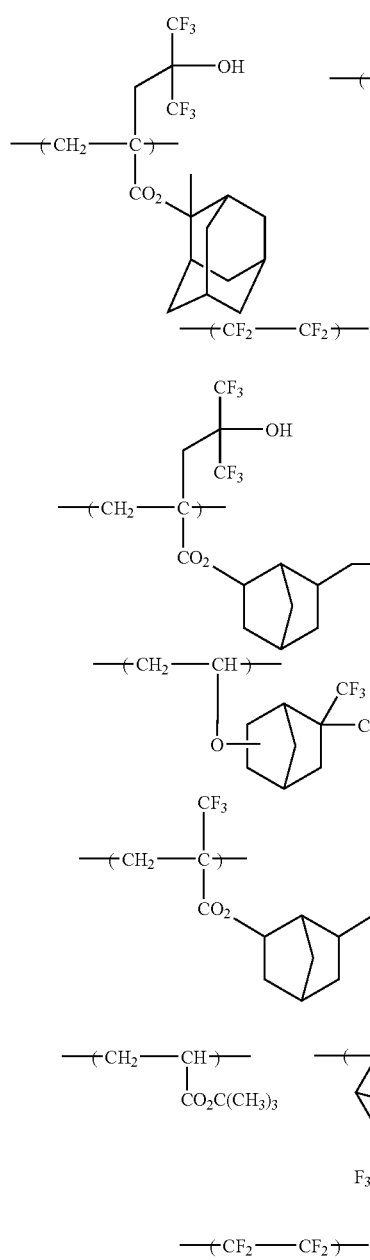

The composition ratio of repeating units, weight average molecular weight and degree of dispersion of each of Resins (A-1) to (A-8) and Comparative Resin (1) are shown in Table 1 below.

TABLE 1

| Resin | Composition Ratio (corresponding to repeating units from left to right) | Weight Average Molecular Weight | Degree of Dispersion |
|---|---|---|---|
| (A-1) | 36/33/31 | 10,600 | 1.43 |
| (A-2) | 28/49/23 | 8,600 | 1.44 |
| (A-3) | 31/49/20 | 9,700 | 1.47 |

TABLE 1-continued

| Resin | Composition Ratio (corresponding to repeating units from left to right) | Weight Average Molecular Weight | Degree of Dispersion |
|---|---|---|---|
| (A-4) | 52/24/24 | 10,400 | 1.53 |
| (A-5) | 53/17/30 | 9,800 | 1.46 |
| (A-6) | 46/28/26 | 10,200 | 1.47 |
| (A-7) | 35/33/32 | 8,200 | 1.48 |
| (A-8) | 34/33/33 | 9,900 | 1.47 |
| Comparative Resin (1) | 33/35/32 | 9,600 | 1.43 |

SYNTHESIS EXAMPLE 6

Synthesis of Monomer (A)

In 200 ml of tetrahydrofuran was dissolved 31.3 g of methyladamantyl ester of α-bromomethylacrylic acid was dissolved. To the solution was added 13.8 g of potassium carbonate, and reaction solution was cooled to 0° C. To the solution was added 17.0 g of hexafluoroisopropanol, followed by stilling. The temperature of the reaction solution was raised to room temperature, followed by conducting reaction with stilling for 5 hours. The reaction solution was crystallized with distilled water to obtain 33.9 g of Monomer (A) having a structure shown below.

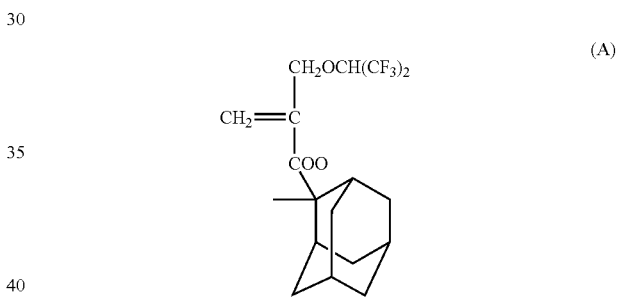

SYNTHESIS EXAMPLE 7

Synthesis of Resin (AF-1)

In 200 ml of tetrahydrofuran were dissolved 13.7 g of 3-(5-bicyclo[2.2.1]hepten-2-yl)-1,1,1-trifluoro-2-(trifluoromethyl)-2-propan-2-ol, 20.0 g of Monomer (A) of Syntheses Example 6 and 15.3 g of dihydroxyadamantyl ester of α-trifluoromethylacrylic acid, and to the solution was added 5.24 g of an azo series polymerization initiator (V-65, manufactured by Wako Pure Chemical Industries, Ltd.), followed by reacting at 70° C. with stirring for 10 hours.

To the reaction solution was added 500 ml of hexane to precipitate a polymer and the upper layer was removed by decantation. The remaining viscous polymer was dissolved in 100 ml of acetone and one liter of hexane was again added thereto to conduct separation treatment of the polymer, thereby removing the unreacted monomers and oligomer components. The polymer obtained was subjected to measurement of molecular weight by gel permeation chromatography (GPC) and it was found that the weight average molecular weight and degree of dispersion were 8,500 and 1.9, respectively.

The polymer was again dissolved in 100 ml of acetone and one liter of hexane was again added thereto to conduct separation treatment of Resin (AF-1), thereby removing the unreacted monomers and oligomer components. Polymer (AF-1) obtained was subjected to measurement of molecular weight by gel permeation chromatography (GPC) and it was found that the weight average molecular weight and degree of dispersion were 11,000 and 1.45, respectively.

In the same manner as described above, the resins shown in Tables 2 and 3 below were obtained.

TABLE 2

| Resin | Composition Ratio (molar ratio) | Weight Average Molecular Weight | Degree of Dispersion |
|---|---|---|---|
| (AF-1) | 33/33/34 | 11,000 | 1.45 |
| (AF-3) | 30/30/40 | 8,000 | 1.45 |
| (AF-5) | 33/30/37 | 10,000 | 1.50 |
| (AF-6) | 33/30/37 | 9,000 | 1.45 |
| (AF-11) | 32/35/33 | 9,000 | 1.50 |
| (AF-16) | 33/30/37 | 12,000 | 1.45 |
| (AF-20) | 30/30/40 | 9,000 | 1.50 |
| (AF-26) | 33/34/33 | 9,000 | 1.45 |

TABLE 3

| Resin | Composition Ratio (molar ratio) | Weight Average Molecular Weight | Degree of Dispersion |
|---|---|---|---|
| AA-1 | (A-1-9)/(A-2-2)/(A-3-6)/(X-1) (40/20/30/10) | 12,000 | 1.70 |
| AA-2 | (A-1-8)/(A-2-1)/(X-22) (50/20/30) | 8,800 | 1.65 |
| AA-3 | (A-1-1)/(A-2-12)/(A-3-10)/(X-31) (40/25/25/10) | 9,400 | 1.55 |
| AA-4 | (A-1-2)/(A-2-1)/(A-3-35)/(X-37) (50/20/20/10) | 11,000 | 1.40 |
| AA-5 | (A-1-1)/(A-2-3)/(X-47) (40/20/40) | 13,300 | 1.75 |
| AA-6 | (A-1-8)/(A-2-2)/(A-3-10)/(X-22) (40/20/30/10) | 9,500 | 1.80 |
| AA-7 | (A-1-9)/(A-2-11)/(X-35)/(X-2) (40/20/20/20) | 7,800 | 1.60 |
| AA-8 | (A-1-2)/(A-2-3)/(A-3-6)/(X-4) (40/20/35/5) | 9,800 | 1.76 |
| AA-A | Formula (AA-A) shown below (40/40/20) | 12,000 | 1.65 |

The composition of Resin (AA-A) in Table 3 is shown in Formula (AA-A) shown below.

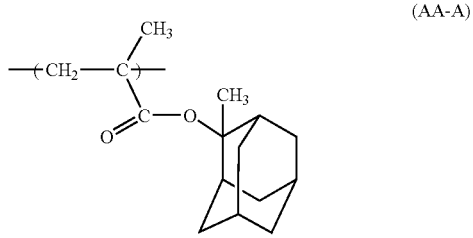

(AA-A)

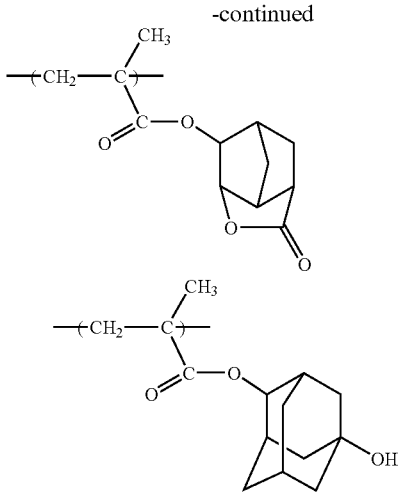

SYNTHESIS EXAMPLE 8

Synthesis of Resin (CP) for Comparative Example

Resin (CP) for comparative example having the structure shown below was synthesized in the same manner as in Synthesis Example 7 except for using as the monomers, 13.7 g of 3-(5-bicyclo[2.2.1]hepten-2-yl)-1,1,1-trifluoro-2-(trifluoromethyl)-2-propan-2-ol, 15.2 g of 2-ethyladamantyl ester of αtrifluoromethylacrylic acid. The weight average molecular weight and degree of dispersion of Resin (CP) were 10,500 and 1.45, respectively.

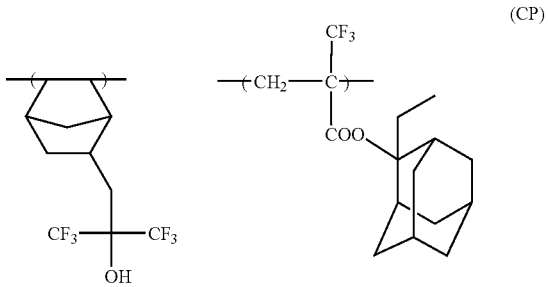

(CP)

EXAMPLES 1 to 8 AND COMPARATIVE EXAMPLE 1

A resin solution prepared by dissolving 1.2 g of resin, 0.030 g of acid generator, 100 ppm of surfactant to the resin solution, 0.0012 g of organic basic compound and 0.24 g of non-polymer dissolution inhibiting agent in 19.6 g of solvent as shown in Table 4 below was filtered through a polytetrafluoroethylene filter having a pore size of 0.1 μm to prepare a positive resist solution.

<Evaluation with ArF Exposure>

On a silicon wafer having coated thereon an anti-reflective coating (DUV42-6, manufactured by Brewer Science, Inc.), the positive resist solution described above was uniformly coated by a spin coater and dried by heating at 120° C. for 60 seconds to form a positive resist film having a thickness of 0.1 μm. The resist film was subjected to pattern exposure using an ArF microstepper with a line and space mask (line/space=1:1) and immediately after the exposure, it was heated at 130° C. for 90 seconds on a hot plate. Then, the resist film was developed with a 2.38% by weight aqueous solution of tetramethylammonium hydroxide at 23° C. for 60 seconds, rinsed with pure water for 30 seconds and dried. With the pattern on the silicon wafer thus-obtained, resist performances were evaluated in the manner shown below. The results obtained are shown in Table 4.

[Limiting Resolution]

The minimum linewidth capable of being resolved in line/space=1:1 was confirmed by cross-section SEM observation and the linewidth was evaluated as the limiting resolution. The smaller the value, the better the performance.

[Sensitivity]

exposure using a laser exposure and dissolution behavior analyzing device (VUVES-4500 manufacture by Lithoteck Japan Co., Ltd.) of 157 nm to evaluate sensitivity and dissolution contrast of exposed area/unexposed area with 157 nm exposure.

[Sensitivity]

The sensitivity means the minimum exposure amount necessary for obtaining thickness of the resist film of 0, when the exposed wafer was developed with a 2.38% by weight aqueous solution of tetramethylammonium hydroxide at 23° C. for 60 seconds, rinsed with pure water for 30 seconds, dried and subjected to measurement of thickness of the resist film.

[Contrast]

The contrast means a slope (tan θ) of exposure-dissolution speed curve.

TABLE 4

| | Resin | Acid Generator (weight ratio) | Solvent (weight ratio) | Dissolution Inhibiting Agent | Organic Basic Compound | Surfactant | ArF Exposure Limiting Resolution (nm) | Sensitivity (mJ/cm$^2$) | Scum | F2 Exposure Sensitivity (mJ/cm$^2$) | Dissolution Contrast |
|---|---|---|---|---|---|---|---|---|---|---|---|
| Example 1 | (A-1) | (z46) | S-2 | — | N-2 | D-1 | 120 | 15 | A | 2.5 | 6.3 |
| Example 2 | (A-2) | (z36)/(z8) (85/15) | S-2/S-3 (80/20) | — | N-1 | D-1 | 130 | 10 | A | 1.5 | 6.5 |
| Example 3 | (A-3) | (z2) | S-2 | — | N-3 | D-2 | 130 | 12 | A | 2.5 | 6.2 |
| Example 4 | (A-4) | (z5) | S-2/S-1 (80/20) | — | N-2 | D-2 | 120 | 13 | B | 1.5 | 6.4 |
| Example 5 | (A-5) | (z24) | S-2 | (X-1) | N-3 | D-2 | 130 | 14 | A | 1.5 | 6.6 |
| Example 6 | (A-6) | (z5)/(z9) (90/10) | S-2 | (X-2) | N-2 | D-2 | 130 | 15 | A | 1.0 | 6.6 |
| Example 7 | (A-7) | (z46) | S-2/S-3 (80/20) | — | N-1 | D-1 | 120 | 15 | B | 1.5 | 6.5 |
| Example 8 | (A-8) | (z2) | S-2 | — | N-2 | D-2 | 120 | 13 | A | 2.0 | 6.3 |
| Comparative Example 1 | Comparative Resin (1) | (z2) | S-2 | — | N-2 | D-1 | 175 | 45 | C | 3.5 | 5.9 |

N-1: Hexamethylenetetramine
N-2: 1,5-Diazabicyclo[4.3.0]-5-nonene
N-3: 1,8-Diazabicyclo[5.4.0]-7-undecene
D-1: Megafac F176 (manufactured by Dainippon Ink and Chemicals, Inc.) (fluorine-based)
D-2: Megafac R08 (manufactured by Dainippon Ink and Chemicals, Inc.) (fluorine- and silicon-based)
S-1: Methyl lactate
S-2: Propylene glycol monomethyl ether acetate
S-3: Propylene glycol monomethyl ether The minimum exposure amount necessary for reproducing a mask pattern having a linewidth of 150 nm (line/space=1:1) was evaluated as the sensitivity.

[Scum]

A degree of development residue (scum) on the resist pattern having a linewidth of 150 nm (line/space=1:1) was evaluated. A case wherein the residue was not observed was ranked as A, a case wherein the residue was considerably observed was ranked as C, and intermediate between A and C was rated as B.

<Evaluation with F2 Exposure>

On a silicon wafer subjected to hexamethyl disilazane treatment, the positive resist solution described above was uniformly coated by a spin coater and dried by heating at 120° C. for 90 seconds to form a positive resist film having a thickness of 0.1 μm. The resist film was subjected to It can be seen from the results shown in Table 4 that the resist composition of the invention is excellent in the limiting resolution and sensitivity, and exhibits a small amount of the scum and the improved dissolution contrast.

EXAMPLES 9 to 16 AND COMPARATIVE EXAMPLE 2

A resin solution prepared by dissolving 1.2 g of resin, 0.030 g of acid generator, 100 ppm of surfactant to the resist solution and 0.0012 g of organic basic compound in 19.6 g of solvent as shown in Table 5 below was filtered through a polytetrafluoroethylene filter having a pore size of 0.1 μm to prepare a positive resist solution.

TABLE 5

| | Resin | Acid Generator | Solvent (weight ratio) | Organic Basic Compound | Surfactant | Surface Roughness | Development Defect | Scum |
|---|---|---|---|---|---|---|---|---|
| Example 9 | (AF-1) | (z2) | S-2 | N-1 | W-1 | A | 32 | A |
| Example 10 | (AF-2) | (z4) | S-2 | N-1 | W-1 | A | 34 | A |
| Example 11 | (AF-3) | (z55) | S-2/S-1 (80/20) | N-2 | W-2 | A | 45 | A |
| Example 12 | (AF-4) | (z13) | S-2 | N-1 | W-1 | B | 41 | A |
| Example 13 | (AF-6) | (z56) | S-2 | N-3 | W-1 | A | 37 | B |
| Example 14 | (AF-8) | (z13) | S-2/S-3 (80/20) | N-1 | W-2 | A | 40 | A |
| Example 15 | (AF-10) | (z13) | S-2 | N-2 | W-1 | B | 35 | A |
| Example 16 | (AF-12) | (z2) | S-2 | N-1 | W-1 | A | 42 | B |
| Comparative Example 2 | (CP) | (z2) | S-2 | N-1 | W-1 | C | 78 | C |

The abbreviations shown in Table 5 indicate the following compounds.
N-1: Hexamethylenetetramine
N-2: 1,5-Diazabicyclo[4.3.0]-5-nonene
N-3: 1,8-Diazabicyclo[5.4.0]-7-undecene
W-1: Megafac F176 (manufactured by Dainippon Ink and Chemicals, Inc.) (fluorine-based)
W-2: Megafac R08 (manufactured by Dainippon Ink and Chemicals, Inc.) (fluorine- and silicon-based)
S-1: Methyl lactate
S-2: Propylene glycol monomethyl ether acetate
S-3: Propylene glycol monomethyl ether On a silicon wafer having coated thereon an anti-reflective coating (DUV42-6, manufactured by Brewer Science, Inc.), the positive resist solution described above was uniformly coated by a spin coater and dried by heating at 120° C. for 60 seconds to form a positive resist film having a thickness of 0.12 µm. The resist film was subjected to pattern exposure using an ArF microstepper and immediately after the exposure, it was heated at 110° C. for 90 seconds on a hot plate. Then, the resist film was developed with a 2.38% by weight aqueous solution of tetramethylammonium hydroxide at 23° C. for 30 seconds, rinsed with pure water for 30 seconds and dried. With the pattern on the silicon wafer thus-obtained, surface roughness, development defect and development residue (scum) were evaluated in the manner shown below.

[Surface Roughness]

In a line and space pattern of 0.11 µm, a degree of roughness on the line surface portion was visually evaluated according to observation by SEM. A case wherein roughness (convexoconcave) was hardly observed on the line surface was rated as A, a case wherein roughness was somewhat observed on the line surface was rated as B, and a case wherein roughness was definitely observed on the line surface was rated as C.

[Evaluation Test of Development Defect]

With the resist pattern obtained as above, a number of development defect was measured by an apparatus (KLA-2112, manufactured by KLA Tencor Corp.). The primary datum value was designated as the result of measurement.

[Occurrence of Scum]

A degree of development residue (scum) on the resist pattern having a linewidth of 0.15 µm was evaluated. A case wherein the residue was not observed was ranked as A, a case wherein the residue was considerably observed was ranked as C, and intermediate between A and C was rated as B.

The results of performance evaluation are shown in Table 5.

It can be seen from the results shown in Table 5 that that the positive resist composition of the invention is excellent in the surface roughness, development defect and scum.

[Resolution and Rectangularity of Profile]

On a silicon wafer having coated thereon an anti-reflective coating (DUV42-6, manufactured by Brewer Science, Inc.), each of the positive resist solutions of Examples 9, 11 and 14 and Comparative Example 2 was uniformly coated by a spin coater and dried by heating at 120° C. for 60 seconds to form a positive resist film having a thickness of 0.12 µm. The thickness was referred to as "initial thickness". The resist film was subjected to pattern exposure using an F2 microstepper and immediately after the exposure, it was heated at 110° C. for 90 seconds on a hot plate. Then, the resist film was developed with a 2.38% by weight aqueous solution of tetramethylammonium hydroxide at 23° C. for 30 seconds, rinsed with pure water for 30 seconds and dried.

With the pattern on the silicon wafer thus-obtained, resolution performance was evaluated using a limiting resolution capable of being reproduced in the minimum exposure amount necessary for reproducing line and space of 100 nm.

A longitudinal section form of a line/space pattern having a linewidth of 100 nm (line/space=1:1) was observed using a critical dimension scanning electron microscope (CD SEM) to measure a thickness. The thickness obtained was referred to as "measurement thickness". A value calculated according to a formula shown below was used as an index of the rectangularity of profile.

(Initial Thickness−Measurement Thickness)/Initial Thickness×100

The results of evaluation are shown in Table 6 below.

TABLE 6

| | Resolution (nm) | Rectangularity of Profile |
|---|---|---|
| Example 9 | 70 | <0.5 |
| Example 11 | 80 | <0.5 |
| Example 14 | 75 | <0.5 |
| Comparative Example 2 | 100 | 11 |

It can be seen form the results shown in Table 6 that the positive resist composition of the invention exhibits high resolution and excellent rectangularity of profile.

EXAMPLES 17 to 24 AND COMPARATIVE EXAMPLE 3

(Preparation and Evaluation of Positive Resist Composition)

In each of Examples 17 to 24 and Comparative Example 3, 2 g of resin, 40 mg of acid generator, 4 mg of organic basic compound and 10 mg of a surfactant were mixed as shown in Table 7 below and dissolved in a solvent shown in Table 7 below to prepare a solution having a solid content of 11% by weight, then the resulting solution was filtered through a microfilter having a pore size of 0.1 μm, whereby a positive resist composition was prepared. In the case of using plural compounds of each component, a ratio of the compounds was indicated by weight in Table 7.

[Evaluation Test]

An anti-reflective coating (ARC-29A-8 manufactured by Brewer Science, Inc.) was coated on a silicon wafer at a thickness of 78 nm by a spin coater and dried. Then, each of the positive resist compositions described above was coated thereon and dried at 115° C. for 90 seconds to form a positive resist film having a thickness (initial thickness) of 0.3 μm. The positive resist film was subjected to exposure with ArF excimer laser beam (using a stepper manufacture by ASML Co., Ltd.; Wavelength: 193 nm; NA: 0.75). The exposed positive resist film was subjected to heat treatment after exposure at 115° C. for 90 seconds, developed with a 2.38% by weight aqueous tetramethylammonium hydroxide solution, and rinsed with distilled water to obtain a resist pattern profile.

[Roundness of Contact Hole Pattern]

With a contact hole pattern formed by using a mask of 170 nm in an exposure amount to form a 120 nm-pattern; diameters of the pattern were measured in four directions at each 45 degree-interval using a critical dimension scanning electron microscope (CD SEM). A value calculated according to a formula shown below was used as an index of the round of contact hole pattern.

(Maximum Value−Minimum Value)/(Arithmetic Average of Four Measured Values)×100

{Rectangularity of Profile}

A longitudinal section form of a line/space pattern having a linewidth of 100 nm (line/space=1:1) was observed using a critical dimension scanning electron microscope (CD SEM) to measure a thickness (measurement thickness). A value calculated according to a formula shown below was used as an index of the rectangularity of profile.

(Initial Thickness−Measurement Thickness)/Initial Thickness×100

The results of evaluation are shown together in Table 7 below.

TABLE 7

| | Resin | Photo-Acid Generator | Organic Basic Compound | Surfactant | Solvent | Roundness of contact Hole Pattern | Rectangularity of Profile |
|---|---|---|---|---|---|---|---|
| Example 17 | AA-1 | (z2) | NA-1 | WA-1 | SA-2 | 3.2 | <0.5 |
| Example 18 | AA-2 | z12/z15 (50/50) | NA-2 | WA-1 | SA-2/SA-3 (80/20) | 3.5 | <0.5 |
| Example 19 | AA-3" | (z3) | NA-3 | WA-2 | SA-2/SA-3/SA-4 (75/20/5) | 3.4 | <0.5 |
| Example 20 | AA-4 | (z2)/(z44) (40/60) | NA-4 | WA-1 | SA-2/SA-1 (80/20) | 3.6 | <0.5 |
| Example 21 | AA-5 | z14/z44 (50/50) | NA-5 | WA-1 | SA-2/SA-3 (70/30) | 3.5 | <0.5 |
| Example 22 | AA-6 | (z2) | NA-6 | WA-2 | SA-2/SA-3 (60/40) | 3.8 | <0.5 |
| Example 23 | AA-7 | (z3)/(z15) (40/60) | NA-7 | WA-1 | SA-2/SA-3 (70/30) | 3.7 | <0.5 |
| Example 24 | AA-8 | (z2)/(z17) (30/70) | NA-1 | WA-2 | SA-1/SA-2/SA-3 (10/80/10) | 3.4 | <0.5 |
| Comparative Example 3 | AA-A | (z2) | NA-1 | WA-1 | SA-2 | 10.6 | 5.8 |

The symbols shown in Table 7 represent the following components, respectively.
[Organic basic compound]
NA-1: 1,5-Diazabicyclo[4.3.0]-5-nonene
NA-2: 1,8-Diazabicyclo[5.4.0]-7-undecene
NA-3: N,N-Dihydroxyethylaniline
NA-4: N,N-Dibutylaniline
NA-5: Triphenylimidazole
NA-6: 2-Quinuclidinol
NA-7: Trioctylamine
[Surfactant]
WA-1: Megafac F176 (manufactured by Dainippon Ink and Chemicals, Inc.) (fluorine-based)
WA-2: Megafac R08 (manufactured by Dainippon Ink and Chemicals, Inc.) (fluorine- and silicon-based)
[Solvent]
SA-1: Methyl lactate
SA-2: Propylene glycol monomethyl ether acetate
SA-3: Propylene glycol monomethyl ether
SA-4: Propylene carbonate

It can be seen from the results shown in Table 7 that the resist composition of the invention is excellent in the roundness of contact hole pattern and rectangularity of profile.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A positive resist composition comprising (A1) a resin that is decomposed by the action of an acid to increase solubility in an alkali developing solution and includes at least one repeating unit represented by formula (I) shown below and (B) a compound that generates an acid upon irradiation of an actinic ray or radiation:

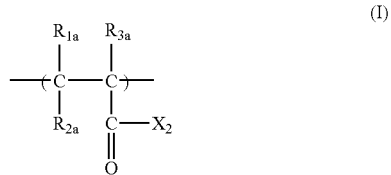

wherein $R_{1a}$ to $R_{3a}$ each independently represents a hydrogen atom, a halogen atom, a cyano group or an alkyl group, provided that at least one of $R_{1a}$ to $R_{3a}$ represents an alkyl group having at least one group represented by formula (A) shown below, $X_2$ represents —ORa, —SRa or —N(Rb)(Ra), Ra represents a hydrogen atom or a monovalent organic group, and Rb represents a hydrogen atom or an alkyl group,

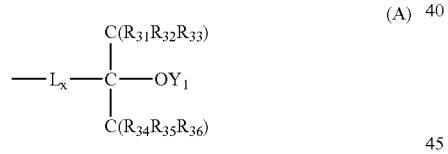

wherein $R_{31}$ to $R_{36}$ each independently represents a hydrogen atom, a fluorine atom or an alkyl group, provided that at least one of $R_{31}$ to $R_{36}$ represents a fluorine atom or an alkyl group in which at least one of the hydrogen atoms is substituted with a fluorine atom, $Y_1$ represents a hydrogen atom or a monovalent organic group, and $L_x$ represents a divalent connecting group.

2. The positive resist composition as claimed in claim 1, wherein the monovalent organic group represented by Ra in formula (I) is a group selected from —$C(R_{11a})(R_{12a})(R_{13a})$ and —$C(R_{14a})(R_{15a})(OR_{16a})$, wherein $R_{11a}$ to $R_{13a}$ each individually represents an alkyl group, a cycloalkyl group, an alkenyl group, an aralkyl group or an aryl group, $R_{14a}$ and $R_{15a}$ each individually represents a hydrogen atom or an alkyl group, $R_{16a}$ represents an alkyl group, a cycloalkyl group, an alkenyl group, an aralkyl group or an aryl group, or two of $R_{11a}$, $R_{12a}$ and $R_{13a}$ or two of $R_{14a}$, $R_{15a}$ and $R_{16a}$ may be connected with each other to form a ring.

3. A positive resist composition comprising (A2) a resin that is decomposed by the action of an acid to increase solubility in an alkali developing solution and includes at least one repeating unit represented by formula (X) shown below and (B) a compound that generates an acid upon irradiation of an actinic ray or radiation:

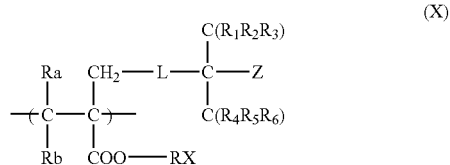

wherein $R_a$ to $R_b$ each independently represents a hydrogen atom, a fluorine atom, a methyl group or a trifluoromethyl group, L represents a single bond or a divalent connecting group, $R_1$ to $R_6$ each independently represents a fluorine atom or a hydrogen atom, provided that at least one of $R_1$ to $R_6$ represents a fluorine atom, RX represents a hydrogen atom or a monovalent organic group, and Z represents a hydrogen atom, an alkyl group, a cycloalkyl group, a hydroxy group or a hydroxy group protected with a protective group capable of being decomposed by the action of an acid.

4. The positive resist composition as claimed in claim 3, wherein the resin of component (A2) further includes a repeating unit containing a cyclic hydrocarbon structure having a group selected from a hydroxy group, a hydroxyalkyl group and a group represented by the following formula (Y):

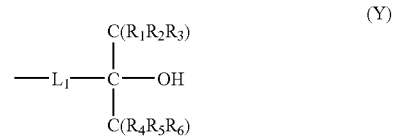

wherein $L_1$ represents a single bond or a methylene group, $R_1$ to $R_6$ each independently represents a fluorine atom or a hydrogen atom, provided that at least one of $R_1$ to $R_6$ represents a fluorine atom, or at least one of $R_1$ to $R_6$ may form a carbon chain connected to a main chain of polymer to form a ring, or $R_4$ may be connected to the carbon atom substituted with the hydroxy group to form a ring.

5. The positive resist composition as claimed in claim 3, wherein the resin of component (A2) further includes at least one repeating unit selected from repeating units represented by the following formulae (AI) to (AVIII):

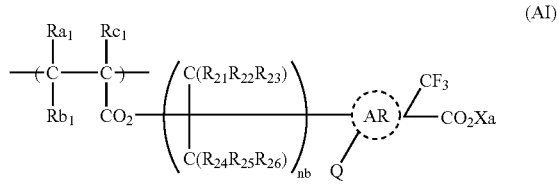

-continued

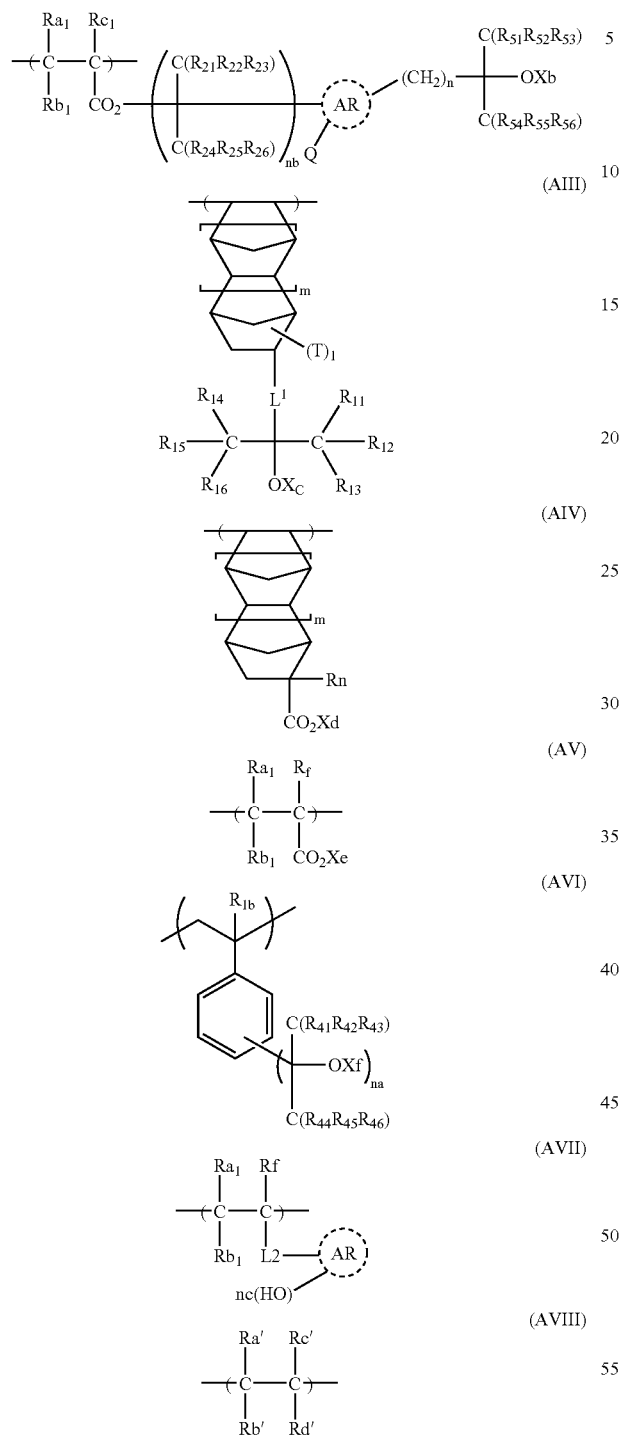

wherein $R_{a1}$, $R_{b1}$ and $R_{c1}$ each independently represents a hydrogen atom, a fluorine atom, a methyl group or a fluoroalkyl group, $R_{21}$ to $R_{26}$ each independently represents a hydrogen atom, a fluorine atom or a fluoroalkyl group, provided that at least one of $R_{21}$ to $R_{26}$ is not a hydrogen atom, AR represents an alicyclic hydrocarbon structure, Q represents a hydrogen atom or a hydroxy group, Xa represents a hydrogen atom or a group capable of being decomposed by the action of an acid, $R_{51}$ to $R_{56}$ each independently represents a hydrogen atom, a fluorine atom or a fluoroalkyl group, provided that at least one of $R_{51}$ to $R_{56}$ is not a hydrogen atom, Xb represents a hydrogen atom or a group capable of being decomposed by the action of an acid, T represents a hydrogen atom, a fluorine atom or a trifluoromethyl group, which may be the same of different, when two or more T's are present, $L_1$ represents a single bond or a divalent connecting group, $R_{11}$ to $R_{16}$ each independently represents a hydrogen atom, a fluorine atom or a fluoroalkyl group, provided that at least one of $R_{11}$ to $R_{16}$ is not a hydrogen atom, Xc represents a hydrogen atom or a group capable of being decomposed by the action of an acid, Rn represents a fluorine atom or a trifluoromethyl group, Xd represents a hydrogen atom or a group capable of being decomposed by the action of an acid, Rf represents a hydrogen atom, a fluorine atom, a methyl group or a trifluoromethyl group, Xe represents a hydrogen atom or a group capable of being decomposed by the action of an acid, $R_{1b}$ represents a hydrogen atom, a fluorine atom, a chlorine atom, a bromine atom, a cyano group or a trifluoromethyl group, $R_{41}$ to $R_{46}$ each independently represents a hydrogen atom, a fluorine atom or a fluoroalkyl group, provided that at least one of $R_{41}$ to $R_{46}$ is not a hydrogen atom, Xf represents a hydrogen atom or a group capable of being decomposed by the action of an acid, L2 represents —C(=O)—O— or —O—, $R_a'$, $R_b'$, $R_c'$ and $R_d'$ each independently represents a hydrogen atom, a fluorine atom, a fluoroalkyl group or a group represented by formula (Y), provided that at least one of $R_a'$ to $R_d'$ is not a hydrogen atom, nb represents 0 or 1, n represents 0 or 1, m represents 0 or 1, 1 represents an integer of from 0 to 5, na represents an integer of from 1 to 5, and nc represents an integer of from 1 to 5.

6. The positive resist composition as claimed in claim 1, wherein the monovalent organic group represented by Ra in formula (I) contains the group represented by formula (A).

7. The positive resist composition as claimed in claim 1, wherein the monovalent organic group represented by Ra in formula (I) contains an alicyclic structure.

8. The positive resist composition as claimed in claim 1, wherein the —$R_{3a}$ in formula (I) is a group represented by the following formula (R3a):

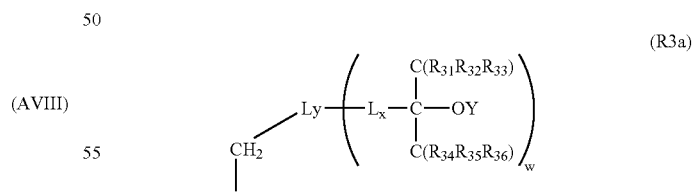

wherein $R_{31}$ to $R_{36}$, $Y_1$ and $L_x$ have the same meanings as those defined for $R_{31}$ to $R_{36}$, $Y_1$ and $L_x$ in formula (A), respectively, $L_y$ represents a single bond or a connecting group having a valence of (w+1), and w represents an integer of from 1 to 4.

9. The positive resist composition as claimed in claim 1, wherein the repeating unit represented by formula (I) is a repeating unit represented by the following formula (Ia) or (Ib):

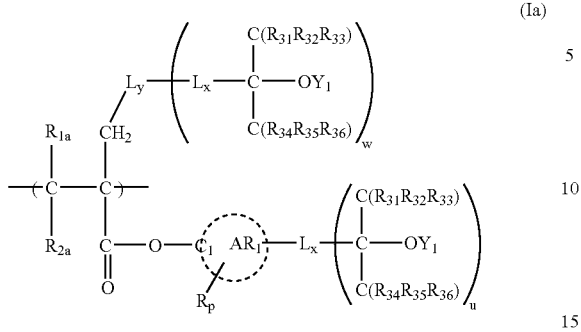
(Ia)

wherein $R_{1a}$ and $R_{2a}$ have the same meanings as those defined for $R_{1a}$ and $R_{2a}$ in formula (I), respectively, $R_{31}$ to $R_{36}$, $Y_1$, $L_x$, $L_y$, and w have the same meanings as defined for $R_{31}$ to $R_{36}$, $Y_1$, $L_x$, $L_y$, and w in formula (R3a), respectively, $R_p$ represents a hydrogen atom or an alkyl group, $AR_1$ represents an atomic group for forming an alicyclic structure together with $C_1$, and u represents an integer of from 0 to 4;

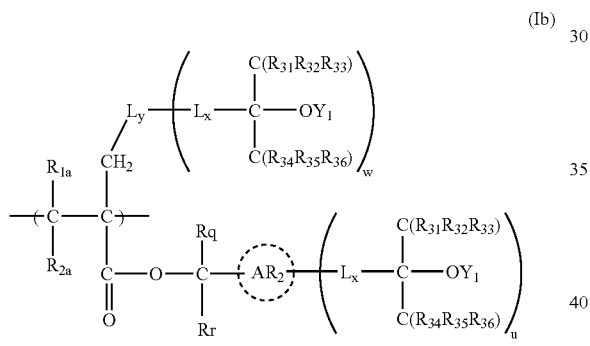
(Ib)

wherein $R_{1a}$, $R_{2a}$, $R_{31}$ to $R_{36}$, $Y_1$, $L_x$, $L_y$, w and u have the same meanings as defined for $R_{1a}$, $R_{2a}$, $R_{31}$ to $R_{36}$, $Y_1$, $L_x$, $L_y$, w and u in formula (Ia), Rq and Rr each independently represents an alkyl group, and $AR_2$ represents an atomic group for forming an alicyclic structure.

10. The positive resist composition as claimed in claim 1, wherein the resin of component (A1) further includes at least one repeating unit selected from repeating units represented by the following formulae (II) to (XII):

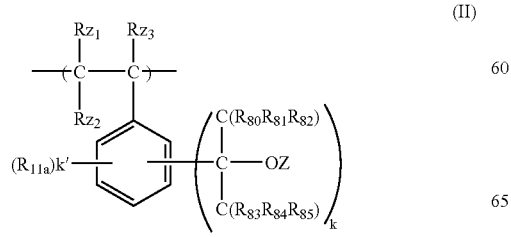
(II)

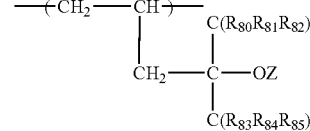
(III)

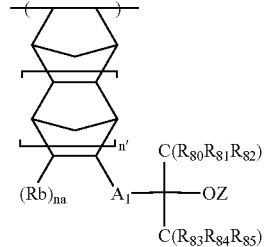
(IV)

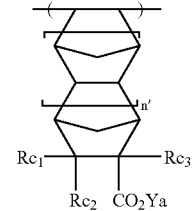
(V)

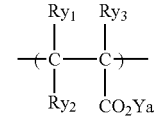
(VI)

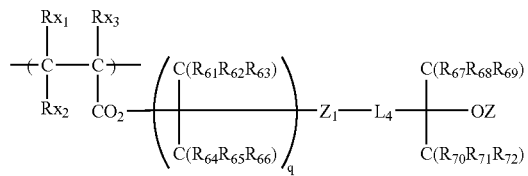
(VII)

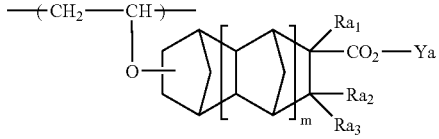
(VIII)

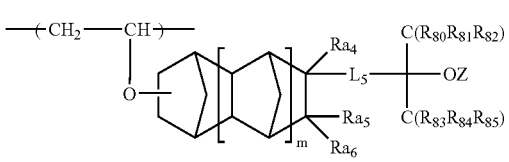
(IX)

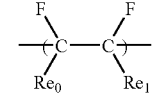
(X)

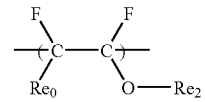
(XI)

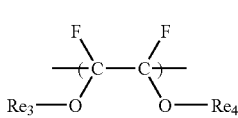

wherein $R_{z1}$ and $R_{z2}$ each independently represents a hydrogen atom, a fluorine atom, a chlorine atom, a cyano group or an alkyl group in which at least one of the hydrogen atoms is substituted with a fluorine atom, $R_{z3}$ represents a hydrogen atom, a halogen atom, a cyano group or an alkyl group, $R_{11a}$ represents a hydrogen atom, a hydroxy group, a halogen atom, a cyano group, an alkoxy group, an acyl group, an alkyl group, a cycloalkyl group, an alkenyl group, an aralkyl group or an aryl group, $R_{80}$ and $R_{85}$ each independently represents a hydrogen atom, a fluorine atom or an alkyl group, provided that at least one of $R_{80}$ and $R_{85}$ represents a fluorine atom or an alkyl group in which at least one of the hydrogen atoms is substituted with a fluorine atom, Z each independently represents a hydrogen atom or a monovalent organic group, k represents an integer of from 1 to 5, k' represents an integer of from 0 to 4, Rb represents a hydrogen atom, a halogen atom, a cyano group or an alkyl group, which may be the same or different, when two or more Rb's are present, $A_1$ represents a single bond or a divalent connecting group, n' represents 0 or 1, na represents an integer of from 0 to 7, $R_{c1}$ and $R_{c3}$ each independently represents a hydrogen atom, a halogen atom, a cyano group or an alkyl group, Ya represents a hydrogen atom or a monovalent organic group, $R_{y1}$ and $R_{y3}$ each independently represents a hydrogen atom, a fluorine atom, a chlorine atom, a cyano group or an alkyl group in which at least one of the hydrogen atoms is substituted with a fluorine atom, $R_{x1}$ and $R_{x3}$ each independently represents a hydrogen atom, a fluorine atom, a chlorine atom, a cyano group or an alkyl group in which at least one of the hydrogen atoms is substituted with a fluorine atom, $R_{61}$ to $R_{72}$ each independently represents a hydrogen atom, a fluorine atom or an alkyl group, provided that at least one of $R_{61}$ to $R_{66}$ represents a fluorine atom and at least one of $R_{67}$ to $R_{72}$ represents a fluorine atom, $Z_1$ represents a phenylene group, a cyclohexylene group, an adamantane residue or a norbornane residue, $L_4$ represents a single bond or a divalent connecting group, q represents 0 or 1, $R_{a1}$ and $R_{a3}$ each independently represents a hydrogen atom, a halogen atom, a hydroxy group, a cyano group, an alkyl group, an aryl group, an alkoxy group or an aralkyl group, m represents 0 or 1, $R_{a4}$ and $R_{a6}$ each independently represents a hydrogen atom, a halogen atom, a hydroxy group, a cyano group, an alkyl group, an aryl group, an alkoxy group or an aralkyl group, $L_5$ represents a single bond or a divalent connecting group, $Re_0$ and $Re_1$, which may be the same or different, each represents a hydrogen atom, a fluorine atom, an alkyl group, a cycloalkyl group or an aryl group, $Re_2$ to $Re_4$, which may be the same or different, each represents an alkyl group, a cycloalkyl group or an aryl group, or $Re_0$ and $Re_1$, $Re_0$ and $Re_2$ or $Re_3$ and $Re_4$ may be combined with each other to form a ring.

11. The positive resist composition as claimed in claim 3, wherein the resin of component (A2) further includes a repeating unit represented by the following formula (A1):

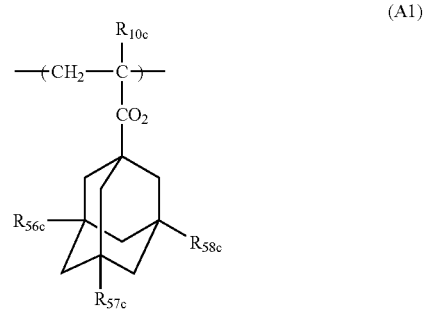

wherein $R_{56c}$, $R_{57c}$ and $R_{58c}$ each independently represents a hydrogen atom, a hydroxy group or an alkyl group, provided that at least one of $R_{56c}$, $R_{57c}$ and $R_{58c}$ represents a hydroxy group, and $R_{10c}$ represents a hydrogen atom, a methyl group or a trifluoromethyl group.

12. The positive resist composition as claimed in claim 3, wherein the resin of component (A2) further includes a repeating unit containing a norbornane lactone structure represented by any one of the following formulae (a-1) to (a-3):

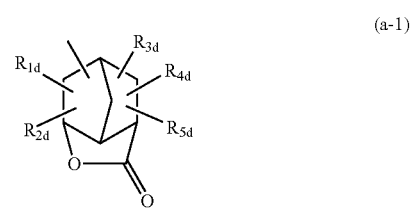

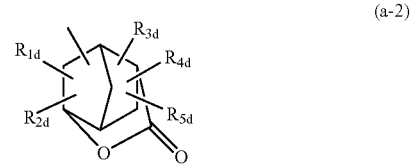

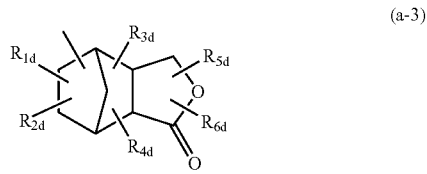

wherein $R_{1d}$ to $R_{6d}$ each independently represents a hydrogen atom, an alkyl group, a cycloalkyl group or an alkenyl group, or two of $R_{1d}$ to $R_{6d}$ may be combined with each other to form a ring.

13. The positive resist composition as claimed in claim 3, wherein the resin of component (A2) further includes a repeating unit represented by the following formula (A3):

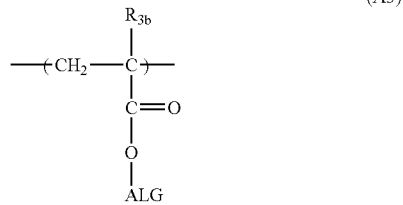

(A3)

wherein $R_{3b}$ represents a hydrogen atom, a methyl group or a trifluoromethyl group, and ALG represents a group represented by the following formula (pI) or (pII):

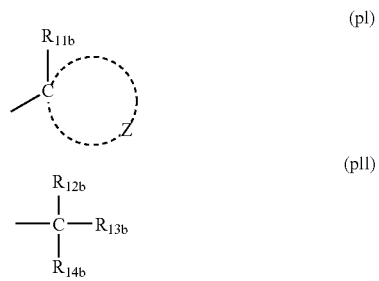

(pI)

(pII)

wherein $R_{11b}$ represents a methyl group, an ethyl group, a n-propyl group, an isopropyl group, a n-butyl group, an isobutyl group or a sec-butyl group, Z represents an atomic group necessary for forming an alicyclic hydrocarbon group together with the carbon atom, $R_{12b}$ to $R_{14b}$ each independently represents an alkyl group having from 1 to 4 carbon atoms or an alicyclic hydrocarbon group, provided that at least one of $R_{12b}$ to $R_{14b}$ represents an alicyclic hydrocarbon group.

14. The positive resist composition as claimed in claim 3, wherein the resin of component (A2) is a resin in which all repeating units comprise an acrylic acid repeating unit, an acrylate repeating unit, an α-position substituted acrylic acid repeating unit or an α-position substituted acrylate repeating unit.

15. The positive resist composition as claimed in claim 3, wherein the resin of component (A2) has a glass transition temperature of from 90 to 170° C.

16. The positive resist composition as claimed in claim 1, wherein the compound (B) that generates an acid upon irradiation of an actinic ray or radiation is a compound (B1) that generates an organic sulfonic acid upon irradiation of an actinic ray or radiation.

17. The positive resist composition as claimed in claim 16, which further comprises as the compound (B) that generates an acid upon irradiation of an actinic ray or radiation, a compound (B2) that generates a carboxylic acid upon irradiation of an actinic ray or radiation.

18. A pattern formation method comprising forming a resist film using the positive resist composition as claimed in claim 1, exposing the resist film, and developing the exposed resist film.

19. A pattern formation method comprising forming a resist film using the positive resist composition as claimed in claim 3, exposing the resist film, and developing the exposed resist film.

* * * * *